United States Patent
Essers et al.

(10) Patent No.: US 10,861,670 B2
(45) Date of Patent: Dec. 8, 2020

(54) CHARGED PARTICLE OPTICAL APPARATUS FOR THROUGH-THE-LENS DETECTION OF PARTICLES

(71) Applicant: Carl Zeiss Microscopy GmbH, Jena (DE)

(72) Inventors: Erik Essers, Aalen (DE); Michael Albiez, Aalen (DE); Stefan Meyer, Aalen (DE); Daniel Kirsten, Luebeck (DE); Stewart Bean, Cambridgeshire (GB)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/725,329

(22) Filed: Dec. 23, 2019

(65) Prior Publication Data

US 2020/0135425 A1   Apr. 30, 2020

Related U.S. Application Data

(63) Continuation of application No. 16/047,781, filed on Jul. 27, 2018, now Pat. No. 10,522,321, which is a
(Continued)

(51) Int. Cl.
*H01J 37/18* (2006.01)
*H01J 37/147* (2006.01)
(Continued)

(52) U.S. Cl.
CPC ........ *H01J 37/1471* (2013.01); *H01J 37/145* (2013.01); *H01J 37/18* (2013.01);
(Continued)

(58) Field of Classification Search
CPC ...... H01J 37/1471; H01J 37/18; H01J 37/244; H01J 37/222
(Continued)

(56) References Cited

U.S. PATENT DOCUMENTS 4,720,633 A   1/1988   Nelson
4,785,182 A   11/1988   Mancuso et al.
(Continued)

FOREIGN PATENT DOCUMENTS

EP   1068630 B1   7/2005
JP   2008-010177 A   1/2008
(Continued)

OTHER PUBLICATIONS

Essers et al., "Push-Button Variable Pressure Mode with In-Lens Detection and New Objective Lens in an FESEM", Carl Zeiss Microscopy GmbH Poster, 2015.
(Continued)

*Primary Examiner* — Michael Maskell
(74) *Attorney, Agent, or Firm* — Alston & Bird LLP

(57) ABSTRACT

Disclosed is a charged particle optical apparatus. The charged particle optical apparatus has a liner electrode in a first vacuum zone. The liner electrode is used to generate an electrostatic objective lens field. The apparatus has a second electrode which surrounds at least a section of the primary particle beam path. The section extends in the first vacuum zone and downstream of the liner electrode. A third electrode is provided having a differential pressure aperture through which the particle beam path exits from the first vacuum zone. A particle detector is configured for detecting emitted particles, which are emitted from the object and which pass through the differential pressure aperture of the third electrode. The liner electrode, the second and third electrodes are operable at different potentials relative to each other.

36 Claims, 23 Drawing Sheets

Related U.S. Application Data continuation of application No. 14/956,200, filed on Dec. 1, 2015, now Pat. No. 10,068,744.

(51) Int. Cl.
    *H01J 37/22* (2006.01)
    *H01J 37/244* (2006.01)
    *H01J 37/145* (2006.01)
    *H01J 37/28* (2006.01)

(52) U.S. Cl.
    CPC .......... *H01J 37/222* (2013.01); *H01J 37/244* (2013.01); *H01J 37/28* (2013.01); *H01J 2237/188* (2013.01); *H01J 2237/2448* (2013.01); *H01J 2237/24445* (2013.01); *H01J 2237/2608* (2013.01)

(58) Field of Classification Search
    USPC .................................. 250/306, 307, 310, 311
    See application file for complete search history.

(56) References Cited

U.S. PATENT DOCUMENTS

| | | | |
|---|---|---|---|
| 4,823,006 A | 4/1989 | Danilatos et al. | |
| 4,897,545 A | 1/1990 | Danilatos | |
| 5,250,808 A | 10/1993 | Danilatos et al. | |
| 5,362,964 A | 11/1994 | Knowles et al. | |
| 5,396,067 A | 3/1995 | Suzuki et al. | |
| 6,590,210 B1 * | 7/2003 | Essers .................. | H01J 37/244 |
| | | | 250/397 |
| 7,462,839 B2 | 12/2008 | Gnauck et al. | |
| 8,148,684 B2 | 4/2012 | Yoshikawa | |
| 9,741,528 B2 | 8/2017 | Albiez et al. | |
| 10,068,744 B2 | 9/2018 | Essers et al. | |
| 10,522,321 B2 * | 12/2019 | Essers ..................... | H01J 37/18 |
| 2003/0010913 A1 | 1/2003 | Essers | |
| 2004/0173747 A1 | 9/2004 | Dean et al. | |
| 2006/0284090 A1 | 12/2006 | Koops et al. | |
| 2010/0301211 A1 | 12/2010 | Miller | |
| 2011/0006209 A1 | 1/2011 | Yoshikawa | |
| 2014/0070097 A1 | 3/2014 | Albiez | |
| 2015/0348742 A1 | 12/2015 | Albiez et al. | |

FOREIGN PATENT DOCUMENTS

| | | | |
|---|---|---|---|
| JP | 2011-018506 A | 1/2011 | |
| JP | 5351634 B2 | 11/2013 | |
| WO | WO-1988/009564 A1 | 12/1988 | |
| WO | WO-1990/004261 A1 | 4/1990 | |
| WO | WO 1998/040906 A1 | 9/1998 | |
| WO | WO-1999/046797 A1 | 9/1999 | |
| WO | WO-2002/086942 A1 | 10/2002 | |

OTHER PUBLICATIONS

United States Patent and Trademark Office, Office Action for U.S. Appl. No. 14/956,200, dated Nov. 20, 2017, USA.

United States Patent and Trademark Office, Notice of Allowance for U.S. Appl. No. 14/956,200, dated Apr. 30, 2018, USA.

* cited by examiner

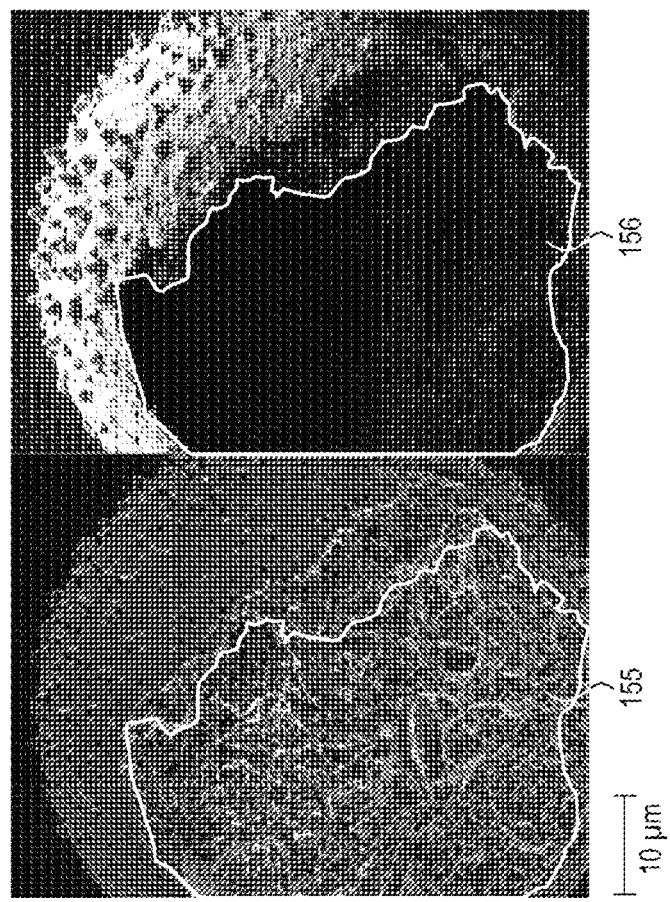

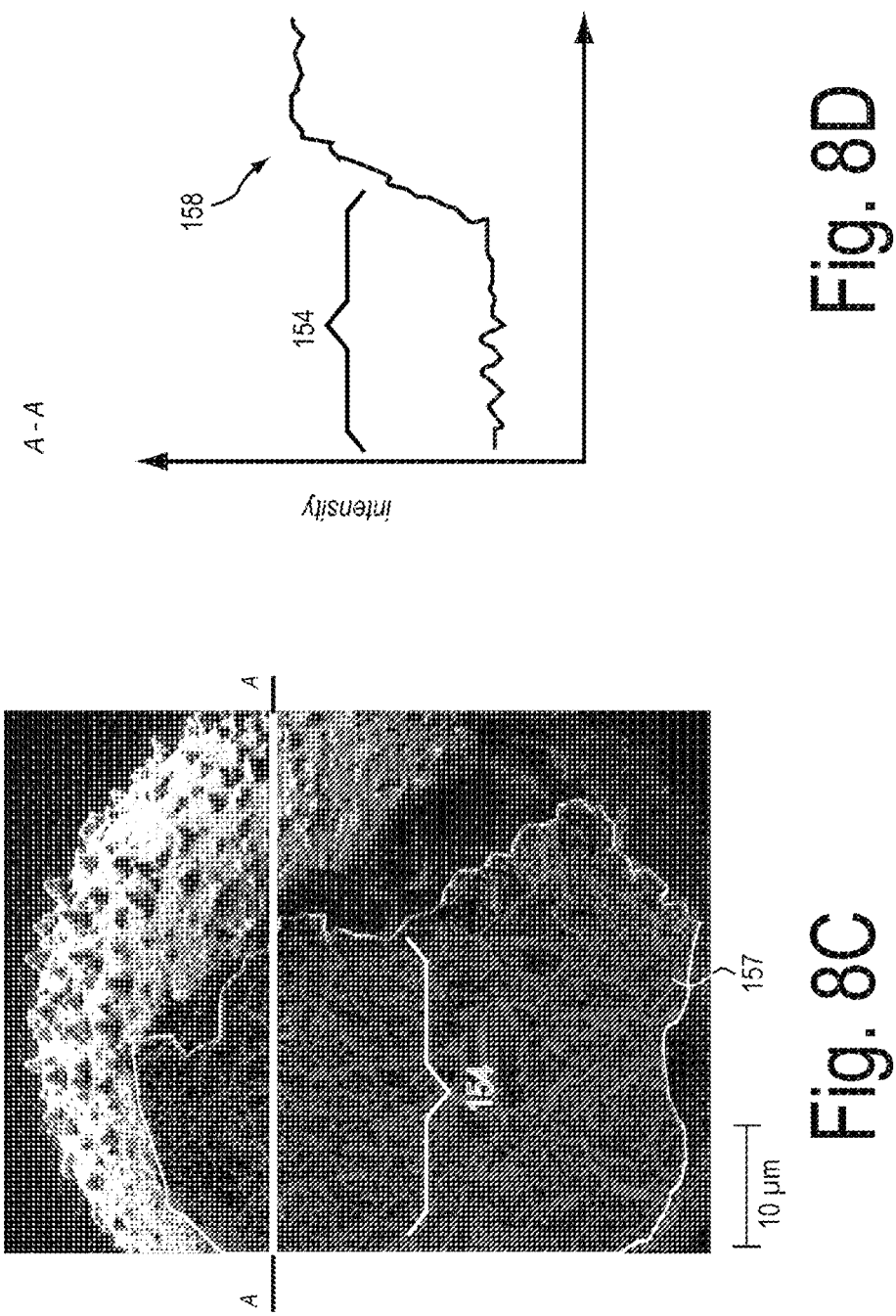

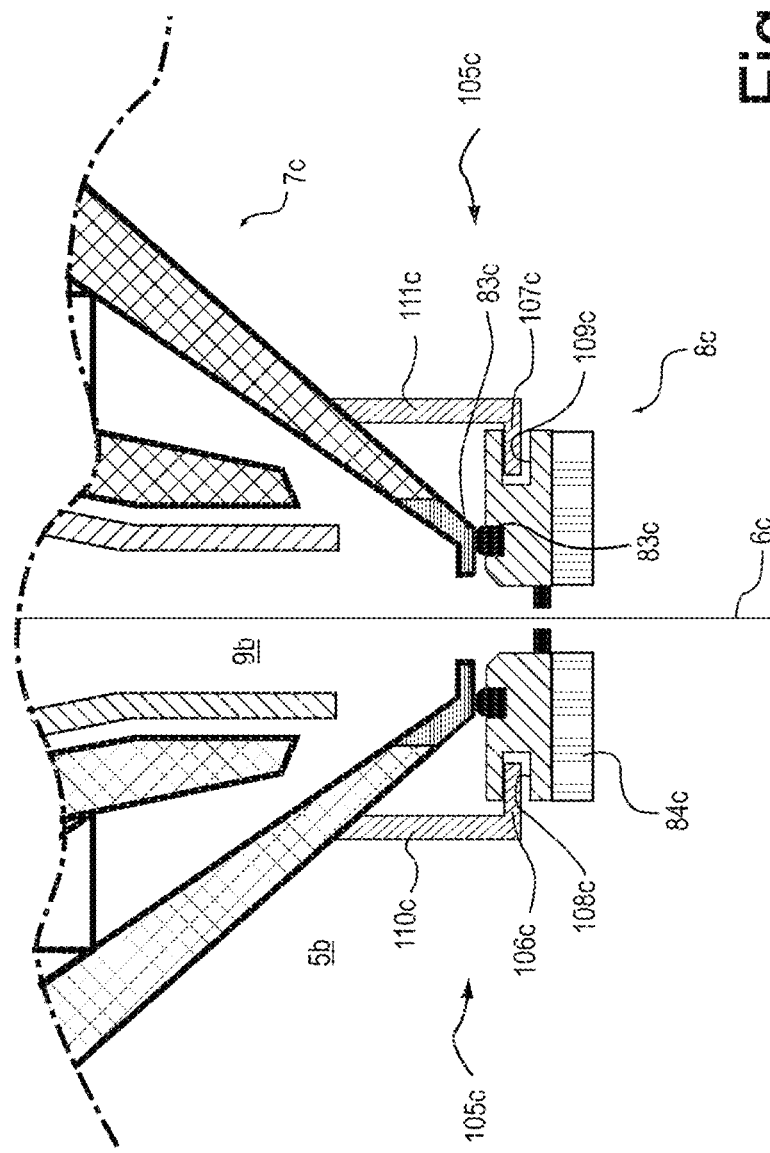

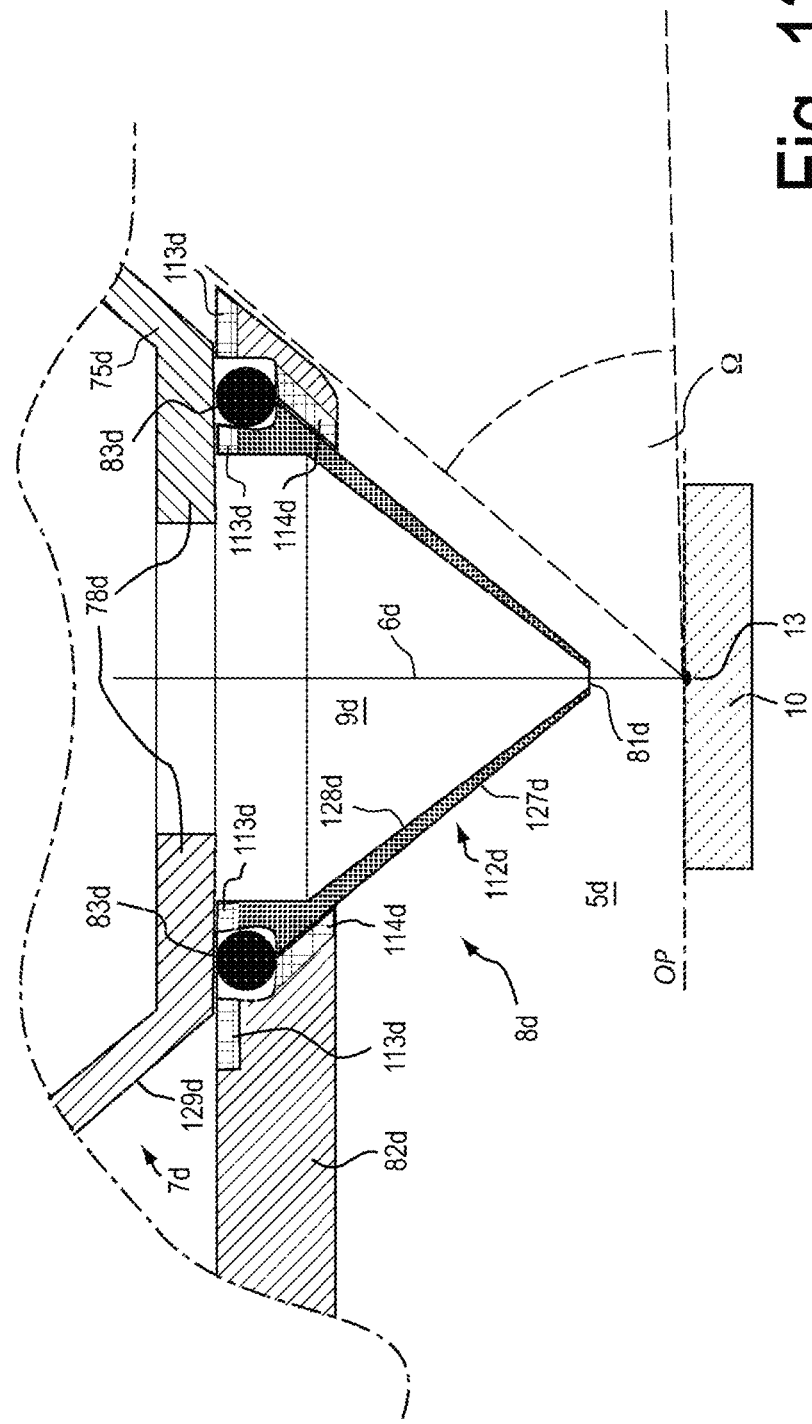

CHARGED PARTICLE OPTICAL APPARATUS FOR THROUGH-THE-LENS DETECTION OF PARTICLES

CROSS-REFERENCE TO RELATED APPLICATIONS

This application is a continuation of U.S. application Ser. No. 16/047,781, filed Jul. 27, 2018, which is a continuation of U.S. application Ser. No. 14/956,200, filed Dec. 1, 2015, the contents of which are hereby incorporated by reference in their entireties.

TECHNICAL FIELD OF THE INVENTION

The present invention relates to a charged particle apparatus. More specifically, the invention is concerned with a scanning electron microscope capable of operating efficiently at a high-vacuum pressure level in the specimen chamber as well as at substantially higher pressure levels than high vacuum.

BACKGROUND

In conventional scanning electron microscopes (SEM), the specimen chamber is typically maintained at a vacuum pressure of 0.01 Pa or lower. This allows maintaining a sufficiently low pressure level in the electron gun and also to use so-called "in-lens" or "through-the-lens" detector systems, which are typically disposed inside the particle optical column. These low pressure levels also prevent degradation of the image quality, which may occur due to collisions of primary beam electrons with residue gas particles.

However, the requirement of maintaining the specimen chamber at a high vacuum makes it difficult to inspect wet or non-conductive specimens, such as biological materials, plastics, ceramics, minerals and fibers. Wet specimen deteriorate the vacuum pressure level by outgassing. For non-conductive specimen, the low vacuum pressure level prevents dissipation of surface charges that accumulate on the surface.

To enable inspection of wet or non-conductive specimens, preparation techniques, such as drying, freezing or vacuum coating have been developed. These techniques, however, are often not desirable, since they tend to alter or mask the sample surface.

Attempts to overcome these constraints have led to the development of special kinds of scanning electron microscopes, such as variable-pressure scanning electron microscopes (VPSEMs) and environmental scanning electron microscopes (ESEMs). These types of scanning electron microscopes can be operated at elevated gas or vapor pressure levels in the specimen chamber, which can be up to 2500 Pa in the case of ESEMs. Operation at these elevated pressure levels is made possible by one or more differential pressure apertures, which are provided to limit the amount of gas in the electron optical column.

For detection of secondary electrons and backscattered electrons at elevated pressure levels, gaseous detectors have been developed. However, these detectors have shown major drawbacks. First, gaseous detectors typically produce signals with a low signal to noise ratio. This is particularly disadvantageous if samples are inspected which are sensitive to electron beam irradiation, such as semiconductors, plastics, and biological samples. Further, inspection of sensitive samples typically requires a low energy primary electron beam. Gaseous detectors, however, are unsuitable for use with low energy primary electron beams below 3 keV.

Inspections of objects at high pressure levels also have shown not to be fully compatible with through-the-lens detector systems, since the additional differential pressure apertures often reduce the amount of backscattered electrons and secondary electrons, which pass through the objective lens, and hence, the detected electron intensity. Further, the additional differential pressure apertures typically limit the attainable field of view.

Accordingly, there is a need to provide a particle optical system, which allows efficient inspection of a wide range of objects.

Embodiments provide a charged particle optical apparatus, comprising: a particle optical arrangement configured to define a beam path for a primary particle beam for inspecting an object. The particle optical arrangement may further be configured to generate an objective lens field for focusing the primary particle beam onto the object. The particle optical arrangement may include a first electrode, which is at least partially disposed in a first vacuum zone and which forms a channel. The primary particle beam may pass through at least a portion of the channel. The objective lens field may include a static electric field which is generated by using the first electrode. The charged particle optical apparatus may include a second electrode which surrounds at least a section of the primary particle beam path. The section may extend in the first vacuum zone and downstream of the channel. The charged particle optical apparatus may include a third electrode having a differential pressure aperture. Through the differential pressure aperture, the particle beam path may exit from the first vacuum zone. The charged particle optical apparatus may include a particle detector for detecting emitted particles. The emitted particles may be emitted from the object. The emitted particles may pass through the differential pressure aperture of the third electrode. The particle optical apparatus may be configured so that the first, second and third electrodes are operable at different potentials relative to each other.

Thereby, a particle optical apparatus is provided which allows efficient inspection of objects at elevated pressures levels in the specimen chamber. In particular, the particle optical apparatus generates the electrostatic field in the vicinity of the differential pressure aperture of the third electrode in such a way that the thereby introduced aberrations of the primary beam are small in comparison to the aberrations, which are introduced by the objective lens.

More specifically, it has been shown that as a result of the second electrode, the electrostatic field has a high degree of homogeneity at positions on the optical axis in the vicinity of the axial position of the differential pressure aperture of the third electrode. Furthermore, comparatively low electric field strengths within the differential pressure aperture of the third electrode are obtained.

Detecting emitted particles which have passed through the differential pressure aperture of the third electrode has advantages over using gaseous detectors. Gaseous detectors rely on gaseous amplification in the pressure-controlled interior of the specimen chamber. Gaseous amplification, also denoted as gas cascade amplification, is generated in a gaseous environment, where secondary electrons are accelerated by an electric field and thereby gain sufficient energy for ionizing gas molecules. The ionization of gas molecules produces additional free electrons which are in turn sufficiently accelerated to cause ionization.

Notably, due to the detection of the emitted particles which have passed through the differential pressure aperture, the path length of the primary particle beam in the elevated pressure atmosphere of the specimen chamber can be made very short, even shorter than 500 micrometers. The short path length can be obtained by adjusting the distance between the object and the final differential pressure aperture, through which the primary particle beam enters into the specimen chamber. Such short path lengths, however, are incompatible with gaseous amplification.

The short path length of the primary particle beam in the pressure-controlled interior of the specimen chamber in turn allows inspection of the object at low primary particle energies, such as 1 keV or even lower. Compared thereto, using gaseous detectors below primary particle beam energies of 3 keV typically yield images of unsatisfactory signal to noise ratio as a result of scattering of primary particles.

Hence, the charged particle optical apparatus allows inspection of objects which are sensitive to irradiation by the primary particle beam, which requires low primary particle energies. Inspection of these sensitive objects is further facilitated in that detector systems can be used, which do not rely on gaseous amplification and thereby have a high signal to noise ratio, compared to gaseous detectors. This in turn allows using low primary particle beam intensities.

The charged particle optical apparatus may be a particle microscope, in particular a scanning particle microscope. The scanning particle microscope may be a scanning electron microscope and/or a focused ion beam microscope. The focused ion beam microscope may comprise a gas field ion source, a plasma ion source and/or a liquid metal ion source. By way of example, the focused ion beam microscope is a noble gas ion microscope, in particular a helium ion microscope.

The particle optical arrangement may be configured to focus the primary particle beam on a surface of the object. The particle optical arrangement may include a deflector system which is configured to deflect the primary particle beam in order to scan the primary particle beam across the object surface. The particle optical arrangement may include further components such as a condenser lens and/or a particle gun.

The objective lens field may include an electrostatic field and/or a magnetostatic field. The electrostatic field may be generated by using the first electrode, in particular an object-side end portion of the first electrode, and/or the second electrode. The electrostatic field may further be generated by using one or more further electrostatic field generating electrodes. These one or more further electrostatic field generating electrodes may include one or more magnetic pole pieces. The objective lens field may be configured to focus a section of the primary particle beam which enters into the objective lens field to a spot on the object surface. The spot may be configured so that 50% of the beam intensity of the spot is located within a circle having a diameter of less than 20 nanometers, less than 15 nanometers, or less than 5 nanometers.

The first electrode forms a channel, wherein the primary particle bam path passes through at least a portion of the channel. The first electrode may be non-magnetic. The first electrode may be configured as a liner electrode and/or a beam booster. The first electrode may represent an innermost wall for the primary particle beam path at locations, where the primary particle beam path extends within the channel. The object-side end portion of the first electrode may include an exit aperture through which the primary particle beam exits from the channel. Through the exit aperture, the emitted particles may enter into the channel. The particle detector may be disposed at least partially inside the channel.

The particle optical arrangement is configured so that a potential of the first electrode relative to the second electrode can be adjusted to values greater than +1 kV or greater than +2 kV or greater than +5 kV or greater than +10 kV. The potential may be less than +50 kV or less than +20 kV.

Emitted particles, which are emitted from the object, pass through the differential pressure aperture of the third electrode. The emitted particles may be emitted in response to irradiation with the primary particle beam.

The emitted particles may be primary particles, which are scattered by the object and/or secondary particles, which are emitted from the object in response to irradiation with the primary particles. If the charged particle optical apparatus is configured as a scanning electron microscope, the primary particles, which are scattered by the object may be backscattered electrons and the secondary particles may be secondary electrons. If the charged particle optical apparatus is configured as a helium ion microscope, the primary particles, which are scattered from the object may be backscattered helium ions and the secondary particles may be secondary electrons and/or secondary ions.

The object-side end portion of the first electrode may be surrounded by a magnetic pole piece of the objective lens. The primary particle beam path may enter the channel of the first electrode at a position upstream of the objective lens field or upstream of a condenser lens field. The condenser lens field may be generated by the particle optical arrangement. The condenser lens field may include a magnetostatic field and/or an electrostatic field.

One or more or each of the differential pressure apertures described herein may be defined as an aperture, which is disposed between two vacuum zones and/or which connects two vacuum zones. A differential pressure drop may be maintainable across the differential pressure aperture. Each of the vacuum zones described herein may have a uniform or substantially uniform pressure level. For each of the differential pressure apertures, a pressure ratio P2/P1 across the differential pressure aperture may be below 0.5, or below 0.1, or below 0.01, or below 0.001. P1 and P2 are the pressure levels of the vacuum zones, between which the differential pressure aperture is disposed.

At least one, or all, of the vacuum zones of the particle optical arrangement may include a vacuum port for evacuating the respective vacuum zone. The vacuum ports may be in fluid communication with a vacuum source. The vacuum source may include a vacuum pump. The vacuum port may be connected to the vacuum source via a vacuum line.

A diameter of the differential pressure aperture of the third electrode may be greater than 400 micrometers, or greater than 800 micrometers. The diameter may be smaller than 3000 micrometers, or smaller than 2500 micrometers. If the aperture is non-circular, the diameter may be a largest diameter measured at the differential pressure aperture. The diameter may be measured in a direction perpendicular to an optical axis of the particle optical arrangement. At least a portion of the third electrode may be in the form of a tapered tube. The tapered tube may taper towards the object or may taper away from the object. At least a portion of an inner peripheral surface and/or at least a portion of an outer peripheral surface of the third electrode may have a tapered shape and/or a frustoconical shape. The tapered shape and/or the frustoconical shape may taper towards the object or may taper away from the object.

The third electrode may include an edge which surrounds the differential pressure aperture. The edge may have a thickness of less than 300 micrometers or less than 50 micrometers. The thickness may be greater than 0.4 micrometers. At least a portion of the third electrode may form at least a portion of a detector. By way of example, at least a portion of the third electrode may form a collector electrode. The collector electrode may be part of a gaseous particle detector and/or may be configured to collect electrons without gaseous amplification.

After the primary particles have exited from the channel, the primary particles may move along a section of the primary particle beam path, which is surrounded by the second electrode. In other words, the section extends downstream of the channel. At least a portion of the second electrode may be disposed in the first vacuum zone. The second electrode may include a surface portion, which is an innermost wall for at least a portion of the section of the primary particle beam path. The surface portion may form an opening, a constriction and/or an innermost edge of an inward extending rim. The second electrode may form an opening through which the primary particle beam path passes. The opening may be a pressure communication aperture. In other words, the opening does not form a differential pressure aperture.

The differential pressure aperture of the third electrode may be disposed downstream of the second electrode relative to the primary particle beam path. The differential pressure aperture of the third electrode may be disposed downstream of a final magnetic pole piece of the objective lens, as seen along the primary particle beam path.

The charged particle optical apparatus is configured so that the first, second and third electrodes are operable at different potential levels relative to each other. The potential level of at least two of the first to third electrodes may be variable, in particular controllably variable. At least two of the first to third electrodes may be electrically connected to a voltage source. One of the first to third electrodes, in particular the second electrode, may be electrically connected to ground potential.

The particle detector, which is configured to detect emitted particles which have passed through the differential pressure aperture of the third electrode, may be a through-the-lens particle detector. A through-the-lens particle detector may be defined herein as a detector which is configured to detect emitted particles after the emitted particles have passed through a principal plane of a particle lens of the particle optical arrangement. The particle lens may be at least a portion of the objective lens. Additionally or alternatively, a through-the-lens detector may be defined herein as a detector which is configured to detect emitted particles after the emitted particles have passed a narrowest portion of an opening formed by at least one or all magnetic pole pieces of the objective lens. The particle detector may be disposed in the first vacuum zone or a vacuum one which is disposed upstream of the first vacuum zone relative to the primary particle beam path.

The particle detector may be configured to selectively detect primary particles and/or secondary particles. In particular, the particle detector may be configured to selectively detect backscattered electrons and/or secondary electrons. One or more particle receiving surfaces of the particle detector may be disposed circumferentially around the primary particle beam path.

The charged particle optical apparatus may include a gaseous detector. The gaseous detector may be configured as a collector electrode detector and/or a gas scintillation detector. The collector electrode detector may be configured to collect electrons generated in the gas cascade by means of a detector electrode. The gas scintillation detector may be configured to detect scintillation radiation generated by the gas cascade.

According to an embodiment, in an inspection operation mode of the particle optical apparatus, a potential level of the third electrode is between a potential level of the first electrode and a potential level of the second electrode.

It has been found that thereby, a particularly high degree of field homogeneity on positions on the optical axis in the vicinity of the differential pressure aperture of the third electrode can be obtained. Further this also results in a comparatively low field strength. Thereby, less aberrations are introduced into the primary particle beam. In the inspection operation mode, the potential of the first electrode relative to the second electrode may be positive.

The charged particle optical apparatus may be configured to adjust the potential of the first and/or third electrode depending on one or more operational parameters of the charged particle optical apparatus. These one or more operational parameters may include the pressure level of the pressure-controlled interior of the specimen chamber, the potential of the fourth electrode and/or the potential of the second electrode.

A controlling function of the charged particle optical apparatus for controlling the potential of the third electrode may be activated and/or deactivated depending on a vacuum pressure level in the specimen chamber. In particular, the control function may be activated if the pressure level in the specimen chamber is below a threshold value. The threshold value may be pre-stored and/or pre-determined.

According to an embodiment, in the inspection operation mode, the potential of the third electrode relative to the second electrode has a value of at least +100 V or at least +400 V or at least +600 V. The potential of the third electrode relative to the second electrode may have a value which is less than +3000 V, or less than +1000 V.

In the inspection operation mode, the potential of the first electrode relative to the second electrode may have a value greater than +1 kV, greater than +2 kV or greater than +5 kV or greater than +10 kV. The potential may be less than +50 kV or less than +20 kV.

In the inspection operation mode, the potential level of the second electrode may deviate from the potential of the specimen chamber or may deviate from ground potential by less than plus or minus 500 V, or less than plus or minus 300 V, or less than plus or minus 100 V, or less than plus or minus 50 V, or less than plus or minus 5 V. In the inspection operation mode, the potential of the second electrode may be or may substantially be the potential level of the specimen chamber and/or ground potential.

According to an embodiment, the second electrode and the object-side end portion of the first electrode may form an axial gap, relative to the optical axis of the particle optical arrangement. The axial gap may surround the beam path of the primary particle beam.

According to an embodiment, an object-side end face of the end portion of the first electrode may be disposed in opposed relationship to a surface portion of the second electrode. The end face and/or the surface portion may surround the primary particle beam path. The end face and the surface portion may be parallel or substantially parallel relative to each other. The end face and/or the surface portion may be curved, substantially plane or plane.

According to a further embodiment, in the inspection operation mode of the charged particle optical apparatus, the potential of the first electrode relative to the second electrode ($V_1$) divided by the potential of the third electrode relative to the second electrode ($V_3$), i.e. the value $V_1/V_3$. is greater than 2 or greater than 3 or greater than 4 or greater than 5.

According to a further embodiment, the second electrode forms a constriction through which the primary particle beam path passes. A position of a narrowest part of the constriction, as measured along an optical axis of the particle optical arrangement, is disposed between the first electrode, or between an object-side end portion of the first electrode, and the differential pressure aperture of the third electrode.

It has been shown that thereby, the third electrode can be shielded from the first electrode. The narrowest part of the constriction may form an opening. The opening may form a pressure communication aperture. In other words, the constriction does not form a differential pressure aperture.

The primary particle beam may pass through the narrowest part of the constriction after exiting from the channel of the first electrode and before passing through the differential pressure aperture of the third electrode.

An inner diameter at the narrowest part of the constriction may be greater than 2 millimeters, or greater than 4 millimeters. The inner diameter may be less than 15 millimeter, or less than 8 millimeters. The inner diameter may be measured perpendicular to the optical axis. If the narrowest part forms a non-circular opening, the inner diameter may be a smallest diameter measured at the narrowest part. The inner diameter may be smaller than an outer diameter of the object-side end portion and/or an object-side end face of the first electrode. The outer diameter may be measured perpendicular to the optical axis. The outer diameter may be a maximum outer diameter of all diameters measured at the object-side end portion and/or the object-side end face. The inner diameter of the narrowest part of the constriction may be smaller or smaller than 90%, or smaller than 80%, or smaller than 70% of the outer diameter.

The constriction may be formed by a rim, which extends inward toward the primary particle beam path. The rim, in particular an inner peripheral surface of the rim may surround the primary particle beam path. The rim and/or the inner peripheral surface may be disposed in the first vacuum zone. An axis of an inner peripheral surface of the rim and/or an axis of the rim may be aligned or substantially aligned with the optical axis of the particle optical arrangement. The inner peripheral surface may have a rounded, chamfered and/or angled profile.

The second electrode, in particular the rim, which is formed by the second electrode, may include a first inward extending surface. The first inward extending surface may surrounds the primary particle beam path. The first inward extending surface may be plane or substantially plane. The first inward extending surface may face the end portion of the first electrode and/or may be averted from the third electrode. The first inward extending surface may be oriented perpendicular or substantially perpendicular to the optical axis of the particle optical arrangement. The first inward extending surface may be parallel or substantially parallel to an object-side end face of the first electrode. The end face may be plane, or substantially plane. The end face may be oriented perpendicular to the optical axis of the particle optical arrangement or substantially oriented perpendicular to the optical axis.

The second electrode, in particular the rim, which is formed by the second electrode, may include a second inward extending surface. The second inward extending surface may surround the primary particle beam path. The second inward extending surface may be plane or substantially plane. The second inward extending surface may face the third electrode and/or may be averted from the object-side end portion of the first electrode.

The second inward extending surface may be oriented perpendicular or substantially perpendicular to the optical axis of the particle optical arrangement.

The second electrode, in particular the rim, may include a source-side shoulder. A distance between the source-side shoulder and the differential pressure aperture of the third electrode, as measured along the optical axis of the particle optical arrangement, may be greater than 1.3 millimeters or greater than 2 millimeters. The distance may be smaller than 5 millimeters or smaller than 3.5 millimeters.

According to a further embodiment, the charged particle optical apparatus further comprises a fourth electrode having a differential pressure aperture wherein the differential pressure aperture of the fourth electrode is disposed in the primary particle beam path between the differential pressure aperture of the third electrode and the object.

It has been shown that thereby, a sufficiently low vacuum pressure level can be maintained in the first vacuum zone even at comparatively high pressure levels in the specimen chamber. This allows maintenance of the first electrode at comparatively high voltage levels, thereby permitting a high performance of the objective lens. Moreover, this allows use of particle detectors and/or charged particle energy analyzers in the first vacuum zone which require a comparatively low vacuum level for operation. Furthermore, the comparatively low pressure level in the first vacuum zone also reduces scattering of primary particles.

By way of example, the charged particle optical apparatus, having at least the differential pressure apertures of the third and fourth electrodes, may be configured so that at a vacuum pressure level of 600 Pa in the specimen chamber, the vacuum pressure level in the first vacuum zone is lower than 20 Pa, lower than 10 Pa or lower than 5 Pa, or lower than 1 Pa.

The differential pressure aperture of the fourth electrode may be a final differential pressure aperture through which the primary particle beam path passes. Through the differential pressure aperture of the fourth electrode, the primary particle beam may enter into the pressure-controlled interior of the specimen chamber.

According to a further embodiment, the charged particle optical apparatus includes an intermediate vacuum zone. After exiting from the first vacuum zone, the primary particle beam path may enter into the intermediate vacuum zone. After passing through the intermediate vacuum zone, the primary particle beam path may enter into the pressure-controlled interior of the specimen chamber. The third electrode may be disposed between the first vacuum zone and the intermediate vacuum zone. The fourth electrode may be disposed between the intermediate vacuum zone and the pressure-controlled interior of the specimen chamber. The particle detector may detect emitted particles, which pass through the differential pressure apertures of the third and fourth electrodes.

The intermediate vacuum zone may have a vacuum port for evacuating the intermediate vacuum zone. The vacuum port may be in fluid communication with a vacuum source.

A diameter of the differential pressure aperture of the fourth electrode may have a value smaller than 2000 micrometers or smaller than 500 micrometers. The diameter may be greater than 20 micrometers or greater than 100 micrometers. The diameter may be measured in a direction perpendicular to the optical axis. If the differential pressure aperture is non-circular, the diameter may be a largest diameter measured at the differential pressure aperture.

At least a portion of the fourth electrode may be in the form of a tapered tube. The tapered tube may taper towards the object or tapers away from the object. At least a portion of an inner peripheral surface and/or at least a portion of an outer peripheral surface of the fourth electrode may have a tapered shape or a frustoconical shape. The tapered shape and/or the frustoconical shape may taper toward the object or may taper away from the object.

Through the tapered form of the outer peripheral surface of the fourth electrode, a comparatively large collection solid angle region may be provided for particle and/or radiation detectors, which are mounted in the pressure-controlled interior of the specimen chamber and which are configured to detect particles and/or radiation. Examples for such radiation and/or particle detectors are EDX (energy dispersive X-ray) detectors, WDS (wavelength dispersive spectroscopy) detectors, gas scintillation detectors, collector electrode gaseous detectors, and cathodoluminescence detectors Furthermore, the tapered form of the outer peripheral surface of the fourth electrode allows placing the object plane of the particle optical arrangement comparatively close to the differential pressure aperture of the fourth electrode. Thereby, the segment of the primary particle beam path which traverses the vacuum zone of the interior of the specimen chamber is comparatively short. This allows efficient use of electron beams with low kinetic energies (even with energies as low as 1 keV), which have a comparatively short mean free path in the interior of the specimen chamber if the interior of the specimen chamber is maintained at an elevated pressure level.

A ratio of the diameter ($D_2$) of the differential pressure aperture of the fourth electrode over a diameter of the differential pressure aperture of the third electrode ($D_1$), i.e. the ratio $D_2/D_1$, may have a value smaller than 0.8 or smaller than 0.6. The ratio may be greater than 0.2 or greater than 0.12. Thereby, a large collection efficiency can be obtained even for comparatively high pressure levels in the vacuum chamber.

A distance between the differential pressure aperture of the third electrode and the differential pressure aperture of the fourth electrode, as measured along the optical axis of the particle optical arrangement, may be greater than 3 millimeters or greater than 4 millimeters. The distance may be smaller than 8 millimeters or smaller than 15 millimeters.

The charged particle optical apparatus may be configured so that the relative potential between the third electrode and the fourth electrode is adjustable, in particular controllably adjustable. The charged particle optical apparatus may further be configured so that in the inspection operation mode, the third electrode is at a positive potential relative to the fourth electrode. The charged particle optical apparatus may further be configured so that in the inspection operation mode, the third electrode is at a potential relative to the fourth electrode of at least +30 V, or at least +50 V, or at least +100 V. In the inspection operation mode, the third electrode may be at a potential relative to the fourth electrode of less than +3000 V, or less than +1000 V, or less than +800 V, or less than +600 V.

Thereby, a sufficient portion of secondary electrons which have passed through the differential pressure aperture of the fourth electrode is guided through the differential pressure aperture of the third electrode.

Additionally or alternatively, the charged particle optical apparatus may be configured so that the fourth electrode can be maintained at a positive potential level of more than 20 V or more than 50 V or more than 100 V relative to an abutment portion of an object holder to which the object is abuttingly attached.

Since the object is abuttingly attached to the abutment portion of the object holder, at least a portion of the object is maintained at the potential of the abutment portion. The relative potential between the fourth electrode and the abutment portion may be adjustable, in particular controllably adjustable. The fourth electrode and/or the abutment portion of the object holder may be electrically connected to a voltage source which is configured for adjustment of the relative potential between the fourth electrode and the abutment portion of the object holder.

This allows adjustment of the potential levels so that a sufficient portion of secondary electrons, which are emitted from the object, are guided through the differential pressure aperture of the fourth electrode. Furthermore, this allows adjustment of the potential levels so that a gas cascade is generated between the object and the fourth electrode. This gas cascade can provide the gas amplification for a gaseous detector, which is mounted within the pressure-controlled interior of the specimen chamber. Additionally or alternatively, this gas cascade generates secondary electrons which are guided through the differential pressure apertures of the third and fourth electrode so that they can be detected by the particle detector.

The third and fourth electrodes may be part of a differential pressure module, which is positionable within he pressure-controlled interior of the specimen chamber. The differential pressure module may include an intermediate vacuum hone which is disposed between the differential pressure aperture of the third electrode and the differential pressure aperture of the fourth electrode. The fourth electrode may be exchangeably attached to the differential pressure module. Thereby, it is possible to provide a plurality of final electrodes, wherein each of the final electrodes can be selectively attached to the differential pressure module so as to serve as the fourth electrode.

By way of example, one of the final electrodes has a differential pressure aperture which is adapted for imaging objects at vacuum pressure levels in the pressure-controlled interior of the specimen chamber of 600 Pa or more. This final electrode can therefore be used to inspect wet objects. Additionally or alternatively, one of the final electrodes has a differential pressure aperture which is adapted for imaging at vacuum pressure levels in the specimen chamber of between 30 Pa and 150 Pa. This final electrode can therefore be used to inspect objects which tend to accumulate charges. Both of these final electrodes are configured for imaging using the particle detector which detects particles which have passed through the differential pressure apertures of the third and the fourth electrode.

Additionally or alternatively one of the final electrodes has a comparatively large differential pressure aperture diameter and is configured for inspecting samples which tend to accumulate charges, wherein the objective lens operates without an electric objective lens field and detection of particles, which have passed through the differential pressure apertures of the first and the second electrode, is deactivated. Accordingly, this final electrode may be used for imaging using a gaseous detector which is disposed in the pressure-controlled interior of the specimen chamber.

According to an embodiment, an inner peripheral edge of the differential pressure aperture of the fourth electrode has a thickness of less than 300 micrometers or less than 50 micrometers. The thickness may be greater than 0.4 micrometers. The edge may be cylindrical, substantially cylindrical or may be a sharp edge. The sharp edge may be formed by a tapered surface.

At least a portion of the fourth electrode may form at least a portion of a detector. By way of example, at least a portion of the fourth electrode may form a collector electrode. The collector electrode may be part of a gaseous particle detector and/or may be configured to collect electrons without gaseous amplification. Additionally or alternatively, at least a portion of the fourth electrode may consist of semiconductor material and may form part of a semiconductor particle detector.

According to a further embodiment, the fourth electrode is operable at a different potential level than the first, second and third electrodes.

According to a further embodiment, the third and fourth electrodes are configured so that a potential difference applied between the third electrode and the fourth electrode causes a focusing and/or collecting electric field for the emitted particles.

According to a further embodiment, at least a portion of the second electrode is a magnetic pole piece portion of the objective lens and/or is formed at least partially from magnetic material. According to a further embodiment, the second electrode is electrically connected to the potential of a magnetic pole piece of the objective lens. Additionally or alternatively, the second electrode may be maintained at a same or substantially same potential as the magnetic pole piece. The magnetic pole piece may be an outer and/or object-side magnetic pole piece of the objective lens.

According to a further embodiment, in an inspection operation mode of the charged particle optical apparatus, the objective lens field has a magnetic field strength which is greater than 10 mT, or greater than 15 mT, or greater than 20 mT, measured at a location where the primary particle beam path enters into the vacuum zone of the pressure-controlled interior of the specimen chamber. The location may be a position of a final differential pressure aperture, such as the differential pressure aperture of the fourth electrode.

According to a further embodiment, the third and/or fourth electrodes are part of a differential pressure module. The charged particle apparatus may further comprise a positioning mechanism, which is at least partially arranged in the pressure-controlled interior of the specimen chamber. The positioning mechanism may be configured to selectively position the differential pressure module within the pressure-controlled interior of the specimen chamber into an operating position in which the primary particle beam path passes through the differential pressure aperture of the third electrode and/or the differential pressure aperture of the fourth electrode. The selective positioning may include an advancing movement of the differential pressure module directed toward the primary particle beam path.

According to a further embodiment, the positioning mechanism includes a positioning arm. The advancing movement may be transmitted to the differential pressure module by a track-guided movement of the positioning mechanism and/or positioning arm.

According to an embodiment, during the positioning of the differential pressure module, the second electrode remains fixed in relation to the primary particle beam path.

According to a further embodiment, the positioning of the differential pressure module comprises bringing the differential pressure module into abutment with an abutment portion of the charged particle optical apparatus. The second electrode may include at least a portion of the abutment portion.

According to a further embodiment, the differential pressure module may include a third electrode and a fourth electrode, each having a differential pressure aperture through which the primary particle beam path passes. The third and fourth differential pressure apertures may be operable at different potential levels relative to each other.

The particle detector for detecting emitted particles which pass through the differential pressure aperture of the third electrode and/or the differential pressure aperture of the fourth electrode may be a non-gaseous particle detector. In other words, the particle detector may be configured to operate without using gaseous amplification, also denoted as gas cascade amplification. Thereby, the particle detector can be operated in vacuum zones of low vacuum pressure, such as in the first vacuum zone or in a vacuum zone, which is located upstream of the first vacuum zone relative to the primary particle beam path.

According to a further embodiment, the particle detector for detecting emitted particles which pass through the third electrode includes a solid impact recording medium. The solid impact recording medium may be an amplifying solid impact recording medium. The solid impact recording medium may be configured for performing secondary emission amplification, scintillation amplification, and/or charge carrier amplification.

The solid impact recording medium which performs secondary emission amplification may be part of a secondary electron multiplier. By way of example, the solid impact recording medium may be a dynode (such as the dynode of a channeltron detector), a micro channel plate, a microsphere plate. The solid impact recording medium which performs scintillation amplification may be scintillator, such as a plastic scintillator, a YAG sinctillator and/or a YAP scintillator. The solid impact recording medium which performs charge carrier amplification may be an active semiconductor region of a semiconductor particle detector. The charge carriers may be electrons and/or electron-hole pairs. The semiconductor detector may for example have a metal-semiconductor junction and/or a p-n junction.

Additionally or alternatively, the particle detector for detecting emitted particles which pass through the third electrode may include one or a combination of the following: a photomultiplier, a photodiode, an avalanche photodetector (APD), a CCD photodetector and a CMOS photodetector.

According to an embodiment, the charged particle optical apparatus may include one or more chamber-mounted detectors, which are disposed in the pressure-controlled interior of the vacuum chamber and which are configured to detect particles and/or radiation. Examples for such radiation and/or particle detectors are EDX (energy dispersive X-ray) detectors, WDS (wavelength dispersive spectroscopy) detectors, gaseous detectors and cathodoluminescence detectors. The gaseous detector may be configured as a collector electrode detector and/or a gas scintillation detector.

The charged particle optical apparatus may include a cooling system for cooling the object. The cooling system may be configured to maintain the object at a temperature of less than 10 degrees Celsius or less than 5 degrees Celsius or less than 1 degree Celsius. By cooling wet objects to a temperature within these temperature ranges allows maintaining a low vacuum pressure level in the pressure-controlled interior of the specimen chamber.

Embodiments provide a method of operating the charged particle optical apparatus. The method may include adjusting potential levels of the first, second and/or third electrodes so that the potential levels are different from each other. Additionally or alternatively, the method may include detecting emitted particles, which are emitted from the object and which pass through the differential pressure aperture of the third electrode.

Embodiments provide a method of operating a charged particle optical apparatus. The charged particle optical apparatus may include a differential pressure module having at least a first differential pressure aperture. The method may include acquiring a first image with the differential pressure module positioned in a non-operating position in which the first differential pressure aperture is outside the primary particle beam path. The method may include positioning the first differential pressure aperture within the pressure-controlled interior of the specimen chamber from the non-operating position into an operating position. When the first differential pressure aperture is in the operating position, the primary particle beam path may enter into the pressure-controlled interior of the specimen chamber by passing through the first differential pressure aperture. The method may further include acquiring a second image with the differential pressure module positioned in the operating position. At least a portion of the first image and at least a portion of the second image may represent a same object portion of the object.

The positioning of the first differential pressure aperture within the pressure-controlled interior allows in an efficient manner acquisition of images of an object portion with and without the differential pressure aperture being positioned in the operating position. It turned out that such images provide complementary information for image interpretation. Hence, more thorough and efficient inspection procedures can be performed.

The differential pressure module may include a second differential pressure aperture. In the operating position of the differential pressure module, the second differential pressure aperture may be disposed between the first differential pressure aperture and the object. In the non-operating position of the differential pressure module, the second differential pressure aperture is outside the primary particle beam path. Between the first and the second differential pressure apertures, an intermediate vacuum zone may be disposed.

According to an embodiment, the first image is acquired using a gaseous detector. Additionally or alternatively, the second image is acquired using a detector, which is configured to detect emitted particles, which pass through the first and/or second differential pressure aperture. The detector, which is used for acquiring the second image may be a through-the-lens detector, in particular a through-the-lens secondary electron detector.

According to an embodiment, a pressure level in the pressure-controlled interior of the specimen chamber, measured when the second image is acquired, is more than 1.5 times, or more than 2 times, or more than 5 times, or more than 10 times the pressure level measured when the first image is acquired. Additionally or alternatively, the pressure level in the pressure-controlled interior of the specimen chamber when the first image is acquired is less than 80 Pa, or less than 60 Pa, or less than 30 Pa. Additionally or alternatively, the vacuum pressure level in the pressure-controlled interior of the specimen chamber when the first and the second images are acquired may be greater than 5 Pa, or greater than 15 Pa, or greater than 25 Pa.

According to a further embodiment, the method further includes combining at least a portion of the first image and at least a portion of the second image. The combination may be a weighted combination. Generating the combination may include generating a combined image. Generating the combination may include forming a pixel-by-pixel sum, a weighted pixel-by-pixel sum, a pixel-by-pixel difference and/or a weighted pixel-by-pixel difference. The weight assigned to the first and/or the second image may vary across the respective image. The weight assigned to an image may vary across the image. The graphical user interface may be configured so that the user can adjust parameters for the combination of the images. By way of example, one or more weight factors for the weighted combination may be adjustable through the graphical user interface. The weighted combination may be formed by assigning an individual weight for each of a plurality of pixels of the first and/or the second image.

Additionally or alternatively, the method may include combining an image portion of the first image and an image portion of the second image, wherein the portions represent complementary or substantially complementary, non-overlapping or substantially non-overlapping object portions.

According to a further embodiment, the combining of at least the portion of the first image and at least the portion of the second image comprises identifying an image region of the second image which includes all those portions of the second image in which the primary particle beam path is influenced by a physical and/or electrostatic interaction with the differential pressure aperture.

The physical and/or electrostatic interaction with the differential pressure aperture may cause a shadowing or attenuation of the primary particle beam and/or may cause aberrations of the primary particle beam induced by the electric field generated by the presence of the differential pressure aperture.

According to a further embodiment, the combining of at least the portion of the first image and at least the portion of the second image is performed to form a combined image. In the combined image, a contribution of the identified image region of the second image may be suppressed relative to the contribution of at least a portion of the remaining image. In particular, the identified image region may be assigned a low weight compared to at least a portion of the remaining image. The contribution of the identified image region may be suppressed in a manner so that the contribution is absent. The contribution of a pixel of an image (such as a pixel of the first or the second image) to a corresponding pixel of the combined image may be defined as a weight factor which is assigned to the pixel data value of the pixel of the image. The corresponding pixel of the combined image may represent a same object location as the pixel of the image.

According to a further embodiment, the combining of at least the portion of the first image and at least the portion of the second image is performed to form a combined image. A contribution of pixels of the second image to the combined image is suppressed, at least for those pixels in the second image where in the second image the primary particle beam path is influenced by physical and/or electrostatic interaction with the differential pressure aperture. The contribution of these pixels may be suppressed relative to a contribution of at least a portion of the remaining pixels of the second image. The remaining pixels are remaining relative to the suppressed image portion.

According to a further embodiment, the method further comprises identifying the portion of the first image and the portion of the second image which represent the same object portion. The identifying of the portion of the first image and the portion of the second image may include determining a parameter of a position and/or an orientation of a field of view represented by the second image measured relative to a position and/or orientation of a field of view represented by the first image.

According to an embodiment, during the acquiring of the first and/or the second image, the objective lens field has a magnetic field strength which is greater than 10 mT, or greater than 15 mT, or greater than 20 mT, measured at a location where the primary particle beam path enters into the vacuum zone of the pressure-controlled interior of the specimen chamber.

Embodiments provide a method of operating a charged particle optical apparatus. The charged particle optical apparatus may include a differential pressure aperture disposed in the beam path of the primary particle beam. The primary particle beam path may enter into the pressure-controlled interior of the specimen chamber by passing through the differential pressure aperture. The method may include acquiring a third image using a detector which is disposed in the specimen chamber. The method may include acquiring a fourth image using a detector which is configured to detect emitted particles which are emitted from the object and which pass through the differential pressure aperture. At least a portion of the third image and at least a portion of the fourth image may represent a same object portion of the object.

This allows for more efficient and thorough inspection procedures, since the image data acquired by the different detectors provide complementary information for image interpretation.

The use of the terms first, second, etc. in this disclosure do not denote any order or importance. Rather these terms are used to distinguish elements from each other.

Therefore, the expression "third image" does not necessarily mean that a first and a second image have been acquired.

According to a further embodiment, the method further includes generating a combination of at least a portion of the third image and at least a portion of the fourth image. The combination may be a weighted combination. The combining may include forming a pixel-by-pixel sum or weighted sum and/or a pixel-by-pixel difference or weighted difference. The weight assigned to an image may vary across the image. The graphical user interface may be configured so that the user can adjust parameters for the combination of the images. By way of example, one or more weight factors for the weighted combination may be adjustable through the graphical user interface. The weighted combination may be formed by assigning an individual weight for each of a plurality of pixels of the third and/or the fourth image.

According to an embodiment, the detector, which is disposed in the specimen chamber, is a gaseous detector. The gaseous detector may be a side-mounted detector. Additionally or alternatively, the detector, which is configured to detect emitted particles which are emitted from the object and which pass through the differential pressure aperture, may be a through-the-lens detector. The detector, which is configured to detect emitted particles, which pass through the differential pressure aperture may also detect electrons generated by gas cascade amplification.

The charged particle optical apparatus may include a second differential pressure aperture. The second differential pressure aperture may be disposed in the primary particle beam path. The detector, which is used for acquiring the fourth image may be configured to detect emitted particles, which pass through the differential pressure aperture and through he second differential pressure aperture.

According to a further embodiment, the combining is performed to generate a combined image. At least a portion of the combined image may show one or more intensity valleys, which correspond or substantially correspond to one or more intensity valleys of the third image. In the portion of the combined image, a contribution of the fourth image may be enhanced within the one or more intensity valleys compared to outside the one or more intensity valleys. In this context, the term "corresponding" may be defined to mean that the intensity valleys represent a same or substantially a same object portion.

The terms shadow region and/or intensity valleys may be defined to mean an image region, which is at least partially surrounded by an intensity edge. The shadow region and/or intensity valley may represent an intensity variation above noise level. The shadow region and/or intensity valley may include in image region having an intensity of less than 80%, less than 70%, less than 60%, or less than 50%, compared to the intensity of the intensity edge. The image region may include a plurality of pixels. The plurality of pixels may form a pixel cluster.

The intensity shadow region may be an intensity valley. The third and/or the fourth images may be grayscale images and/or color images. The intensity may be a grayscale value or may be determined depending on the grayscale value of the third image. Additionally or alternatively, the intensity may be a value of a channel of a pixel, which carries brightness information of a pixel, or may be determined depending on the value of the channel, which carries the brightness information. By way of example, the intensity may be a value of a luminance channel or may be determined depending on the value of the luminance channel.

According to a further embodiment, at least a portion of the combined image may show one or more colored regions, which correspond or substantially correspond to one or more intensity valleys of the third image. In the portion of the combined image, a contribution of the fourth image may be enhanced within the one or more colored regions compared to outside the one or more colored regions. In this context, the term "corresponding" may be defined to mean that the colored regions of the combined image and the shadow regions of the third image represent a same or substantially a same object portion. In the portion of the combined image, compared to outside of the colored regions, the colored regions may be marked with different values of parameters of color appearance, such as colorfulness, chroma, saturation, lightness, and brightness.

According to a further embodiment, at least a portion of the combined image may show one or more shadow regions, which correspond to one or more shadow regions of the third image. In the portion of the combined image, a contribution of the fourth image may be enhanced within the one or more shadow regions compared to outside the one or more shadow regions. In this context, the term "corresponding" may be defined to mean that the shadow regions represent a same or substantially a same object portion.

Additionally or alternatively, the method may further comprise determining at least one contribution image region within the fourth image. The contribution image region may contribute to the combined image. The contribution image region may be determined depending on image data values of the third image. The determining of the contribution image region depending on the image data values of the third image may be performed so that an image region of the third image, which corresponds to the contribution image region of the fourth image, represents at least a portion of a shadow region and/or an intensity valley of the third image. In this context, the term "corresponding" may be defined to mean that both image regions represent a same or substantially a same object portion.

An image region in the combined image, which corresponds to the contribution image region of the fourth image may represent at least a portion of a shadow region and/or an intensity valley of the combined image. The data analysis system may include a graphical user interface. The graphical user interface may be configured to receive user input and to adjust, depending on the user input, one or more parameters of the contribution of the third image relative the contribution of the fourth image within the shadow region and/or intensity valley of the combined image.

According to an embodiment, during the acquiring of the third and/or fourth image, the objective lens field has a magnetic field strength which is greater than 10 mT, or greater than 15 mT, or greater than 20 mT, measured at a location where the primary particle beam path enters into the vacuum zone of the pressure-controlled interior of the specimen chamber.

Embodiments provide a charged particle optical apparatus. The charged particle optical apparatus includes a particle optical arrangement configured to define a primary particle beam path for inspecting an object. The charged particle optical apparatus further includes a specimen chamber configured to accommodate an object in a pressure-controlled interior of the specimen chamber during the inspection of the object. The charged particle optical apparatus may further include a differential pressure module having a differential pressure aperture. The charged particle optical apparatus may include a positioning arm being at least partially arranged in the specimen chamber and configured to selectively position the differential pressure module within the pressure-controlled interior of the specimen chamber into an operating position. In the operating position, the primary particle beam path may pass through the differential pressure aperture. The selective positioning may include an advancing movement of the differential pressure module directed in a direction toward a section of the primary particle beam path, which is within the specimen chamber. The advancing movement may be transmitted to the differential pressure module by a track-guided movement of the positioning arm.

Accordingly, a charged particle optical apparatus is provided, which allows selectively disposing a differential pressure aperture in the primary particle beam path in an efficient manner. This enables fast switching between two operation modes, which may be provided for inspecting objects at different pressure level ranges in the specimen chamber. By way of example, the first operation mode is configured for pressure levels of 0.01 Pa or lower in the specimen chamber and the second operation mode is configured for pressure levels higher than 0.01 Pa in the specimen chamber. It is a further advantage that the track-guided movement of the positioning arm leaves plenty of space in the interior of the specimen chamber for further components of the particle optical apparatus, such as detectors and gas supply systems.

The charged particle optical apparatus may be a particle microscope, in particular a scanning particle microscope. The scanning particle microscope may be a scanning electron microscope and/or a focused ion beam microscope. The focused ion beam microscope may comprise a gas field ion source, a plasma ion source and/or a liquid metal ion source. By way of example, the focused ion beam microscope is a noble gas ion microscope, in particular a helium ion microscope.

The particle optical arrangement may be configured to focus the primary particle beam on a surface of the object. The particle optical arrangement may be configured to scan the primary particle beam across the surface of the object. The particle optical arrangement may include an objective lens, a condenser lens, a beam booster, a particle gun and/or a deflector system. The deflector system may be configured to deflect the primary particle beam. The objective lens may be configured as an electrostatic lens, as a magnetic lens or as a combined magnetic-electrostatic objective lens.

The specimen chamber may be configured as a vacuum chamber. The specimen chamber may be configured to hermetically separate the interior of the specimen chamber from the surrounding atmosphere. The specimen chamber may include a vacuum port for evacuating the specimen chamber. The vacuum port may be in fluid communication with a vacuum source. The interior of the specimen chamber may be configured as a single vacuum zone. The charged particle optical apparatus may include a plurality of vacuum zones. The vacuum zones may be generated by differential pumping. Each of the vacuum zones may have a substantially uniform vacuum pressure level. Each of the vacuum zones may be undivided by differential pressure apertures.

The differential pressure aperture of the differential pressure module may have a width, which is in a range of between 50 micrometers and 2000 micrometers or which is in a range of between 100 micrometers and 1000 micrometers. The width may be measured in a direction perpendicular to the primary particle beam path. The differential pressure aperture may have a length, which is in a range of between 20 micrometers and 10 millimeters, or in a range of between 50 micrometers and 10 millimeters, or in a range of between 100 micrometers and 10 millimeters. The length may be measured in a direction parallel to the primary particle beam path. The differential pressure aperture may be formed in a foil and/or plate.

The differential pressure module may be configured such that in the operating position, the differential pressure aperture separates two vacuum zones of the charged particle optical apparatus. Through the differential pressure aperture, the primary particle beam path may enter into the interior of the specimen chamber. With the differential pressure module being disposed in the operating position, a differential pressure drop may be maintainable across the differential pressure aperture. A pressure ratio $P2/P1$ across the differential pressure aperture may be below 0.5, below 0.1, or below 0.01, or below 0.001. $P1$ may be defined as the pressure level of the vacuum zone of the interior of the specimen chamber. $P2$ may be defined as the pressure level of the vacuum zone, which is separated from the interior of the specimen chamber by the differential pressure aperture.

The charged particle optical apparatus may be switchable to a first and a second operation mode. In the first operation mode, the differential pressure module may be disposed in a non-operating position. In the second operation mode, the differential pressure module may be disposed in the operating position. The charged particle optical apparatus may include a controller, which is configured to switch the particle optical apparatus to the first and/or to the second operation mode.

Prior systems have coupled objects to an electron beam source in a specimen chamber, for example the system as described in U.S. Pat. No. 8,148,684 (Yoshikawa). In Yoshikawa an aperture member is detachably coupled to an electron beam source by a certain mechanism for moving the object. However, the instant invention offers a novel and unique system for moving the differential pressure module to different positions in relation to the first and second operation mode. The presented novel and unique system for moving the differential pressure module allows for rapid positioning of the differential pressure module into the different positions with higher accuracy than prior systems.

The positioning of the differential pressure module within the specimen chamber is performed in the vacuum-controlled environment. In other words, the positioning may be performed while the interior of the specimen chamber is evacuated, i.e. the specimen chamber may not need to be vented during the positioning process.

The positioning arm may have a longitudinal shape. During at least a portion of the positioning, a first portion of the positioning arm may be disposed in a surrounding atmosphere of the charged particle optical apparatus and/or a second portion of the positioning arm may be disposed in the specimen chamber. During at least a portion of the positioning, the positioning arm may extend through a vacuum enclosure of the particle optical apparatus. In other words, the positioning arm may extend from outside the vacuum enclosure to inside the vacuum enclosure. The vacuum enclosure may separate the vacuum from the surrounding atmosphere. The track-guided movement of the positioning arm may include inserting at least a portion of the positioning arm into the specimen chamber.

The positioning arm may be a rigid body. The positioning arm may be an elongate body extending along a longitudinal axis of the positioning arm. A portion or all of the positioning arm may substantially be in the form of a bar. By way of example, the bar is a square and/or a round bar. The track-guided movement may advance and/or approach the positioning arm toward a segment of the primary beam path, which extends inside the specimen chamber. In other words, the track-guided movement may be directed toward the segment of the primary beam path. The longitudinal axis of the positioning arm may be oriented transverse, substantially perpendicular or perpendicular to a direction of the primary beam path, wherein the direction of the primary beam path is measured at a location within the specimen chamber. Additionally or alternatively, the longitudinal axis of the positioning arm may be oriented at an angle relative to a plane, which is perpendicular to the direction of the primary beam path, wherein the angle is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees.

The track-guided movement may be a longitudinal movement or a substantially longitudinal movement of the positioning arm. A direction of the track-guided movement may be oriented parallel or substantially parallel to the longitudinal axis of the positioning arm. An angle between the longitudinal axis of the positioning arm and the direction of the track-guided movement of the positioning arm may be less than 80 degrees, or less than 70 degrees, or less than 60 degrees, or less than 50 degrees, or less than 40 degrees, or less than 30 degrees, or less than 20 degrees, or less than 10 degrees, or less than 5 degrees, or less than 2 degrees. The angle may vary with the positioning of the differential pressure module. The track-guided movement, may be configured so that an orientation of the positioning arm relative to the longitudinal axis of the positioning arm is kept constant or substantially constant. In other words, the track-guided movement may be configured so that the positioning arm does not or substantially does not rotate about its longitudinal axis.

The charged particle optical apparatus may include a guide configured to guide the advancing movement of the differential pressure module and/or the track-guided movement of the positioning arm. The guide may define a guiding path. The guiding path may extend along a guide track of the guide. The guide track may be formed by a rail of the guide. Thereby, the guiding path may extend along a rail of the guide.

At least a portion of the guide, at least a portion of the rail, at least a portion of the guide track and/or at least a portion of the guiding path may be disposed outside of the specimen chamber and/or in a surrounding atmosphere of the charged particle optical apparatus. Additionally or alternatively, at least a portion of the guide, at least a portion of the rail, at least a portion of the guide track and/or at least a portion of the guiding path may be disposed inside the specimen chamber. At least a portion of the rail, at least a portion of the guide track and/or at least a portion of the guiding path may be oriented transverse, substantially perpendicular to, or perpendicular to a direction of the primary beam path, wherein the direction is measured at a location within the specimen chamber. The guide track may be formed by the rail and/or by the positioning arm. Additionally or alternatively, at least a portion of the rail may be oriented at an angle relative to a plane, which is perpendicular to the direction of the primary beam path, wherein the angle is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees. Additionally or alternatively, at least a portion of the guide track may be oriented at an angle relative to a plane, which is perpendicular to the direction of the primary beam path, wherein the angle, is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees. Additionally or alternatively, at least a portion of the guiding path may be oriented at an angle relative to a plane, which is perpendicular to the direction of the primary beam path, wherein the angle, is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees. The direction of the primary beam path may be measured at a location within the specimen chamber.

The guiding path may have two ends. In other words, the guide may be configured so that the guiding path does not form a loop. The guiding path may be longitudinal, substantially linear, linear and/or curved.

The guide may include two mating guide members. The first guide member may be configured as a rail, may form a guide track and/or may define a guiding path. The second guide member may be configured as a carriage and/or may be configured to be movable along the guiding path and/or the guide track. The carriage may be a slide carriage and/or a roller carriage. The positioning arm may be configured as a guide member, such as a rail of the guide. Thereby, the positioning arm may form a guide track. The guiding path may be defined as a path along which one of the mating guide member travels.

The positioning arm may be rigidly connected to a guide member of the two mating guide members. The guide member to which the positioning arm is rigidly connected may travel along a rail and/or a guiding path of the guide, may be a carriage and/or may be a rail.

The differential pressure module may be abuttingly, rigidly and/or movably attached to the positioning arm. The positioning arm may be configured to position the differential pressure module between the non-operating position and the operating position. In the non-operating position, the differential pressure module may be disposed spaced apart from a segment of the primary particle beam path, which extends inside the specimen chamber.

The advancing movement may approach the differential pressure module toward a segment of the primary particle beam path, which extends inside the specimen chamber. In other words, the advancing movement may be directed toward the segment of the primary beam path. During the positioning and/or during the advancing movement, the differential pressure module may be brought into abutment with an abutment portion. In the operating position, the differential pressure module may be abutted against the abutment portion. The abutment portion may be a portion of the objective lens and/or may be rigidly connected to the objective lens, such as a housing, which at least partially accommodates the objective lens. Additionally or alternatively, during the advancing movement, the differential pressure module may be brought into intersection with the primary particle beam path within the specimen chamber. A final position of the advancement movement may be the operating position of the differential pressure module. Additionally or alternatively, in the final position of the advancing movement, the differential pressure module may touch the abutment portion. The advancing movement may bring the differential pressure module into sealing engagement with the abutment portion.

According to an embodiment, a direction of the advancing movement of the differential pressure module and/or a direction of the track-guided movement of the positioning arm is oriented transverse to, substantially perpendicular to, or perpendicular to a direction of the particle beam path measured at a location within the specimen chamber. Additionally or alternatively, the direction of the advancing movement of the differential pressure module may be oriented at an angle relative to a plane, which is perpendicular to the direction of the primary beam path, wherein the angle is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees. Additionally or alternatively, the direction of the track-guided movement of the positioning arm may be oriented at an angle relative to a plane, which is perpendicular to the direction of the primary beam path, wherein the angle is smaller than 80 degrees, or smaller than 70 degrees, or smaller than 60 degrees, or smaller than 50 degrees, or smaller than 40 degrees, or smaller than 30 degrees, or smaller than 20 degrees, or smaller than 10 degrees, or smaller than 5 degrees.

According to an embodiment, the advancing movement of the differential pressure module and/or the track-guided movement of the positioning arm is a substantially translational, a translational, or a combined translational and rotational movement.

According to an embodiment, the positioning of the differential pressure module includes performing, after completion of the advancing movement, a pressing movement of the differential pressure module for pressing the differential pressure module against the abutment portion. The pressing movement may be directed toward the abutment portion. A pressing force for pressing the differential pressure module against the abutment portion may be transmitted by the positioning arm. The pressing movement may compress a resilient sealing element of the differential pressure module. The pressing movement may bring the differential pressure module into sealing engagement with the abutment portion.

The pressing movement of the differential pressure module may be performed substantially in a direction parallel to a direction of the primary particle beam path measured at a location within the specimen chamber. The pressing movement may be transmitted to the differential pressure module by a rotational movement, a pivoting movement, a substantially translational movement and/or a translational movement of the positioning arm. The final position of the pressing movement may be the operating position. The starting position of the pressing movement may be the final position of the advancing movement. In the starting position of the pressing movement, the differential pressure module may touch the abutment portion.

According to an embodiment, the differential pressure module comprises a module-mounted detector for detecting particles and/or radiation.

The module-mounted detector may be rigidly and/or abuttingly attached to the remaining portion of the differential pressure module. The module-mounted detector may be advanced toward the primary particle beam path by the advancing movement. In the operating position of the differential pressure module, one or more particle and/or radiation receiving surfaces of the module-mounted particle detector may be disposed in the interior of the specimen chamber. In the operating position of the differential pressure module, one or more of the particle and/or radiation receiving surfaces of the module-mounted particle detector may be arranged circumferentially around the primary particle beam path.

The module-mounted detector may be configured to detect emitted particles, which are emitted from the object. The emitted particles may be primary particles and/or object particles. The module-mounted detector may be configured to selectively detect primary particles and/or object particles. Primary particles may be defined as particles of the primary particle beam, which are backscattered by the object, such as backscattered electrons. Object particles may be defined as particles of the object, which are released from the object when impacted by the primary particle beam. By way of example, the object particles are secondary ions and/or secondary electrons. The module-mounted detector may include one or a combination of a semiconductor detector, a scintillator detector, a gaseous detector, a four quadrant (4Q) detector and a metal electrode detector for measuring the particle current impinging on the metal electrode. Additionally or alternatively, the module-mounted detector may be configured to detect radiation, such as cathodoluminescence radiation emitted from the interaction region.

According to an embodiment, at least a portion of the differential pressure aperture is formed by a component of the module-mounted detector, which contributes to a generation of a detector signal in response to receiving particles and/or radiation. The particles and/or radiation may be received on a particle and/or radiation receiving surface of the module-mounted detector. By way of example, the component is a portion of a semiconductor substrate of a semiconductor particle detector or a portion of a scintillator of a scintillator detector.

According to a further embodiment, during the positioning of the differential pressure module and/or during the advancing movement of the differential pressure module, at least a portion of the positioning arm passes through at least a portion of an opening extending through a wall portion of the specimen chamber. Additionally or alternatively, during the positioning of the differential pressure module and/or during the advancing movement, a portion of a driving member of the particle optical apparatus, which is drivingly coupled to the positioning arm, may pass through at least the portion of the opening.

The driving member may be rigidly and/or movably connected to the positioning arm. The advancing movement of the differential pressure module may be transmitted by a movement of the driving member. The movement of the driving member may be track-guided. During at least a portion of the positioning of the differential pressure module, the positioning arm and/or the driving member may extend through the vacuum enclosure. A surface normal of the wall portion may be oriented parallel or substantially parallel to a longitudinal axis of the driving member and/or a longitudinal axis of the positioning arm.

According to an embodiment, a degree of freedom of the positioning arm for performing at least a portion of the positioning of the differential pressure module or at least a portion of the pressing movement is provided by a guide clearance of the guide for guiding the track-guided movement of the positioning arm. The guide clearance may be a clearance between mating guide members of the guide and/or may be a transversal clearance relative to a track of the guide. In other words, a degree of freedom provided by the clearance may be oriented perpendicular to a direction of the track of the guide.

According to a further embodiment, in the operating position, a conductive portion of the differential pressure module is electrically isolated from the abutment portion. The charged particle optical apparatus may include a voltage source, which is configured to place the conductive portion at a pre-defined potential. The pre-defined potential may be different from a potential of the abutment portion.

According to a further embodiment, the charged-particle optical apparatus is configured to pivot the positioning arm about a pivoting axis. The pivoting axis may be arranged outside and/or inside of the specimen chamber.

According to an embodiment, the differential pressure module comprises a seal member for bringing the differential pressure module into sealing engagement during the positioning of the differential pressure module.

The seal member may comprise a deformable and/or resilient sealing element. Additionally or alternatively, the seal member may comprise a seating surface. The seating surface may mate with a mating seating surface provided at the abutment portion. The seating surface and/or the mating seating surface may be rigid. During the positioning of the differential pressure module, the seating member may be brought into attachment with a sealing member, which may be provided at the abutment portion. The positioning of the differential pressure module, the advancing movement and/or the pressing movement of the differential pressure module may bring the differential pressure module into sealing engagement with the abutment portion. The sealing element may be in the form of a single loop, such as a ring. In the operating position, the loop may surround the primary particle beam path. By way of example, the resilient sealing element is an O-ring. The O-ring may be made of Viton.

According to an embodiment, the differential pressure module comprises an intermediate vacuum zone, wherein in the operating position, the primary particle beam path passes through the intermediate vacuum zone.

The intermediate vacuum zone may comprise a vacuum port for evacuating the intermediate vacuum zone. At least when the differential pressure module is in the operating position, the vacuum port may be in fluid communication with a vacuum source. The vacuum source may be a vacuum pump. The vacuum port may be connected to the vacuum source via a vacuum line. The vacuum port may be arranged outside of the primary particle beam path. In other words, the primary particle beam path does not pass through the vacuum port. The vacuum line may be formed by the positioning arm and/or may be rigidly and/or movably attached to the positioning arm. The vacuum line may extend through an interior of the specimen chamber. The vacuum line may extend along at least a portion of the positioning arm. The vacuum line may be moved in conjunction with the track-guided movement of the positioning arm.

It is also conceivable that the vacuum line is rigidly connected to the particle optical arrangement. In such an embodiment, the vacuum zone of the differential pressure module may be brought into fluid communication with the vacuum line by the positioning of the differential pressure module into the operating position.

Through the differential pressure aperture, the primary particle beam path may exit from the intermediate vacuum zone and enter into the interior of the specimen chamber. The differential pressure module may comprise a further differential pressure aperture through which the primary particle beam path may enter into the intermediate vacuum zone.

According to a further embodiment, the differential pressure module comprises two intermediate vacuum zones. In the activation position of the differential pressure module, the primary particle beam path may pass sequentially through the two intermediate vacuum zones.

The two intermediate vacuum zones may be separated from each other by a separating differential pressure aperture. When the differential pressure module is in the operating position, the primary particle beam path may pass through the separating differential pressure aperture.

According to an embodiment, each of the two intermediate vacuum zones comprises a vacuum port for evacuating the respective vacuum zone. Each of the vacuum ports may be in fluid communication with a separate or common vacuum source. The charged particle optical apparatus may comprise a branched vacuum line having two branch lines. For each of the branch lines, an end of the respective branch line may open into a separate one of the two vacuum ports.

According to a further embodiment, in the operating position, the differential pressure aperture is located between a final magnetic lens of the particle optical arrangement and an object plane of the particle optical arrangement and/or between a principal plane of the final magnetic lens and the object plane. The term "between a final magnetic lens and the object plane" may be defined as being located between all pole pieces of the final magnetic lens on the one hand and the object plane on the other hand. The object plane may be located inside the specimen chamber. The particle optical arrangement may be configured to focus the primary particle beam on the object plane. The final magnetic lens may be defined as the last magnetic lens passed by the primary beam path. The final magnetic lens may be part of a combined magnetic-electrostatic lens. One or more electrostatic lenses may be disposed between the final magnetic lens and the object plane. The final magnetic lens may form at least a part of an objective lens of the particle optical arrangement.

According to a further embodiment, in the operating position, the differential pressure aperture is located between a final electrostatic lens of the particle optical arrangement and an object plane of the particle optical arrangement and/or between a principal plane of the final electrostatic lens and the object plane. The term "between a final electrostatic lens and the object plane" may be defined as being located between all electrodes of the final electrostatic lens on the one hand and the object plane on the other hand. The final electrostatic lens may be defined as the last electrostatic lens passed by the primary beam path. The final electrostatic lens may be part of a combined magnetic-electrostatic lens. One or more magnetic lenses may be disposed between the final electrostatic lens and the object plane.

According to a further embodiment, in the operating position, the differential pressure aperture is located between a final particle lens of the particle optical arrangement and an object plane of the particle optical arrangement and/or between a principal plane of the final particle lens and the object plane. The term "between a final particle lens and the object plane" may be defined as being located between all pole pieces and/or electrodes of the final particle lens on the one hand and the object plane on the other hand. The final particle lens may be a magnetic lens, an electrostatic lens and/or a combined magnetic-electrostatic lens.

According to a further embodiment, in the operating position, the differential pressure aperture is located between an objective lens of the particle optical arrangement and an object plane of the particle optical arrangement and/or between a principal plane of the objective lens and the object plane. The term "between the objective lens and the object plane" may be defined as being located between all pole pieces and/or electrodes of the objective lens on the one hand and the object plane on the other hand. The objective lens may be a magnetic lens, an electrostatic lens and/or a combined magnetic-electrostatic lens.

A distance between the object plane and the objective lens and/or a distance between the object plane and the principal plane of the objective lens may be greater than a distance between the object plane and the differential pressure aperture when the differential pressure module is in the operating position.

According to an embodiment, in the operating position, the differential pressure aperture is the only or a final differential pressure aperture through which the primary particle beam path passes. Through the differential pressure aperture, the primary particle beam path may enter into the interior of the specimen chamber.

According to a further embodiment, the differential pressure module comprises a guiding and/or supporting structure. The guiding and/or supporting structure may be configured to be engageable with a mating structure of the particle optical apparatus during the positioning of the differential pressure module. In other words, the positioning of the differential pressure module may bring the guiding and/or supporting structure into engagement with the mating structure.

The mating structure may be rigidly attached to the objective lens and/or attached to a component, which is rigidly connected to the objective lens. By way of example, the component is a housing, which at least partially accommodates the objective lens.

According to a further embodiment, the differential pressure module is selectively detachably coupled to the positioning arm. The particle optical apparatus may comprise a coupling system for coupling the differential pressure module to the positioning arm in a selectively detachable manner. The coupling system may be configured such that in the pressure-controlled interior of the specimen chamber (i.e. without venting the specimen chamber), the differential pressure module is selectively detachable and/or attachable to the positioning arm.

By way of example, the coupling system may comprise a coupling actuator, which is in signal communication with a controller of the particle optical apparatus. The controller may be configured to command the coupling actuator to selectively attach and/or detach the differential pressure module from the positioning arm.

According to an embodiment, the charged-particle optical apparatus further comprises a through-the-lens detector for detecting particles and/or radiation.

A through-the-lens detector may be defined herein as a detector, which is configured to detect emitted particles and/or radiation, which are emitted from the object, after the emitted particles and/or radiation have passed through a principal plane of a particle lens of the particle optical arrangement. The emitted particles may be object particles and/or primary particles. Additionally or alternatively, the through-the lens detector may be configured to detect radiation, such as cathodoluminescence radiation. The lens may be at least a portion of the objective lens. The through-the-lens particle detector may be configured to selectively detect primary particles and/or object particles.

According to a further embodiment, the charged-particle optical apparatus further comprises an aperture member. At least a portion of the aperture member may be conductive. At least a portion of the aperture member may be in the shape of a tapered tube. The tapered tube may taper towards the object. At least a portion of an inner peripheral surface and/or at least a portion of an outer peripheral surface of the aperture member may taper towards the object and/or may have a frustoconical shape. An object-side end portion of the aperture member may form at least a portion of the differential pressure aperture.

The differential pressure module may comprise a plurality of aperture members. For each of the aperture members, the respective aperture member may be in the shape of a tapered tube. Each of the aperture members may taper toward the object. The plurality of aperture members may form a plurality of vacuum zones.

According to a further embodiment, the particle optical apparatus comprises an objective lens. The advancing movement of the differential pressure module may represent a first path of the differential pressure module. At least a portion of the first path may be convex toward the objective lens. A starting point of the first path may be the non-operating position of the differential pressure module. The non-operating position may be defined as a position in which the differential pressure module is located at a distance from the primary particle beam path.

The differential pressure module may be brought into intersection with the primary particle beam path within the specimen chamber when following the first path.

According to a further embodiment, the first path is within a plane or is substantially within a plane. The plane may be oriented substantially parallel or oriented parallel to a direction of the primary particle beam path, wherein the direction of the primary beam path is measured at a location within the specimen chamber. Alternatively, the plane and the direction of the primary particle beam path may form an angle of less than 60 degrees, or less than 40 degrees, or less than 20 degrees, or less than 10 degrees, or less than 5 degrees.

According to a further embodiment, the first path is substantially linear over a length or linear over a length. The length over which the first path is linear or substantially linear may be at least 30 millimeters or at least 50 millimeters or at least 100 millimeters or at least 200 millimeters or at least 300 millimeters or at least 400 millimeters. The length over which the first path is substantially linear or linear may be less than 2000 millimeters or less than 1000 millimeters.

According to a further embodiment, the selective positioning of the differential pressure module includes performing a movement of the differential pressure module along a second path after completion of the first path. The second path may be a substantially linear path. The second path may be transverse or oblique or substantially perpendicular or perpendicular to the first path. An end point of the second path may be the operating position. At least a portion of the second path may be concave toward the positioning arm.

According to a further embodiment, the second path is substantially linear or linear over a length. The length over which the second path is substantially linear or linear may be least 1 millimeter or at least 3 millimeters or at least 5 millimeters or at least 10 millimeters or at least 20 millimeters. The length over which the second path is substantially linear or linear may be less than 200 millimeters or less than 100 millimeters.

According to a further embodiment, the length $L_1$ over which the first path is linear or substantially linear divided by the length $L_2$ over which the second path is linear or substantially linear (i.e. $L_1/L_2$) is greater than 5, or greater than 10, or greater than 30, or greater than 50, or greater than 100.

According to a further embodiment, the particle optical apparatus comprises a guide for guiding the track-guided movement of the positioning arm. The guide may include two mating guide members. The positioning arm may be movably connected to the guide to allow variation of an orientation of the positioning arm relative to each of the two mating guide members. The orientation of the positioning arm may be variable in a plane, which is substantially parallel or parallel to a direction of the primary particle beam path, wherein the direction of the primary particle beam path is measured at a location within the specimen chamber. The plane in which the orientation is variable may be parallel or substantially parallel to a plane in which the first path and/or the second path of the differential pressure module is located.

The first guide member may be configured as a rail, may form a guide track and/or may define a guiding path of the guide. The second guide member may be configured as a carriage and/or may be configured to be movable along the guiding path and/or the guide track. The positioning arm may be connected to at least one of the guide members of the guide at least in part via a resilient coupling and/or at least in part via an actuator. By way of example, the resilient coupling includes a spring.

According to a further embodiment, a degree of freedom of the positioning arm for performing at least a portion of the positioning of the differential pressure module is provided by the movable connection which movably connects the positioning arm to the guide to allow variation of the orientation of the positioning arm relative to each of the two mating guide members.

A portion of the present disclosure relates to the following embodiments:

Item 1: A charged particle optical apparatus, comprising: a particle optical arrangement, configured to define a primary particle beam path for inspecting an object; a specimen chamber configured to accommodate an object in a pressure-controlled interior of the specimen chamber during the inspection of the object; a differential pressure module having a differential pressure aperture; and a positioning arm being at least partially arranged in the specimen chamber and configured to selectively position the differential pressure module within the pressure-controlled interior of the specimen chamber into an operating position in which the primary particle beam path passes through the differential pressure aperture; wherein the selective positioning comprises an advancing movement of the differential pressure module directed toward the primary particle beam path, which is transmitted to the differential pressure module by a track-guided movement of the positioning arm.

Item 2: The charged particle optical apparatus of item 1, wherein a direction of the track-guided movement of the positioning arm and/or a direction of the advancing movement of the differential pressure module is oriented transverse or substantially perpendicular to a direction of the particle beam path measured at a location within the specimen chamber.

Item 3: The charged particle optical apparatus of item 1 or 2, wherein the advancing movement of the differential pressure module and/or the track-guided movement of the positioning arm is a substantially translational or a combined translational and rotational movement.

Item 4: The charged particle optical apparatus of any one of the preceding items, further comprising a guide for guiding the track-guided movement of the positioning arm; wherein a guiding path of the guide extends transverse or substantially perpendicular to a direction of the particle beam path, wherein the direction of the particle beam path is measured at a location within the specimen chamber; and/or wherein at least a portion of the guide is located outside the specimen chamber and/or in the surrounding atmosphere of the charged particle optical apparatus.

Item 5: A charged particle optical apparatus, comprising: a particle optical arrangement, configured to define a particle beam path for inspecting an object; a specimen chamber configured to accommodate an object in a pressure-controlled interior of the specimen chamber during the inspection of the object; a differential pressure module having a differential pressure aperture; a positioning arm being at least partially arranged in the specimen chamber and configured to selectively position the differential pressure module within the pressure-controlled interior of the specimen chamber into an operating position in which the particle beam path passes through the differential pressure aperture; wherein the selective positioning comprises an advancing movement of the differential pressure module directed toward the primary particle beam path.

Item 6: The charged particle optical apparatus of any one of the preceding items, wherein the advancing movement of the differential pressure module is a substantially translational or a combined translational and rotational movement; and/or wherein a direction of the advancing movement of the differential pressure module is oriented transverse or substantially perpendicular to a direction of the particle beam path measured at a location within the specimen chamber.

Item 7: The charged particle optical apparatus of any one of the preceding items, wherein the differential pressure module comprises a module-mounted detector for detecting particles and/or radiation; and/or wherein the charged-particle optical apparatus comprises a through-the-lens detector for detecting particles and/or radiation.

Item 8: The charged particle optical apparatus of item 7, wherein at least a portion of the differential pressure aperture is formed by a component of the module-mounted particle detector, which contributes to a generation of a detector signal in response to receiving particles and/or radiation.

Item 9: The charged particle optical apparatus of any one of the preceding items, wherein during the advancing movement of the differential pressure module, at least a portion of the positioning arm passes through at least a portion of an opening, which extends through a wall portion of the specimen chamber; and/or at least portion of a driving member of the particle optical apparatus, which is drivingly coupled to the positioning arm, passes through at least the portion of the opening.

Item 10: The charged-particle optical apparatus of any one of the preceding items, wherein the positioning of the differential pressure module comprises bringing the differential pressure module into abutment with an abutment portion of the charged particle optical apparatus; wherein in the operating position a conductive portion of the differential pressure module is electrically isolated from the abutment portion.

Item 11: The charged particle optical apparatus of any one of the preceding items, wherein the differential pressure module comprises a seal member for bringing the differential pressure module into sealing engagement during the positioning of the differential pressure module.

Item 12: The charged particle optical apparatus of any one of the preceding items, wherein the differential pressure module comprises an intermediate vacuum zone, wherein in the operating position of the differential pressure module, the particle beam path passes through the intermediate vacuum zone.

Item 13: The charged particle optical apparatus of item 12, wherein the intermediate vacuum zone comprises a vacuum port for evacuating the intermediate vacuum zone.

Item 14: The charged particle optical apparatus of any one of the preceding items, wherein the differential pressure module comprises two intermediate vacuum zones, wherein in the operating position of the differential pressure module, the particle beam path passes sequentially through the two intermediate vacuum zones; wherein each of the two intermediate vacuum zones comprises a vacuum port for evacuating the respective vacuum zone; wherein the charged particle optical apparatus comprises a branched vacuum line having two branch lines; wherein in the operating position, each of the two branch lines is connected in fluid communication with one of the two vacuum ports.

Item 15: The charged particle optical apparatus of any one of the preceding items, wherein during the advancing movement, the differential pressure module is brought into intersection with the primary particle beam path.

Item 16: The charged particle optical apparatus of any one of the preceding items, wherein in the operating position, the differential pressure aperture is located between a final magnetic lens of the particle optical arrangement and an object plane of the particle optical arrangement.

Item 17: The charged particle optical apparatus of any one of the preceding items, wherein in the operating position, the differential pressure aperture is located between a final electrostatic lens of the particle optical arrangement and an object plane of the particle optical arrangement.

Item 18: The charged particle optical apparatus of any one of the preceding items, wherein in the operating position, the differential pressure aperture is the only or a final differential pressure aperture through which the primary particle beam path passes.

Item 19: The charged particle optical apparatus of any one of the preceding items, wherein the differential pressure module comprises a guiding and/or supporting structure, which is configured to be engageable with a mating structure of the charged particle optical apparatus; wherein the positioning of the differential pressure module brings the guiding and/or supporting structure into engagement with the mating structure.

Item 20: The charged particle optical apparatus of any one of the preceding items, wherein a degree of freedom of the positioning arm for performing at least a portion of the positioning of the differential pressure module is provided by a guide clearance of a guide for guiding a track-guided movement of the positioning arm.

Item 21: The charged particle optical apparatus of any one of the preceding items, further comprising an objective lens; wherein the advancing movement of the differential pressure module represents a first path of the differential pressure module, wherein at least a portion of the first path is convex toward the objective lens.

Item 22: The charged particle optical apparatus of any one of the preceding items, wherein the advancing movement of the differential pressure module represents a first path of the differential pressure module, wherein the first path is within a plane, which is oriented substantially parallel to a direction of the primary particle beam path, wherein the direction of the primary beam path is measured at a location within the specimen chamber.

Item 23: The charged particle optical apparatus of any one of the preceding items, wherein the advancing movement of the differential pressure module represents a first path of the differential pressure module, which is substantially linear over a length of at least 30 millimeters, at least 50 millimeters or at least 100 millimeters.

Item 24: The charged particle optical apparatus of any one of items 21 to 23, wherein the positioning of the differential pressure module includes performing a movement of the differential pressure module along a second path after completion of the first path.

Item 25: The charged particle optical apparatus of item 24, wherein the second path is transverse or substantially perpendicular to the first path.

Item 26: The charged particle optical apparatus of item 24 or 25, wherein the second path is concave toward the positioning arm.

Item 27: The charged particle optical apparatus of any one of items 24 to 26, wherein the second path is a substantially linear path, wherein an end point of the second path is the operating position.

Item 28: The charged particle optical apparatus of any one of the preceding items, further comprising a guide for guiding the track-guided movement of the positioning arm, which comprises two mating guide members; wherein the positioning arm is connected by a movable connection to the guide so that an orientation of the positioning arm relative to each of the guide members is variable.

Item 29: The charged particle optical apparatus of item 28, wherein a degree of freedom of the positioning arm for performing at least a portion of the positioning of the differential pressure module is provided by the movable connection.

BRIEF DESCRIPTION OF THE DRAWINGS

The foregoing disclosure as well as other advantageous features will be more apparent from the following detailed description of exemplary embodiments with reference to the accompanying drawings. It is noted that not all possible embodiments necessarily exhibit each and every, or any, of the advantages identified herein.

FIGS. 8A to 8D schematically illustrates an exemplary method of acquiring and combining images using the particle optical apparatus of the second and third exemplary embodiment;

FIGS. 12A and 12B schematically illustrate a particle optical apparatus according to a sixth exemplary embodiment;

FIG. 13 schematically illustrates a particle optical apparatus according to a seventh exemplary embodiment.

DETAILED DESCRIPTION OF EXEMPLARY EMBODIMENTS

Figure 1:
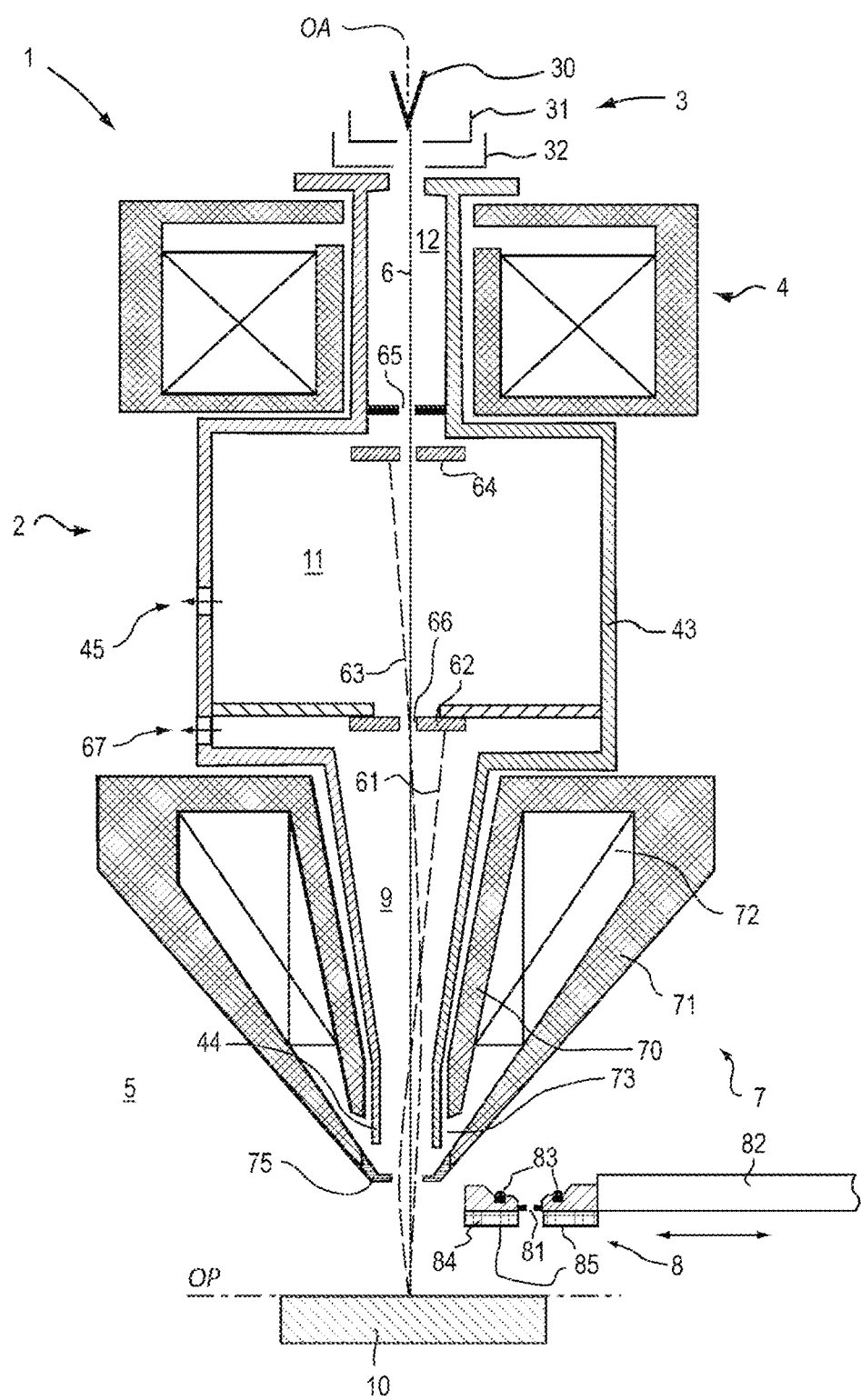
FIG. 1 schematically illustrates a particle optical apparatus according to a first exemplary embodiment.

FIG. 1 shows a particle optical apparatus 1 according to a first exemplary embodiment. The particle optical apparatus 1 is configured as a scanning electron microscope. The particle optical apparatus 1 includes a particle optical arrangement 2. The particle optical arrangement 2 includes a particle gun 3, a condenser lens 4, a beam booster 43, and an objective lens 7. The particle gun 3 includes a cathode 30, a suppressor electrode 31 and an extraction electrode 32. The cathode 30 may for example be configured as a Schottky field emitter. The particle optical arrangement 2 is configured to define a primary particle beam path 6. The primary particle beam path 6 extends between the cathode 30 and a surface of an object 10 to be inspected. The object 10 is disposed within a pressure-controlled interior 5 of a specimen chamber (not illustrated in FIG. 1).

The primary particle beam path 6 passes through the condenser lens 4 and the objective lens 7. The particle optical arrangement 2 is configured such that the primary particle beam is focused on an object plane OP of the particle optical arrangement 2, where the surface of the object 10 is arranged.

The beam booster 43 is configured to surround at least a portion of the primary particle beam within the particle optical arrangement. Thereby, the particles of the primary particle beam 6 are guided through at least a portion of the particle optical arrangement 2 with a high kinetic energy such as a kinetic energy of 10 keV. Thereby, it is possible to keep spherical and chromatic aberrations of the primary particle beam low and to reduce the influence of unwanted interference fields.

The objective lens 7 includes a source side pole piece 70, an object-side pole piece 71 and an excitation coil 72 for generating a magnetic field in a pole piece gap 73 between the source side pole piece 70 and the object-side pole piece 71. The objective lens 7 further includes a first electrode 44, which is formed by an object-side end section of the beam booster 43 and a second electrode 75, which is attached to an object-side end portion of the object-side pole piece 71. Thereby, the objective lens 7 is a combined magnetic-electrostatic objective lens. The second electrode 75 may be electrically isolated from the object-side pole piece 71 such that the second electrode 75 can be placed at a potential, which is different from a potential of the object-side pole piece 71.

As a result of the impact of the primary electron beam onto the surface of the object 10, secondary electrons and backscattered electrons are generated. A portion of the generated secondary electrons 61 enter the objective lens 7 and are guided by the magnetic and electric fields of the objective lens 7 to a through-the-lens secondary electron detector 62. The through-the-lens secondary electron detector 62 includes an aperture 66, acting as a differential pressure aperture. Also a portion of the generated backscattered electrons 63 enter the objective lens 7 and are guided by the magnetic and electric fields of the objective lens 7 to a through-the-lens backscattered electron detector 64.

Figure 2:
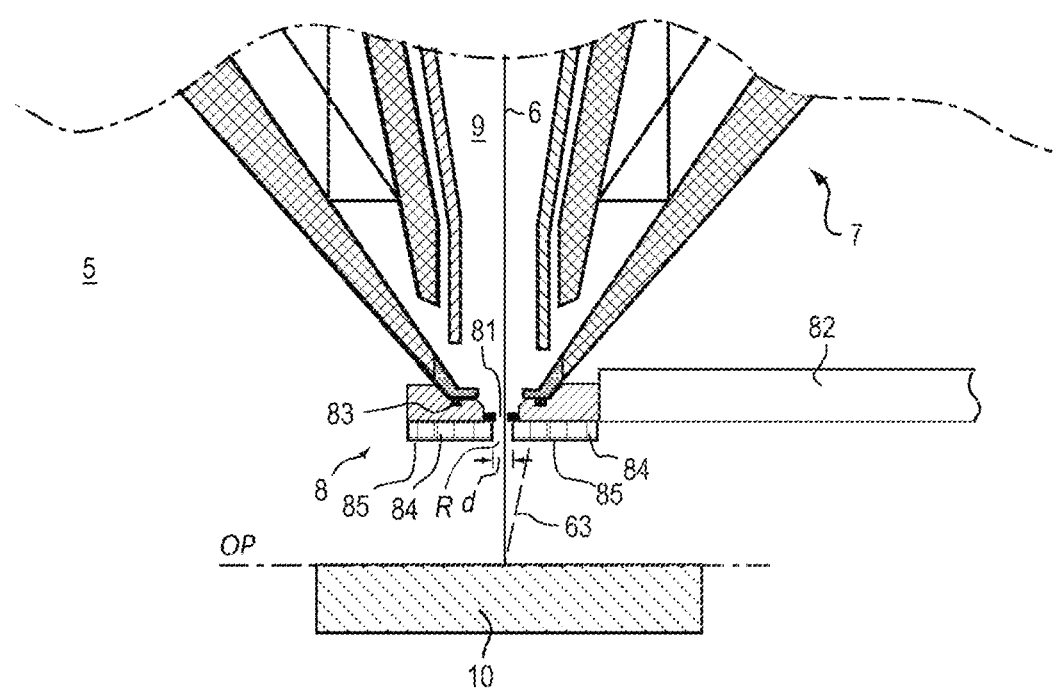
FIG. 2 schematically illustrates the particle optical apparatus according to the first exemplary embodiment, wherein the differential pressure module is in the operation position.

The particle optical apparatus 1 comprises a differential pressure module 8 having a differential pressure aperture 81. The differential pressure module 8 is rigidly attached to a positioning arm 82. For simplicity of illustration, the positioning arm 82 is not shown in cross-section. The positioning arm 82 is configured to selectively position the differential pressure module 8 within the pressure-controlled (i.e. evacuated) interior 5 of the specimen chamber into an operating position, which is illustrated in FIG. 2. In the operating position, the differential pressure aperture 81 is disposed between the objective lens 7 and the object plane OP, such that the primary particle beam path 6 passes through the differential pressure aperture 81.

As can be seen from FIG. 2, in the operating position of the differential pressure module 8, the primary particle beam path 6 enters into the interior 5 of the specimen chamber through the differential pressure aperture 81. In other words, as a result of the positioning of the differential pressure module into the operating position, a vacuum zone 9 is formed between the differential pressure aperture 81 and the differential pressure aperture 66 (illustrated in FIG. 1) provided by the through-the-lens secondary electron detector 62.

As is further illustrated in FIG. 1, the vacuum zone 9 is provided with a vacuum port 67 for evacuating the vacuum zone 9. The differential pressure aperture 66 provided by the through-the-lens secondary electron detector 62, separates the vacuum zone 9 from a further vacuum zone 11 in which the though-the-lens backscattered electron detector 64 is disposed and which is evacuated via vacuum port 45. The vacuum zone 11 is separated from the electron gun vacuum zone 12 by a further differential pressure aperture 65. For simplicity of illustration, the vacuum port of the electron gun vacuum zone 12 is not illustrated in FIG. 1.

The differential pressure module 8 includes a sealing element 83. The sealing element 83 allows sealingly engaging the differential pressure module 8 with the objective lens 7. In the illustrated exemplary embodiment, the sealing element 83 is made of a resilient material. The sealing element 83 is in the form of a single loop.

As is illustrated in FIG. 2, in the operating position of the differential pressure module 8, the sealing element 83 surrounds the primary particle beam path 6. The sealing element 83 may be an O-ring. The O-ring may be made of Viton. The sealing element 83 is pressed against the second electrode 75 (illustrated in FIG. 1) of the objective lens 7. Additionally or alternatively, the sealing element 83 may be pressed against other components of the particle optical arrangement, such as the pole piece of the objective lens 7 and/or a housing, which accommodates at least a portion of the objective lens 7.

The differential pressure module 8 includes a module-mounted particle detector 84. The module-mounted particle detector 84 may be configured to selectively detect secondary electrons and/or backscattered electrons. The module-mounted particle detector 84 may be configured as a semiconductor detector, a scintillator detector, a gaseous detector, a 4Q detector and/or a metal electrode detector for measuring the particle current impinging on the metal electrode.

The module-mounted particle detector 84 includes one or more particle receiving surfaces 85, which are arranged circumferentially around the primary particle beam path 6, thereby forming an inactive central region R through which the primary beam passes.

A width d of the inactive central region R may be greater than the width of the diameter of the differential pressure aperture 81. The width d of the inactive central region R may be less than the width of the differential pressure aperture 81 plus 1 millimeter, or plus 0.5 millimeters, or plus 0.2 millimeters, or plus 0.1 millimeters. Thereby, it is possible to provide a module-mounted particle detector 84 having a high particle collection efficiency. Notably, particles, which can not enter the vacuum zone 9 as a result of the differential pressure module 8 being positioned in the operating position, and thereby also can not be detected by any one of the through-the-lens detectors 62, 64, have a high probability of being detected by the module-mounted detector 84.

Figure 3A:
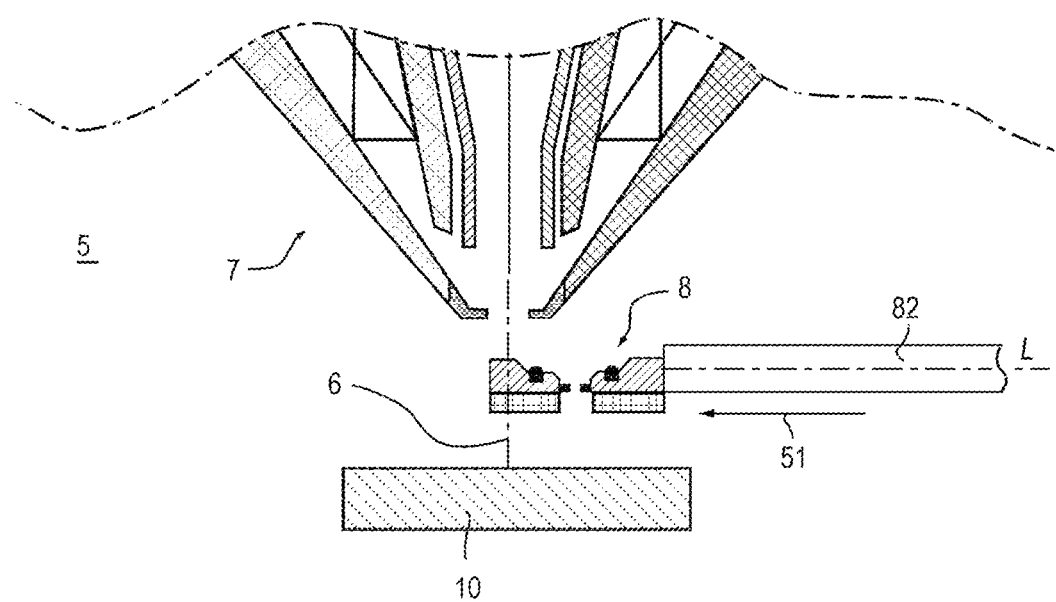
FIGS. 3A and 3B schematically illustrate the positioning of the differential pressure module in the particle optical apparatus according to the first exemplary embodiment.
Figure 3B:
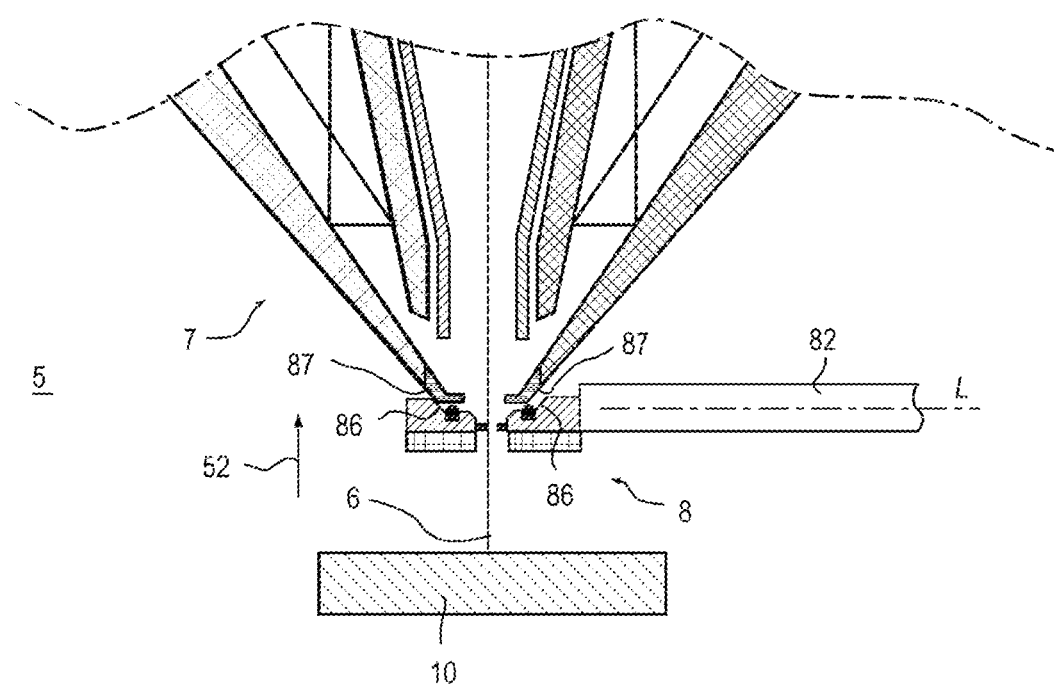

FIGS. 3A and 3B illustrate stages of the positioning process for positioning the differential pressure module 8 into the operating position. FIG. 3A illustrates an advancing movement for advancing the differential pressure module 8 in a direction toward the primary particle beam path 6. The direction of the advancing movement is schematically illustrated by arrow 51. Thereby, the differential pressure module is brought to a position close to the primary particle beam path 6.

The advancing movement is transmitted to the differential pressure module 8 by a track-guided movement of the positioning arm 82. The track-guided movement is performed substantially along a longitudinal axis L of the positioning arm 82. The track-guided movement of the positioning arm 82 is guided by a guide, which defines a curved and/or linear guiding path, such as a curved and/or linear track of a rail. By way of example, the track-guided movement is guided by a linear guide. This will be discussed in more detail below with reference to FIGS. 4, 9 and 10.

Accordingly, a particle optical apparatus is provided, which allows fast switching between two operation modes, which are provided for inspecting objects at different pressure level ranges in the interior 5 of the specimen chamber. By way of example, the first operation mode is configured for pressure levels of 30 Pa or 0.01 Pa or lower in the specimen chamber and the second operation mode is configured for pressure levels higher than 0.01 Pa or 1 Pa in the specimen chamber.

The track-guided movement of the positioning arm 82 allows rapidly advancing the differential pressure aperture 81 from a non-operating position to a position close to the primary particle beam path 6. In the non-operating position, the differential pressure module 8 is located at a distance from primary particle beam path 6. Furthermore, the track-guided movement of the positioning arm 82 requires only a small amount of space in the specimen chamber and therefore does not limit the space for further inspection and/or processing devices, which are disposed inside the specimen chamber, such as detectors or gas supply lines. Moreover, the track-guided movement of the positioning arm allows retracting the positioning arm and the differential pressure module when the differential pressure module 8 is transferred to the non-operating position. Thereby, ample space is left for the inspection and/or processing devices in the high-pressure operation mode.

During the advancing movement, the differential pressure module 8 is brought into intersection with the primary particle beam path 6, along which the primary particles travel when the primary beam is activated. This is schematically illustrated in FIG. 3A.

After completion of the advancing movement, a pressing movement of the differential pressure module 8 (schematically illustrated by arrow 52 in FIG. 3B) is performed for pressing the differential pressure module 8 against the objective lens 7. The pressing movement may be transmitted to the differential pressure module 8 by a substantially linear movement and/or by a rotational movement of the positioning arm 82. A direction of the pressing movement may be oriented substantially parallel to a direction of the primary particle beam path 6 inside the specimen chamber. Additionally or alternatively, it is conceivable that the pressing movement is transmitted to the differential pressure module 8 by a pivoting movement of positioning arm 82. A pivoting axis of the pivoting movement may be oriented substantially perpendicular to the primary particle beam path 6 inside the specimen chamber.

The final position of the pressing movement is the operating position, as shown in FIG. 2. The pressing movement causes the differential pressure module 8 to sealingly engage with the objective lens 7.

As will be described in detail with reference to FIGS. 7A and 7B, it is also conceivable that the pressing movement is omitted and the final position of the advancing movement is the operating position of the differential pressure module 8.

The differential pressure module 8 includes a guiding surface 86 for engagement with a guiding surface 87 of the objective lens 7. Thereby, the guiding surface 86 of the differential pressure module 8 represents a guiding structure, which is configured to be engageable with a mating structure, i.e. the guiding surface 87 of the objective lens 7. As is illustrated in FIG. 3B, the guiding surfaces 86, 87 are configured to guide the differential pressure module 8 into the operating position during the pressing movement. The guiding surface 86 of the differential pressure aperture is in the shape of a frustoconical inner peripheral surface and the guiding surface 87 of the objective lens is in the shape of a frustoconical outer peripheral surface. The guiding surfaces 86, 87 surround the primary particle beam path 6 and are slanted relative to the primary particle beam path 6.

The guiding surfaces 86, 87 allow to rapidly position the differential pressure aperture 81 relative to the particle optical arrangement 2 with high accuracy, even if the positioning arm 82 is flexible, e.g. due to a strongly elongated shape of the positioning arm 82.

Figure 4:
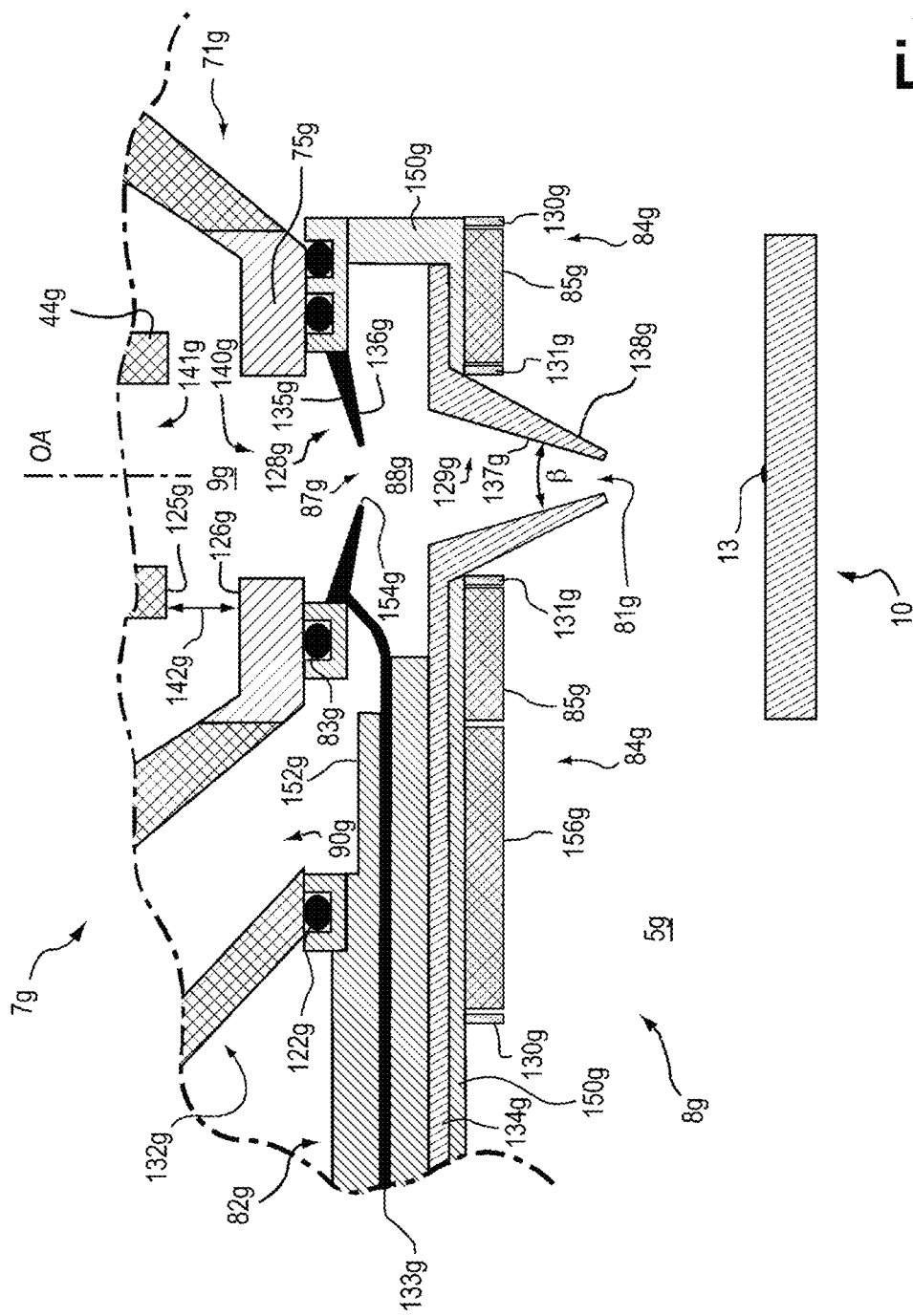
FIG. 4 schematically illustrates a particle optical apparatus according to a second exemplary embodiment.

FIG. 4 is a schematic illustration of a second exemplary embodiment of the particle optical apparatus. Components, which correspond to components of the first exemplary embodiment, shown in FIGS. 1 to 3B, with regard to their composition, their structure and/or function are generally designated with the same reference numerals, which however have a letter "g" to show differentiation.

The differential pressure module 8g of the second exemplary embodiment includes an intermediate vacuum zone 88g. If the differential pressure module 8g is positioned in the operating position, as is shown in FIG. 4, the primary particle beam path passes through the intermediate vacuum zone 88g. The intermediate vacuum zone 88g is separated from a first vacuum zone 9g, in which an object-side end section of the first electrode 44g is disposed by a differential pressure aperture 87g formed in a third electrode 128g. Furthermore, the intermediate vacuum zone 88g is separated from the pressure-controlled interior of the specimen chamber by a differential pressure aperture 81g formed in a fourth electrode 129g. The third electrode 128g and/or the fourth electrode 129g may be configured as collector electrodes for detecting particles which impinge on the respective electrode.

The differential pressure module 8g of the second exemplary embodiment has been shown advantageous in that it facilitates inspection of wet object surfaces and objects which tend to accumulate charges. Inspection of wet surfaces usually requires a vacuum pressure level of 611 Pa in the specimen chamber if the object is maintained at a temperature of 0 degrees Celsius. On the other hand, if the sample surface is not wet, but it is merely desired to prevent charge accumulation effects, it is sufficient to maintain the pressure-controlled interior of the specimen chamber at a vacuum pressure level between 5 Pa and 150 Pa.

As has been discussed with reference to FIG. 1, the first electrode 44g is configured as a liner electrode and is an object-side portion of a beam booster (indicated by reference number 43 in FIG. 1). The first electrode 44g forms a channel through which the primary particles pass. The object-side end portion of the first electrode 44g is surrounded by the source-side magnetic pole piece (indicated by reference number 70 in FIG. 1) and the object-side magnetic pole piece (indicated by reference number 71g in FIG. 4).

The particle optical apparatus includes a second electrode 75g, which is abuttingly attached to the object-side pole piece 71g so that the second electrode 75g remains attached to the object-side pole piece 71g during the positioning of the differential pressure module 8g. However, it is also conceivable that the second electrode 75g is part of the differential pressure module 8g. In such a configuration, the second electrode 75g may be brought into abutment with the particle optical arrangement (in particular with the object-side pole piece 71g) during the positioning of the differential pressure module 8g.

The differential pressure module 8g includes a third electrode 128g, which is configured as a diaphragm forming a differential pressure aperture 87g. The differential pressure aperture 87g separates the intermediate vacuum zone 88g from the first vacuum zone 9g. The third electrode 128g is connected to a voltage supply (not shown in FIG. 4) via a voltage supply line 133g.

The differential pressure module 8g further includes a fourth electrode 129g which is configured as a diaphragm forming a differential pressure aperture 81g. The differential pressure aperture 81g separates the intermediate vacuum zone 88g from the vacuum zone of the pressure-controlled interior 5g of the specimen chamber. The fourth electrode 129g is connected to the voltage supply via a voltage supply line 134g.

The particle optical apparatus of the second exemplary embodiment, includes a through-the-lens secondary electron detector, which is arranged in the same manner as the through-the-lens secondary electron detector of the first embodiment (indicated by reference number 62 in FIG. 1). The through-the-lens secondary electron detector detects secondary electrons, which are emitted from the object 10 and which pass through the differential pressure aperture 81g of the fourth electrode 129g and the differential pressure aperture 87g of the third electrode 128g.

Likewise, the particle optical apparatus of the second exemplary embodiment includes a through-the-lens backscattered electron detector, which is arranged in the same manner as the through-the-lens backscattered electron detector of the first exemplary embodiment (indicated by reference number 64 in FIG. 1). Both through-the-lens detectors are non-gaseous detectors, i.e. they operate without gaseous amplification. Signal amplification in these detectors is performed by a solid impact recording medium, which records impacting electrons. By way of example, the solid impact recording medium may be a scintillator, an electron multiplier or an active semiconductor region of a semiconductor detector. For one or each of the through-the-lens detectors, a particle receiving surface of the respective through-the lens detector may be maintained at a potential of more than 1 kV, more than 5 kV, or more than 10 kV relative to the surrounding environment.

It has been shown that using two differential pressure apertures allows efficient inspection of wet samples by using the through-the-lens secondary electron detectors. Inspection of wet samples is typically conducted at pressure levels greater than 600 Pa. Using only one differential pressure aperture disposed in the beam path of the emitted electrons between the object 10 and the through-the-lens secondary electron detector 62 would require a comparatively small diameter of the differential pressure aperture. This, in turn, would significantly reduce the maximum field of view, i.e. the maximum possible extent for the scanning region which can be scanned by the primary particle beam. Furthermore, due to the small diameter of the differential pressure aperture, the portion of the emitted electrons, which reach the through-the-lens secondary electron detector, would be significantly reduced. This would result in a lower signal to noise ratio.

The benefit described above is also achieved for system configurations configured for imaging non-conductive specimens using a through-the-lens secondary electron detector and at pressure levels in the specimen chamber of between 20 Pa and 200 Pa.

The intermediate vacuum zone 88g has a vacuum port 90g for evacuating the intermediate vacuum zone 88g. In the operating position, which is shown in FIG. 4, the vacuum port 90g is in fluid communication with a vacuum source (not shown in FIG. 4) via a vacuum line 132g. The vacuum line 132g is rigidly connected to the object-side magnetic pole piece 71g. In the second exemplary embodiment, a portion of the vacuum line 132g is provided by the object-side pole piece 71g. However, it is also conceivable that the vacuum line 132g is a separate tube which is rigidly connected to the object-side magnetic pole piece 71g. The intermediate vacuum zone 88g is brought into fluid communication with the vacuum line 132g during the positioning of the differential pressure module 8g.

The fourth electrode has an outer peripheral surface 138g and an inner peripheral surface 137g, each tapering towards the object. An object-side end portion of the fourth electrode 129g forms the differential pressure aperture 81g. Through the tapered form of the fourth electrode 129g, a comparatively large collection solid angle region Q is provided for particle and/or radiation detectors, which are configured to detect particles and/or radiation, which are emitted from the interaction region 13 where the primary particle beam interacts with the object 10. Examples for such particle and/or radiation detectors are EDX (energy dispersive X-ray) detectors, WDS (wavelength dispersive spectroscopy) detectors, gaseous detectors, backscattered electron detectors and cathodoluminescence detectors. The gaseous detector may be configured as a collector electrode detector and/or as a gas scintillation detector.

The tapered form of the fourth electrode 129g further allows placing the differential pressure aperture 81g comparatively close to the object plane OP of the particle optical arrangement. Thereby, the segment of the primary particle beam path, which traverses the vacuum zone of the interior 5g of the specimen chamber is comparatively short. This allows efficient use of electron beams with low kinetic energies (even with energies as low as 1 keV), which have a comparatively short mean free path in the interior 5g of the specimen chamber, if the interior 5g of the specimen chamber is maintained at an elevated pressure level.

Further, in the second exemplary embodiment, which is shown in FIG. 4, the third electrode 128g is in the shape of a tapered tube which tapers toward the object. However, it is also conceivable that the third electrode 128 is plane, substantially plane or tapers away from the object. The third electrode 128g, which is shown in FIG. 4 has an outer peripheral surface 136g and an inner peripheral surface 135g, each tapering towards the object. An object-side end portion of the third electrode 128g forms the differential pressure aperture 87g.

The differential pressure module 8g includes a sealing arrangement for bringing the differential pressure module into sealing engagement during the positioning of the differential pressure module 8g. The sealing arrangement is configured to seal the first vacuum zone 9g and the intermediate vacuum zone 88g against the pressure-controlled interior of the specimen chamber. The sealing arrangement includes a first seal member 122g and a second seal member 83g. Each of the first seal member 122g and the second seal member 83g is configured as an O-Ring. The first seal member 122g surrounds the primary particle beam path and a gas flow path extending from an interior of the intermediate vacuum zone 88g through the vacuum port 90g to the interior of the vacuum line 132g. The second seal member 83g surrounds the primary particle beam path without surrounding the gas flow path.

The differential pressure module 8g further includes a module-mounted particle detector 84g, which is configured as a semiconductor detector, such as a 4Q detector. However, it is also conceivable that the module-mounted particle detector 84g is configured as a scintillator detector, a gaseous detector and/or a metal electrode detector for measuring the particle current impinging on the metal electrode.

The module-mounted detector 84g has one or more particle receiving surfaces 85g which face the object and which are arranged circumferentially around the primary particle beam path. By way of example, the particle receiving surfaces 85g are four quadrants representing particle receiving surfaces of a 4Q detector. The module-mounted detector 84g further includes a further particle receiving surface 156g, which is disposed at a greater axial distance from the optical axis OA than the particle receiving surfaces 85g. Through the further particle receiving surface 156g, a higher collection efficiency is obtained for the module-mounted detector 84g. Furthermore, the particle receiving surface 156g electrostatically shields the object 10 from the positioning arm 82g.

The module-mounted detector 84g may be configured as a backscattered electron detector. The differential pressure module 8g further comprises shielding electrodes 130g, 131g, which are configured as an electrical shield to protect the module-mounted detector 84g from electrostatic arcing which may occur between the module-mounted detector 84g and remaining portions of the differential pressure module 8g, such as the fourth electrode 129g, and the housing 150g. The shielding electrodes 130g, 131g may be electrically isolated from the module-mounted detector 84g. The voltage supply lines of the shielding electrodes 130g, 131g may be implemented on a circuit board of the module-mounted detector 84g. In a preferred embodiment, the module-mounted detector 84g and/or the shielding electrodes 130g, 131g are placed at ground potential or substantially at ground potential. This allows a simple electronic and/or mechanical design. However, in applications in which it is desirable to increase the collection solid angle of the module-mounted detector 84g and/or in which the potential difference between the fourth electrode 129g and the module-mounted detector 84g is smaller than the critical value for arcing under elevated pressure (e.g. 350V), it has been shown that it is advantageous to omit the shielding electrodes 130g, 131g.

It has been shown that omitting the module-mounted detector 84g, allows a configuration of the fourth electrode 129g so that the inner peripheral surface 137g of the fourth electrode 129g has a large tapering angle (3. Thereby, the distance between the objective lens and the object 10 can be reduced. This, in turn, allows imaging at a short working distance in order to obtain a higher resolution.

In order to detect secondary electrons using the through-the-lens secondary electron detector, it is advantageous to maintain the fourth electrode 129g at a positive potential relative to the object 10. In a configuration, which includes the module-mounted detector 84g, the relative potential between the fourth electrode 129g and the object 10 may be adjusted by adjusting the potential of the object 10 relative to ground. Thereby, the fourth electrode and the module-mounted detector can be maintained at ground potential. Alternatively, the relative potential between the fourth electrode 129g and the objet 10 may be adjusted by adjusting the potential of the fourth electrode 129g relative to ground. This facilitates measurement of the specimen current.

The potential difference between the object 10 and the fourth electrode 129g is used to guide secondary electrons, which emanate from the interaction region 13, where the primary particle beam interacts with the object 10, through the differential pressure aperture 81g of the fourth electrode 129g.

Furthermore, it is possible to adjust the potential difference between the object 10 and the fourth electrode 129g so that a gas cascade is generated between the object 10 and the fourth electrode 129g. This gas cascade can provide the gas amplification for a gaseous detector. The collector electrodes of the gaseous detector may be mounted in the vicinity of the fourth electrode 129g. Additionally or alternatively, the fourth electrode 129g may be configured as a collector electrode. The through-the-lens secondary electron detector may detect secondary electrons generated in the gas cascade, and secondary electrons emanating from the interaction region 13.

The differential pressure module 8g is configured so that the third electrode 128g, the fourth electrode 129g, the semiconductor detector 84g, and the second electrode 75g are electrically isolated from each other. The housing 150g may be conductive or non-conductive.

Figure 5A:
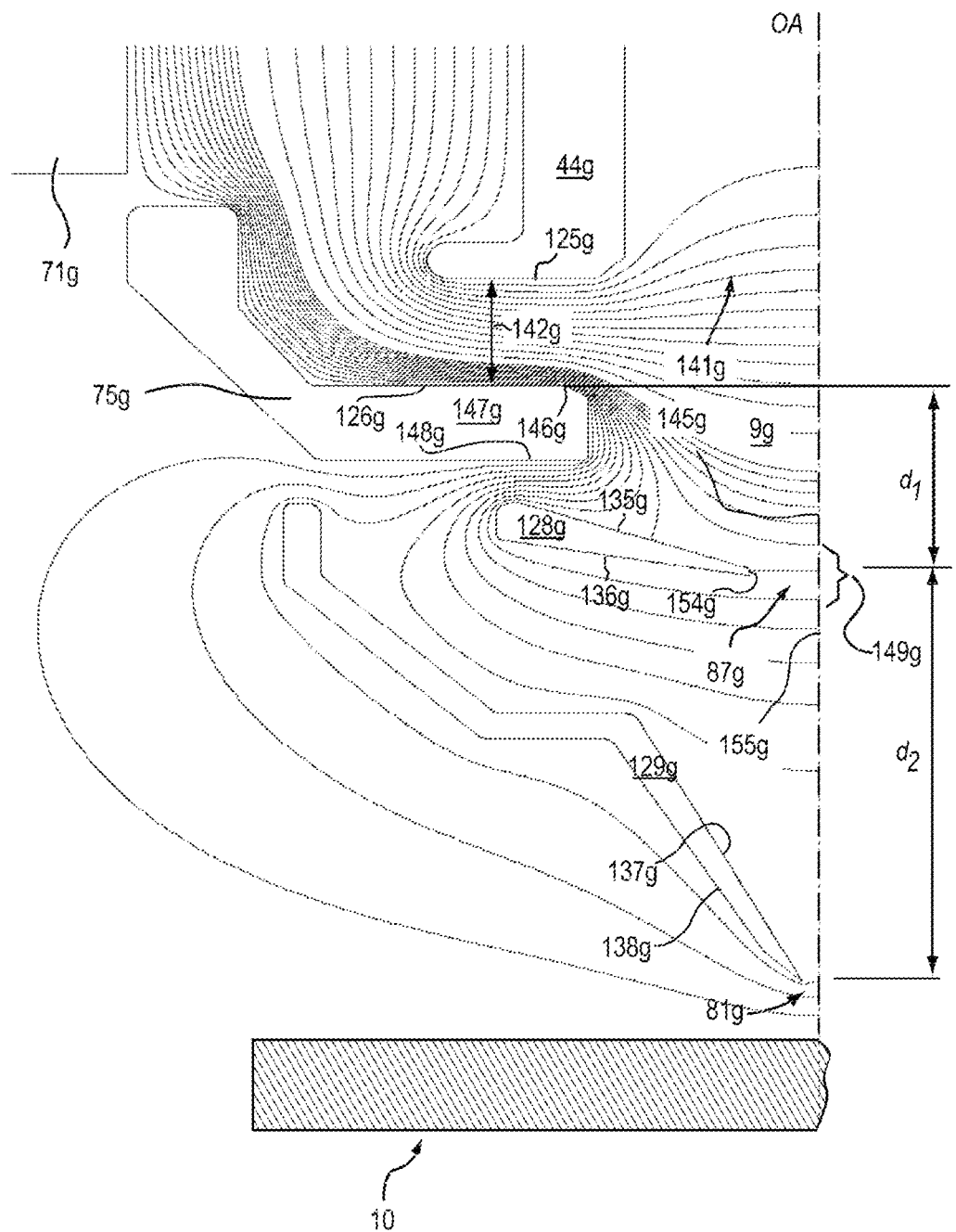
FIG. 5A schematically illustrates the distribution of potential lines in the differential pressure module and the objective lens in the particle optical apparatus according to the second exemplary embodiment.
Figure 5B:
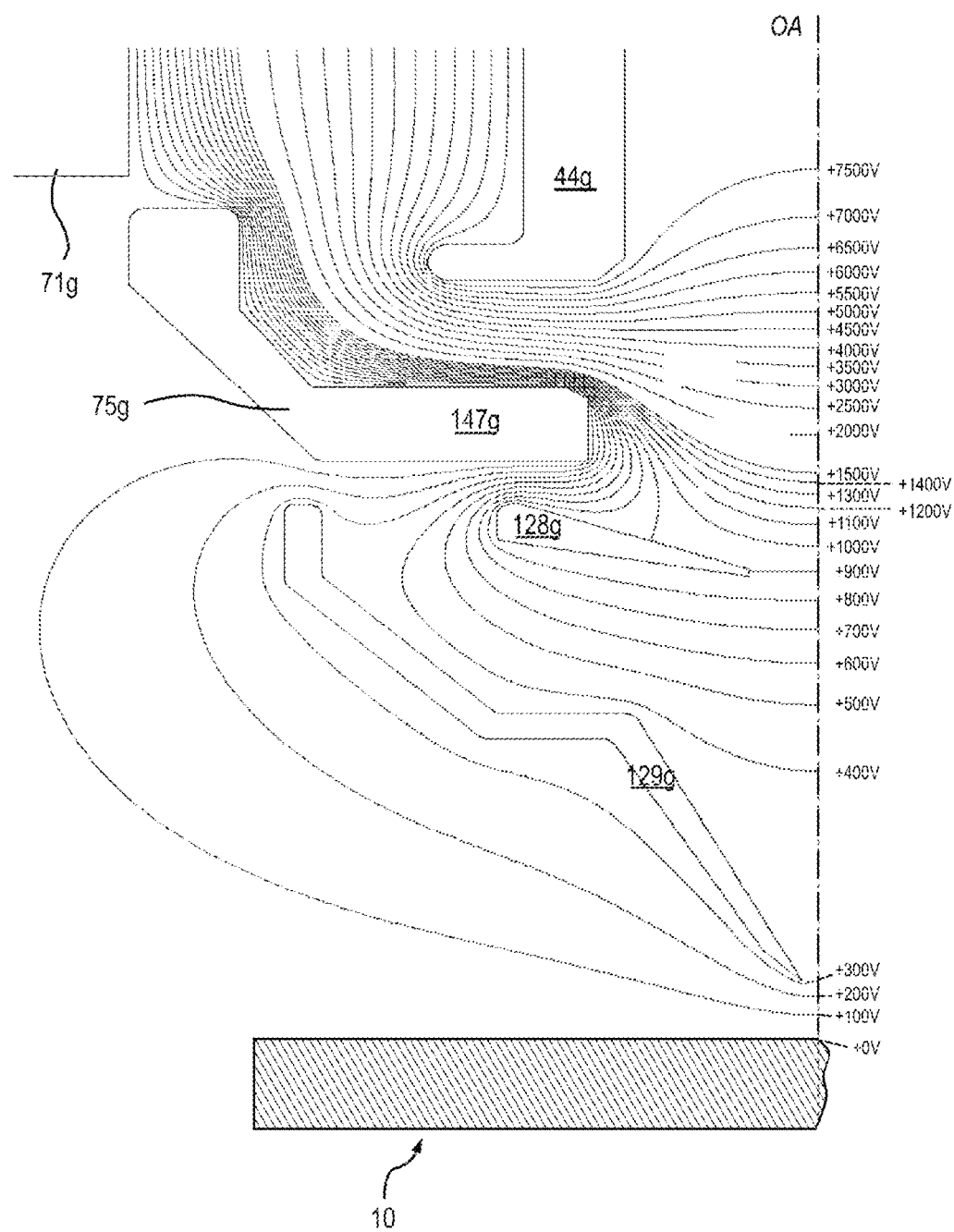
FIG. 5B schematically illustrates the distribution of potential lines shown in FIG. 5A, wherein values of each of the potential levels are indicated.

FIGS. 5A and 5B are schematic illustrations of equipotential surfaces of the charged particle optical apparatus of the second exemplary embodiment in an inspection operation mode. In FIG. 5B, for each of the equipotential surfaces, the respective voltage level is indicated.

In the inspection operation mode which is shown in FIGS. 5A and 5B, the first electrode 44g is maintained at a potential of 8 kV, the second electrode 75g is maintained at a potential of 0 V, the third electrode 128g is maintained at a potential of 900 V, the fourth electrode 129g is maintained at a potential of 350 V and the object is maintained at a potential of 0 V.

Due to the electric field, generated by the potential difference between the fourth electrode 129g and the object 10, secondary electrons, which are generated in the gas cascade between the fourth electrode 129g and the object 10, as well as secondary electrons which emanate from the specimen 10, are guided to the differential pressure aperture 81g of the fourth electrode 129g.

If the distance between the fourth electrode 129g and the object 10 is sufficiently small, a substantial portion of the secondary electrons emanating from the object 10 will pass through the differential pressure aperture 81g of the fourth electrode 129g. After having passed the differential pressure aperture 81g of the fourth electrode 129g, the electrons are accelerated substantially along the optical axis OA toward the differential pressure aperture 87g of the third electrode 128g caused by the electric field, which is generated by the potential difference between the third electrode 128g and the fourth electrode 129g. In greater distances from the optical axis OA, the secondary electrons are guided by the electric field also radially inward so that they are directed toward the differential pressure aperture 87g of the third electrode 128g.

The diameter of the differential pressure aperture 87g of the third electrode 128g is greater than the diameter of the differential pressure aperture 81g of the fourth electrode 129g. Thereby, acceleration of the secondary electrons substantially along the optical axis is sufficient to cause a predominant portion of the secondary electrons, which have passed through the differential pressure aperture 81g of the fourth electrode 129g also to pass through the differential pressure aperture 87g of the third electrode 128g.

If, on the other hand, the distance between the fourth electrode 129g and the object 10 is increased, a smaller fraction of the secondary electrons which emanate from the object 10 pass through the differential pressure aperture 81g of the fourth electrode 129g. Also in this case, the transport mechanism of secondary electrons between the differential pressure aperture 81g of the fourth electrode 129g and the differential pressure aperture 87g of the third electrode 128g remains substantially unchanged. However, a larger proportion of the detected through-the-lens secondary electron signal is caused by secondary electrons which are generated in the gas cascade.

Once the secondary electrons reach the differential pressure aperture 87g of the third electrode 128g, they are further accelerated and enter into the liner tube through the aperture 141g formed by the first electrode 44g. The trajectories of the secondary electrons are further influenced by the magnetic field generated by the pole pieces of the objective lens. In the particular case that the second electrode 75g is non-magnetic, the magnetic field in a region between the differential pressure aperture 87g of the third electrode 128g and the object 10 causes the secondary electrons to move along helical trajectories, which pass through the differential pressure aperture 81g of the fourth electrode 129g as well as through the differential pressure aperture 87g of the third electrode 128g.

In the inspection operation mode, which is illustrated in FIGS. 5A and 5B, the equipotential surfaces 142g of the electric field on locations 149g on the optical axis OA in the vicinity of the axial position of the differential pressure aperture 87g of the third electrode 128g have a comparatively small curvature despite the presence of the third electrode 128g. In other words, the electric field on these locations has a comparatively high degree of homogeneity. It has been shown that sufficiently small curvatures of the equipotential surfaces 142g of the electric field on locations 149g on the optical axis OA (i.e. a sufficiently spatially homogeneous electric field on locations 149g on of the optical axis OA) can be obtained by one or a combination of the measures implemented in the second exemplary embodiment and described in the following.

Particularly low aberrations of the primary particle beam can be obtained if by one or more of the measures described below, the electric field strength at points 145g, 155g on the optical axis OA fulfils the following condition. The points 145g, 155g are located at a distance of half the radius of the differential pressure aperture 87g from the center point of the differential pressure aperture 87g, as measured along the optical axis; and the electric field strength at these points 145g, 155g deviates by less than 40%, or less than 15%, or less than 5% from the electric field strength measured on the optical axis OA and at the center point of the differential pressure aperture 87g. The center point may be defined as the lateral and axial center of the differential pressure aperture 87g.

Additionally or alternatively, particularly low aberrations of the primary particle beam can be obtained if the electric field strength measured at the center point of the differential pressure aperture 87g is less than 800 V/mm, or less than 400 V/mm. At the center of the differential pressure aperture 87g, the field strength may be greater than 20 V/mm or greater than 50 V/mm.

The charged particle apparatus of the second exemplary embodiment is configured so that a section of the primary particle beam path, which extends between the aperture 141g formed by the first electrode 44g and the differential pressure aperture 87g of the third electrode 128g is surrounded by the second electrode 75g. It has been found that this is a factor which contributes to an increased homogeneity of the electric field on locations 149 on the optical axis OA, as well as to a smaller electric field strengths at the center point of the differential pressure aperture 87g.

In this regard, it has been found to be particularly advantageous if the second electrode 75g includes an inward extending rim 147g, which is disposed in the first vacuum zone 9g. The rim 147g shields the third electrode 128g against the first electrode 44g.

Further improvements can be achieved by one or a combination of the following structural features of the rim. The rim 147g has an inner peripheral surface, which surrounds the primary particle beam path. The distance $d_1$ between a source-side shoulder 146g of the rim and the differential pressure aperture 87g, as measured along the optical axis of the particle optical arrangement, is greater than 1.3 millimeters or greater than 2 millimeters. The rim further includes a first inward extending surface 126g, which extends toward the primary particle beam path. The first inward extending surface 126g surrounds the primary particle beam path. The first inward extending surface 126g faces the object-side end portion of the first electrode 44g and is averted from the third electrode 128g. It has found to be particularly advantageous if the first inward extending surface 126g extends parallel or substantially parallel to an object-side end face 125g of the first electrode 44g. The end face 125g is plane or substantially plane and extends perpendicular or substantially perpendicular to the optical axis OA. Between the first inward extending surface 126g and the end face 125g, an axial gap 142g is formed. The axial gap 142g surrounds the primary particle beam path. A minimum width, measured at the gap, may have a value of greater than 0.8 millimeters or greater than 1.2 millimeters. The minimum width may be smaller than 2 millimeters or smaller than 4 millimeters. The rim 147g further has a second inward extending surface 148g. The second inward extending surface surrounds the primary particle beam path. The second inward extending surface 148g extends toward the primary particle beam path. The second inward extending surface 148g faces the third electrode 129g and is averted from the object-side end portion of the first electrode 44g.

The distance $d_2$ between the differential pressure aperture 87g of the third electrode 128g and the differential pressure aperture 81g of the fourth electrode 129g, as measured along the optical axis OA of the particle optical arrangement, may be greater than 3 millimeters or greater than 4 millimeters. The distance $d_2$ may be smaller than 8 millimeters or smaller than 15 millimeters.

It has further been shown that one or more of the following measures also contribute to an increased homogeneity of the electric field on positions 149g on the optical axis OA as well as to low electric field strengths in the differential pressure aperture 87g. The charged particle optical apparatus is configured so that the first electrode 44g and the second electrode 75g, the third electrode 128g and the fourth electrode 129g are operable at different potential levels relative to each other. This allows adjusting these potentials so that the homogeneity of the electric field and/or the electric field strength have optimal values.

In this regard, it has been shown to be particular advantageous if in the inspection operation mode, the potential of the third electrode 128g is maintained at a potential between the potential of the first electrode 44g and the potential of the second electrode 75g. Thereby, the potential difference between the second electrode 75g and the third electrode 128g generates an electric field on the optical axis OA which is directed opposite to the electric field generated by the potential difference between the first electrode 44g and the second electrode 75g. It has shown that this effect contributes in a particularly effective manner to the increase of field homogeneity on locations 149g and to the reduction of the electric field strength in the differential pressure aperture 87g.

In this regard, it has further been found to be particularly advantageous if in the inspection operation mode, the potential of the third electrode 128g relative to the second electrode 75g is at least +100 V, or at least +400 V, or at least +600 V. It is further preferable that the potential level of the third electrode 128g relative to the second electrode 75g is less than +3000 V, or less than +1000 V.

It has further been found to be particularly advantageous if in the inspection operation mode, the potential of the first electrode 44g relative to the second electrode 75g ($V_1$) divided by the potential of the 128g third electrode relative to the second electrode 75g ($V_3$), i.e. the value $V_1/V_3$ is greater than 2 or greater than 3 or greater than 4 or greater than 5.

In alternative embodiments of the inspection operation mode, the second electrode may be grounded. This is advantageous in that a voltage source for the second electrode 75 would require a comparatively high stability. A stability for the second electrode 75 is required, since the second electrode is used to generate the comparatively high electrostatic field of the objective lens. Additionally or alternatively, an object holding portion of object holder, to which the object is abuttingly attached, may be grounded. If the object holding portion is grounded, it is not necessary to isolate the object holder from the surrounding specimen chamber. Furthermore, this allows measurement of the object current in a simple and efficient way. If the object holding portion is grounded, it is preferable that the potential of the fourth electrode 129g relative to ground is higher than 0 V. The potential of the fourth electrode may be less than +600 V or less than +500 V. Furthermore, in this configuration, where portion of the object holding portion is grounded, the potential of the third electrode 128g relative to the fourth electrode 129g is preferably between +30 V and +3 kV, or between +50 V and +1 kV, or between +100 V and +600 V.

The homogeneity of the electric field on the locations 149g on the optical axis OA can further be improved by reducing a thickness of an inner peripheral edge 154g of the third electrode 128g, which surrounds the differential pressure aperture 87g. In this regard, it has been found to be particularly advantageous if the inner peripheral edge 154g has a thickness of less than 300 micrometers, or less than 50 micrometers. The thickness may be greater than 0.4 micrometers. In the second exemplary embodiment, which is shown in FIGS. 5A and 5B, this is achieved by means of the wedge-shaped cross-section of the third electrode 128g in a plane, which includes the optical axis OA. The wedge-shaped cross-section points radially inward toward the primary particle beam.

It has further been shown that the homogeneity of the electric field on the locations 149g on the optical axis OA can be increased by maintaining the third electrode 128g at a positive potential relative to the fourth electrode 129g. In this regard, it has been found to be particularly advantageous if the potential of the third electrode 128g relative to the fourth electrode 129g is at least +30 V or at least +50 V or at least +100 V. The potential of the third electrode 128g relative to the fourth electrode 129g may be less than +3 kV or less than +1 kV or less than +600 V. The potential difference between the third electrode 128g and the fourth electrode 129g further generates an electric field which ensures that a large portion of those secondary electrons which have passed through the differential pressure aperture 81g of the fourth electrode 129g are guided through the differential pressure aperture 87g of the third electrode 128g.

The charged particle optical apparatus of the second exemplary embodiment has a combined electrostatic-magnetic objective lens, which is configured to produce a comparatively small magnetic flux density of less than 5 mT at a position, where the primary particle beam path enters into the vacuum zone of the pressure-controlled interior 5g of the specimen chamber, i.e. at a position of the differential pressure aperture 81g of the fourth electrode 129g. This can be attributed to the configuration of the flux gap or pole piece gap (designated by reference number 73 in FIG. 1) between the object-side pole piece (designated by reference number 71 in FIG. 1) and the source-side pole piece (designated by reference number 70 in FIG. 1).

However, it has been found that using an objective lens in the inspection operation mode, which is configured to generate a magnetic field strength of more than 10 mT or more than 15 mT or more than 20 mT at the position where the primary particle beam path enters into the vacuum zone of the pressure-controlled interior 5g of the specimen chamber, facilitates transportation of the secondary electrons from the object to the through-the-lens secondary electron detector.

Using an objective lens which is operable to generate magnetic fields of this strength, it is possible to obtain a sufficiently high collection efficiency for the secondary electron through-the-lens detector even if there is only a small or no potential difference between the third electrode 128g and the fourth electrode 129g. In this regard, it has been found to be particularly advantageous if most or substantially all of the magnetic field lines which pass through the differential pressure aperture 81g of the fourth electrode 129g, also pass through the differential pressure aperture 87g of the third electrode 128g. This can be achieved by adapting the configuration of the magnetic pole piece and the diameters of the differential pressure apertures 87g, and 81g.

A sufficiently strong magnetic field can be obtained by using a single pole piece magnetic lens. Additionally or alternatively, a dipole magnetic lens may be used which has an extended field configuration. An extended field configuration can, for example, be obtained by providing a bore diameter of the object-side pole piece which is much wider than the bore diameter of the source-side pole piece. Thereby, for example, an annularly-extending flux gap may be formed between the magnetic pole pieces.

The charged particle optical apparatus of the second exemplary embodiment is configured to adjust the potential of the third electrode 128g depending on one or more operational parameters of the charged particle optical apparatus. Examples for such operational parameters are the vacuum pressure level in the pressure-controlled interior of the vacuum chamber, the potential level of the fourth electrode 129g, the potential levels of the first and the second electrode 44g, 75g.

Specifically, a data processing system of the charged particle optical apparatus is configured to store a lookup-table and to control the potential of the third electrode depending on the entries contained in the lookup-table. The lookup-table assigns a potential value of the third electrode 128g to one or a combination of operational parameters of the charged particle optical apparatus. It has been shown that if the vacuum pressure level in the pressure-controlled interior of the specimen chamber is below a threshold value, arcing is considerably less likely to occur during adjustment of the potentials of the first to fourth electrodes. The charged particle optical apparatus is configured so that the control of the potential of the first electrode 44g and third electrode 128g is activated if the vacuum pressure level in the specimen chamber is below the threshold value. By way of example, the threshold has a value of between 100 Pa and 300 Pa. The data processing system may be configured to calculate the threshold value depending on the gas composition in the pressure-controlled interior of the specimen chamber and/or depending on the diameter of the differential pressure aperture 81g of the fourth electrode 129g. The control of the potential of the third electrode 128g is configured so that arcing does not occur, aberrations of the primary particle beam are kept low and the collection efficiency of the through-the-lens of the secondary electron detector is optimized.

The charged particle optical apparatus is further configured to control the potential of the first electrode 44g depending on the vacuum pressure level in the pressure-controlled interior of the specimen chamber. The control of the potential of the first electrode 44g is performed depending on entries of the lookup-table. The potential of the first electrode 44g relative to the second electrode 75g is decreased if comparatively high pressure levels occur. However, it has been shown that even for such a configuration, efficient control of the potential of the third electrode 128g can be achieved if the potential of the first electrode 44g relative to the second electrode 75g is reduced if comparatively high pressure levels occur in the specimen chamber. A reduced potential of the first electrode 44g relative to the second electrode 75g may however lead to a decreased collection efficiency for the through-the-lens secondary electron detector.

Figure 6:
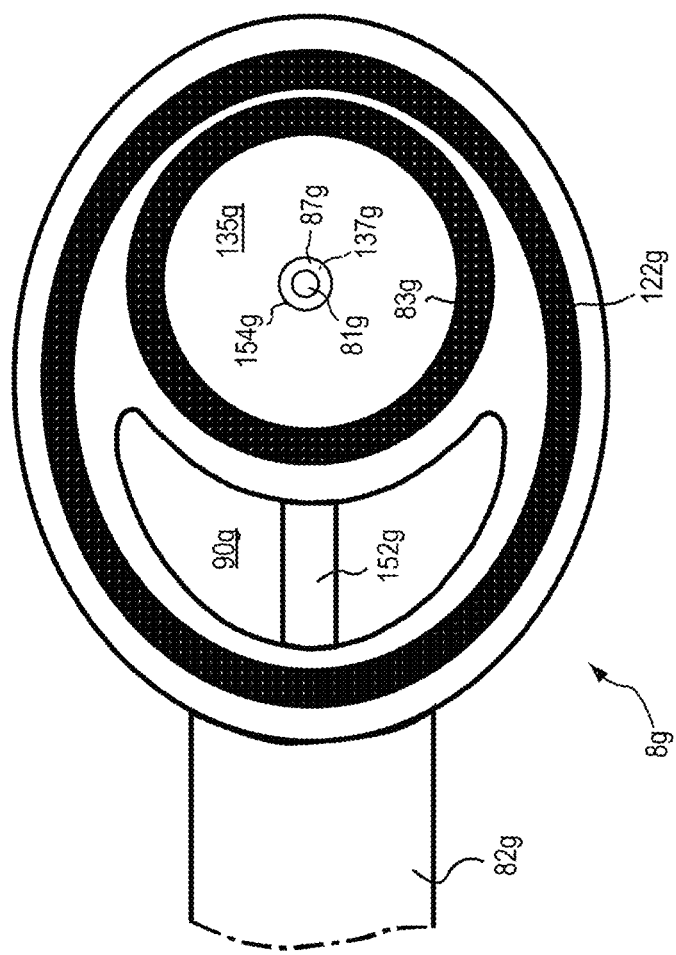
FIG. 6 schematically illustrates a top view of the differential pressure module of the particle optical apparatus according to the second exemplary embodiment.

FIG. 6 is a schematic top view of the differential pressure module 8g according to the second exemplary embodiment taken in the direction of the primary particle beam path. In the top view, an insulating member 152g for insulating the voltage supply line 133g (shown in FIG. 4) is visible due to the vacuum port 90g. The gas flow path, which passes through the vacuum port 90g is surrounded by the first seal member 122g. The primary particle beam path is surrounded by the first seal member 122g and the second seal member 83g. Thereby, the second seal member 83g provides a seal between the first vacuum zone and the intermediate vacuum zone. The first seal member 122g provides a seal between the intermediate vacuum zone and the vacuum zone of the pressure-controlled interior of the specimen chamber. Thereby, the first vacuum zone is sealed against the pressure controlled interior of the specimen chamber via the first and the second seal members 122g, 83g.

Figure 7:
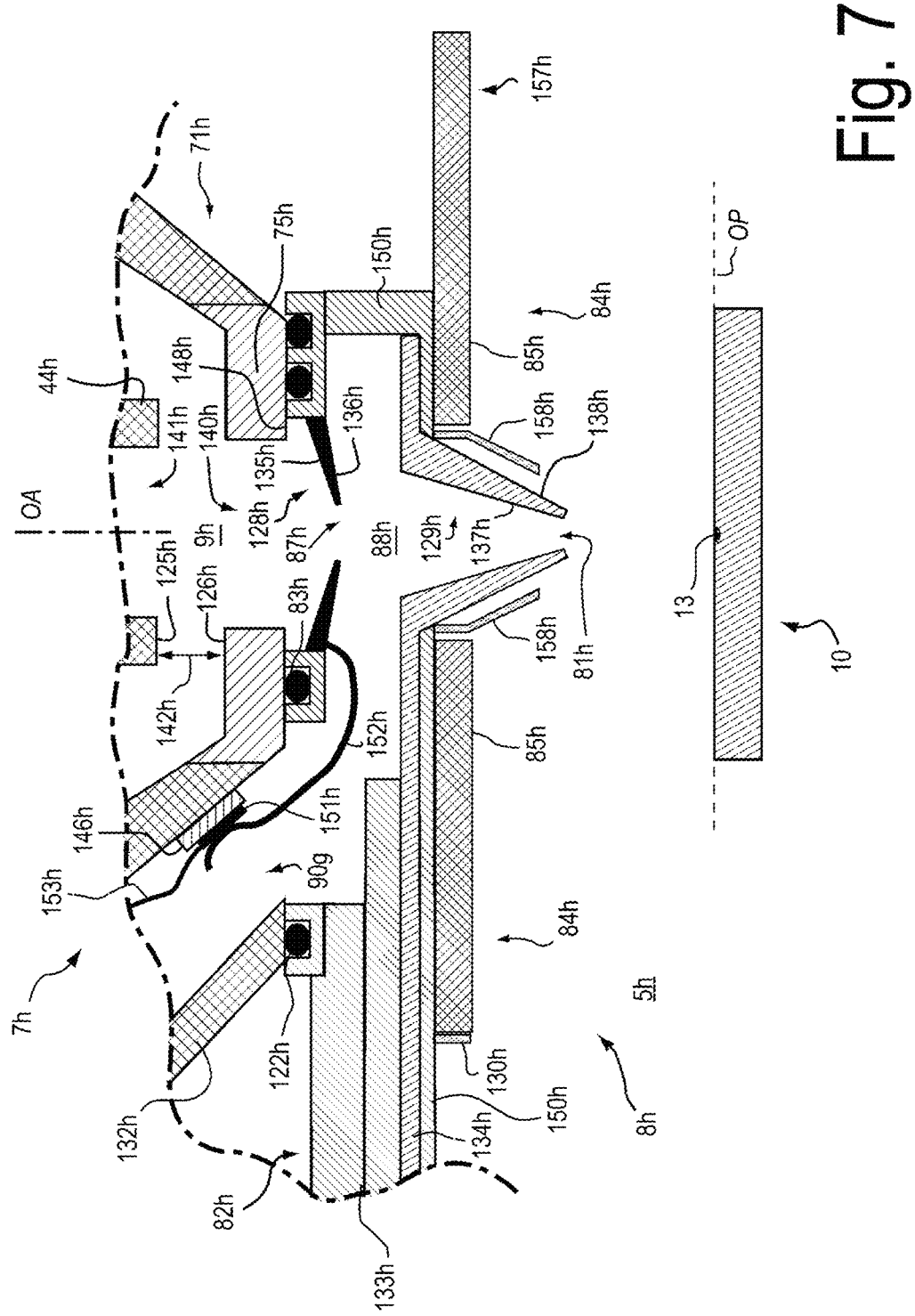
FIG. 7 schematically illustrates a particle optical apparatus according to a third exemplary embodiment.

FIG. 7 is a schematic illustration of a third exemplary embodiment of the particle optical apparatus. Components, which correspond to components of the first and second exemplary embodiment, shown in FIGS. 1 to 6, with regard to their composition, their structure and/or function are generally designated with the same reference numerals, which however have a letter "h" to show differentiation.

The particle optical arrangement according to the third exemplary embodiment includes a contacting member 151h for contacting a contacting member 152h of the differential pressure module 8h. The contacting member 151h is rigidly attached to the particle optical arrangement via an insulating portion 146h. The contacting member 152h of the differential pressure module 8h is in electrical contact with the third electrode 128h. The contacting members 151h and 152h are configured so that during the positioning of the differential pressure module into the operating position, the contacting member 152h of the differential pressure module 8h is brought into contact with the contacting member 151h of the particle optical arrangement.

This allows contacting the third electrode 128h via a voltage supply line 153h, which remains stationary during the positioning of the differential pressure module 8h. Thereby, it is not necessary to provide a voltage supply line within the movable positioning arm 82h. This allows a simple design of the positioning arm 82h.

It is also conceivable that the fourth electrode 129h is connected to a contacting member which is brought into contact with a corresponding contacting member of the particle optical arrangement. Thereby, the design of the positioning arm 82h is even further simplified.

The differential pressure module 8h of the third exemplary embodiment includes a module-mounted detector 84h, having particle receiving surfaces 85h which are arranged circumferentially around the optical axis OA. By way of example, four particle receiving surfaces 85h are provided which form a 4Q configuration. The module-mounted detector 84h has a protruding portion 157h, which laterally protrudes beyond the lateral extent of the object-side end face of the objective lens. The object-side end face of the objective lens is formed by a radially inward extending surface 148h of the second electrode 75h. As a result of the protruding portion 157h, the particle receiving surfaces of the module-mounted detector 84h are comparatively large compared to the second exemplary embodiment.

In order to provide a sufficient collection solid angle for further radiation and/or particle detectors, which are mounted in the pressure-controlled interior of the specimen chamber, one or more cutouts are formed in the protruding portion 157h. Examples for such radiation and/or particle detectors are EDX (energy dispersive X-ray) detectors, WDS (wavelength dispersive spectroscopy) detectors, gas scintillation detectors, collector electrode gaseous detectors, and cathodoluminescence detectors.

The module-mounted detector 84h is further configured so that all cutouts formed in the particle receiving surfaces 85h are formed symmetrically relative to the optical axis OA. Thereby, also particle receiving surfaces which are arranged outside of the protruding portion 157h may include cutouts. This ensures that images which are generated by using the module-mounted detector 84h do not contain directional artifacts. Alternatively or additionally, in order to compensate for the cutouts formed in the protruding portion 157h, the particle receiving surfaces 85h may be configured so that each of the particle receiving surface covers a same or substantially a same size of a solid angle.

The differential pressure module 8h of the third exemplary embodiment further comprises one or more collector electrodes 158h of a module-mounted gaseous detector. Each of the collector electrodes 158h is in the form of a wire and has a distal end portion which points toward or substantially toward the interaction region 13. The number of collector electrodes 158h may be the same as the number of particle receiving surfaces 85h of the module-mounted detector 84h. The collector electrodes 158h are arranged circumferentially around the primary particle beam path. The collector electrodes 158h may be arranged distant from each other and/or equally spaced from each other along the circumferential direction. At least two of the collector electrodes 158h may be arranged pairwise in a diametrically opposed relationship relative to the optical axis of the particle optical arrangement.

The circumferential positions of the collector electrodes 158 relative to each other may correspond or substantially correspond to circumferential positions of the particle receiving surfaces 85h relative to each other. By way of example, four collector electrodes 158h are arranged in a four-quadrant (4Q) configuration and four particle receiving surfaces 85h are arranged in a four-quadrant configuration. Thereby, the circumferential positions of the collector electrodes 158h relative to each other correspond to circumferential positions of the particle receiving surfaces 85h relative to each other, wherein, however, the angular orientation of the two four-quadrant configurations relative to each other may be angularly offset or angularly aligned.

In a particular exemplary embodiment, the circumferential positions of the collector electrodes 158h correspond or substantially correspond to the circumferential positions of the particle receiving surfaces 85h. By way of example, the circumferential positions of the collector electrodes 158h may correspond to the circumferential positions of centers of gravity of the particle receiving surfaces 85h.

Thereby, it is possible to compare directional characteristics in the images generated by using the detector signals of the module-mounted detector 84h with directional characteristics in the images generated by using the gaseous detector having the collector electrodes 158h. Furthermore, it is possible to calculate a pixel-by-pixel difference between the image acquired by using the module-mounted detector 84h, which is configured as a backscattered electron detector, and the image acquired by using the collector electrodes 158h. Thereby, it is possible to obtain a secondary electron image showing less contributions from backscattered electrons.

The differential pressure module enables fast switching between two operation modes which allow inspection of objects at different pressure levels without venting the specimen chamber. In a first one of these operation modes, the differential pressure module and/or the differential pressure aperture is disposed outside the primary particle beam. In a second one of these operation modes, the differential pressure module is positioned in the operating position in which the primary particle beam path passes through the differential pressure aperture. Therefore, the second operation mode allows acquisition of images at elevated pressure levels, compared to the first operation mode, in the pressure-controlled interior of the specimen chamber.

The second operation mode allows inspection of wet samples by using gaseous detectors, which rely on gaseous amplification in the pressure-controlled interior of the specimen chamber. Moreover, inspection in this operation mode is advantageous if samples are inspected which tend to accumulate charges in response to irradiation by the primary particle beam.

On the other hand, it has been shown that if the differential pressure module is positioned in the operating position, the aberration-free visual field may be limited by the presence of the differential pressure aperture. Specifically, at high deflection angles of the primary particle beam, the primary particle beam may be obstructed by the electrode, which forms the differential pressure aperture. Additionally or alternatively, at high deflection angles, aberrations may be induced in the primary particle beam as a result of an electric field caused by the presence of the electrode.

As will be described in the following, efficient inspection procedures can be conducted if image data of an object portion are acquired in the first operation as well as in the second operation mode.

According to an advantageous exemplary method, a first image is acquired in the first operation mode, i.e. with the differential pressure module being in the non-operating position. The first image may be acquired at a pressure level of lower than 80 Pa or lower than 60 Pa or lower than 30 Pa. The first image may be acquired by using a backscattered electron detector. The backscattered electron detector may be disposed in the pressure-controlled interior of the specimen chamber or may be a through-the-lens backscattered electron detector. Using the backscattered electron detector is advantageous in that backscattered electron imaging is less affected by charge accumulation compared to gaseous secondary electron imaging.

Additionally or alternatively, the first image may be acquired by using a secondary electron detector. The secondary electron detector may be a gaseous secondary electron detector. Using a gaseous secondary electron detector is advantageous in that the images visualize the three-dimensional shape of the object surface topography. Moreover, images which are acquired using the gaseous secondary electron detector bear more resemblance to images acquired by using the through-the-lens secondary electron detector, which is one of the preferred detectors in the second operation mode. This facilitates combining these images and ensure a consistent impression, since each portion of the combined image has a topographical contrast.

Thereby, using the gaseous secondary electron detector in the first operation mode for the acquisition of the first image makes it more efficient to identify those object portions, which appear in images of both operation modes.

Then, by virtue of the track-guided movement of the positioning arm, the differential pressure module is transported from the non-operating position to the operating position in which the primary particle beam path passes through one or more differential pressure apertures of the differential pressure module. Thereby, the particle optical apparatus is switched into the second operation mode.

Then, a second image is acquired so that at least a portion of the second image and at least a portion of the first image represent a same object portion. In other words, the visual fields of the first and the second images are at last partially overlapping. The use of the positioning arm allows acquisition of the first and the second images without venting the chamber and without the need for dismounting the object.

The second image may be acquired by using the through-the-lens secondary electron detector and/or the gaseous secondary electron detector. Using the gaseous secondary electron detector is preferred if the through-the-lens secondary electron images show effects of accumulated charges, since images of gaseous detectors have a stronger contribution of electrons of higher energy and are therefore less likely to show artifacts generated by accumulated charges. Using the gaseous detector therefore allows at lower pressure levels imaging those objects, which tend to accumulate charges.

When the second image is acquired, the vacuum pressure level in the pressure-controlled interior of the specimen chamber may be greater than 1.5 times or greater than 2 times the vacuum pressure level when the first image is acquired.

Since the differential pressure aperture imposes a limit to the maximum unimpaired visual field, it has been found advantageous that the images of the first operation mode (i.e. with the differential pressure module being in the non-operating position) are used for navigation towards a region of interest. It is also conceivable that a combined navigation image is formed by combining a plurality of images, which are acquired in the first operation mode and which represent adjacent or partially overlapping visual fields. The combined overview image can be formed interactively (e.g. by using a graphical user interface) or automatically by using the data processing system. Forming the combined overview image may include performing an image processing operation. The image processing operation may include a correlation algorithm, such as a cross-correlation algorithm.

As a next step, by using a data processing system of the charged particle optical apparatus, the second image is filtered to identify effects of obstruction and/or to identify effects of aberrations. The identified effects of obstruction and/or the identified effects of aberrations are caused by the differential pressure aperture. The identification process may selectively identify effects of obstruction and/or effects of aberrations which exceed a pre-defined level.

The filtering, as well as the operation steps which are described in the following, may be performed when the second image is acquired at a low magnification of the particle optical arrangement, i.e. in particular, when effects of obstruction and/or aberration are expected to appear in the second image.

The filtering process may be performed by using an image processing algorithm. Additionally or alternatively, a graphical user interface may be used, which allows a user to interactively identify a region in which the effects of obstruction and/or the aberrations are recognizable to the user and/or exceed a pre-defined level.

Additionally or alternatively, the image region which is affected by beam obstruction and/or aberrations caused by the presence of the differential pressure aperture may be determined depending on operational parameters such as the extent of the field of view. The geometric extent of the affected image region may be determined depending on a calculation of beam path of the primary particle beam.

Additionally or alternatively, the affected image region may be determined depending on calibration measurements which are used to set up a look-up table depending on which the affected image region can be determined depending on operation parameters of the charged particle apparatus. Thereby, the extent of the affected image region may be known before the second image is acquired.

Then, the data processing system suppresses the identified image region. Suppressing the image region may include removing the identified image region from the second image. The suppression may be performed by assigning a low and/or suppressed weight factor or a weight factor of zero to the image data values of the identified region compared to the weight factors of image data values of at least a portion of the remaining second image (i.e. the remaining image portion of the second image relative to the identified image region). Thereby, the image data values in the identified image region may represent a low intensity region, such as a dark region of the second image.

After the second image has been processed in this manner, the second image is combined with the first image to form a combined image. The combining of the images is performed so that image data of the first image is used to compensate for the suppressed, in particular removed, image region of the second image. By way of example, an image portion of the first image may be identified, which includes an image region, which represents the same object portion as the suppressed, in particular removed, image portion of the second image. The image portion of the first image may be used to supplement the second image. The supplementing of the second image may be performed by superimposing the image portion of the first image onto the image region of the second image, which has been suppressed, in particular removed.

Thereby, an image is generated which allows efficient inspection of object features. This method is particularly useful if the first image is an overview image having a wide field of view. This overview image may be used for navigation and/or for selecting a region of interest for acquiring the second image.

The charged particle optical apparatus may be configured to display in the second image, which was acquired with the differential pressure module being in the operating position and/or in the combined image a graphical indicator indicating a border between the unaffected image region and the affected image region. By way of example, the graphical indicator may have the shape of a circle. The graphical user interface may be configured so that the user can select between displaying the second image and/or combined image with or without the graphical indicator. The position of the border in the images can be determined with high accuracy, since the differential pressure module allows positioning of one or more differential pressure apertures relative to the optical axis with a high accuracy.

The image portion of the first image and the image portion of the second image which represent the same object portion may be identified by using an image processing algorithm. The image processing algorithm may include a cross-correlation algorithm. If correlation algorithms are used, it is preferred that the images of the first and the second operation modes are acquired by using the same detector. In this regard, it has been found advantageous to use the gaseous secondary electron detector in the first as well as in the second operation mode.

Additionally or alternatively, identifying the image portion of the first image and the image portion of the second image may include determining at least one parameter of a position and/or orientation of the object. By way of example, the parameter may be determined depending on control signals transmitted to a positioning system for positioning the object within the pressure-controlled interior of the vacuum chamber. Additionally or alternatively, the charged particle optical apparatus may include sensors for measuring one or more parameters of the position and/or orientation of the object within the specimen chamber.

By way of example, the position and/or orientation of the visual fields relative to each other are determined in a successive approximation process. A first approximation is determined depending on the control signals transmitted to the positioning system and/or depending on signals of the sensors. A second approximation, which is finer than the first approximation may be determined depending on the first approximation and further depending on image data of the first image portion and the second image portion. In particular, the second approximation may be determined using the image processing algorithm.

FIGS. 8A and 8B serve to illustrate a second exemplary method performed by using the charged particle optical apparatus. It has been shown to be particularly advantageous if at least two images of a same object portion are acquired by using gaseous detectors and through-the-lens detectors. It has been noticed that these images provide complementary information which allows a more thorough and efficient inspection of the object.

The charged particle optical apparatus configured to perform the second exemplary method includes a gaseous detector which is disposed in the pressure-controlled interior of the specimen chamber. The gaseous detector is configured to detect a gaseous amplification by using a photon detection device and/or a collector electrode. The photon detector may be configured to detect scintillation radiation generated by the gas cascade. The gaseous detector may be a side-mounted detector.

Gaseous amplification typically results in a signal which is predominantly caused by secondary electrons but nevertheless may reveal some contributions of backscattered electrons. This is due to the fact that backscattered electrons generate secondary electrons in the gaseous environment which are also amplified in the gas cascade. Thereby, images generated by using gaseous amplification may show features which are not related to topography but to chemical contrast. This can make image interpretation difficult and even potentially misleading.

An example of a gaseous amplification image generated by using a gaseous detector is shown in FIG. 8B. The topographical contrast, which is contained in gaseous amplification images, is typically dominated by two effects. First, gaseous amplification images show object portions of the foreground with a higher intensity compared to object portions of the background. This effect is also visible in FIG. 8B. Second, gaseous amplification images, generated by side mounted gaseous detectors, show shadowing effects, in particular if the topography of the object surface has a high aspect ratio. Also this effect is visible in FIG. 8B. The second effect is more apparent if the image is generated using a side-mounted gaseous detector.

These effects, which are visible in gaseous amplification images, however, are useful in that the object's three-dimensional shape can be visually perceived by the user. Thereby, these images facilitate navigation of the primary electron beam to a region of interest.

However, these effects can be a great disadvantage if interesting object features are hidden by low intensity regions, in particular shadows. Specifically, as is shown in FIG. 8B, depending on the surface topography, a significant portion of the object may be obscured by image regions of low image intensity, thereby preventing a thorough and efficient inspection of the object surface.

As a comparative example, FIG. 8A illustrates a through-the-lens image which has been acquired from the same object using the through-the-lens secondary electron detector. As can be seen from this image, despite the high aspect ratio of the surface topography, it is still possible to image object portions which are located in deep object valleys or in the background. This also applies to through-the-lens images acquired by using a through-the-lens backscattered electron detector. The topographical contrast in the through-the-lens secondary electron image is predominantly generated by edge enhancement effects.

According to the second exemplary method, a gaseous amplification image is acquired by using a gaseous detector which relies on gaseous amplification and which is disposed in the pressure-controlled interior of the specimen chamber. The gaseous detector may be a side-mounted gaseous detector. The gaseous amplification image is shown in FIG. 8B.

Before, concurrently or after the gaseous amplification image is acquired, a through-the-lens image is acquired using a through-the-lens secondary electron detector. The through-the-lens image is shown in FIG. 8A. It is also conceivable that the through-the-lens image is acquired using a through-the-lens backscattered electron detector.

Acquiring the gaseous amplification image simultaneously with the through-the-lens image is advantageous in that it is easier to determine image portions in both images which represent a same object portion. On the other hand, acquiring these images successively is advantageous in that operating parameters of the charged particle apparatus such as the working distance and/or the vacuum pressure level in the specimen chamber can be adapted individually to the respective detector. This allows optimization of the signal to noise ratio for each of the images.

The through-the-lens secondary electron detector, as well as the through-the-lens backscattered electron detector are configured as non-gaseous detectors, i.e. these detectors operate without gaseous amplification. Examples of such detectors are semiconductor detectors, detectors which include a scintillator and/or an electron multiplier. Since operation of theses detectors typically involve high voltages, this results in a maximum allowable pressure level in the specimen chamber, which is lower than the maximum allowable pressure level when only the gaseous detector in the specimen chamber is used.

On the other hand, the maximum allowable pressure level for acquiring gaseous amplification images is limited by the required vacuum level for operating the particle gun (indicated by reference number 3 in FIG. 1). By way of example, the charged particle optical apparatus may be configured so that the maximum allowable vacuum pressure for acquiring gaseous amplification images is greater than 600 Pa, greater than 750 Pa, or even greater than 1000 Pa. The particle optical apparatus may include a sample cooling system which allows achieving an equilibrium between water vapor and liquid water. By way of example, by cooling the sample to a temperature of 2 degrees Celsius the equilibrium is established at a pressure level of approximately 660 Pa.

If the images are not acquired simultaneously, it is possible to adjust the potential level of the electrode, which forms the final differential pressure aperture (i.e. the fourth electrode 129g shown in FIG. 4) individually for each of the images. By way of example, the potential level of the electrode relative to the object may be 0 V when the gaseous amplification image is acquired without using the fourth electrode (designated with reference sign 129g in FIG. 4) as a collector electrode of the gaseous detector. If the fourth electrode is configured as a collector electrode of the gaseous detector, the potential of the fourth electrode relative to the object is preferably greater than 300 V. On the other hand, when the through-the-lens image is acquired, it is preferred that the potential of the fourth electrode relative to the object is greater than 200 V. Thereby, a configuration in which the fourth electrode is configured as a collector electrode, facilitates simultaneous imaging of the gaseous amplification image and the through-the-lens image.

The gaseous amplification image may be acquired with the differential pressure module positioned in the non-operating position. In other words, during the acquiring of the gaseous amplification image, the differential pressure aperture is outside the beam path of the emitted particles. Alternatively, during the acquiring of the gaseous amplification image, as well as during the acquiring of the through-the-lens image, the emitted particles may pass through the same configuration of vacuum zones. In particular, during the acquiring of the gaseous amplification image and during the acquiring of the through-the-lens image, the differential pressure module may be positioned in the operating position.

As a next step, by using the data processing system of the charged particle optical apparatus, a combination of the gaseous amplification image and the through-the-lens image is generated. The combining of the gaseous amplification image and through-the-lens image is performed to generate a combined image. The combined image is shown in FIG. 8C. In the combined image, object features, which are hidden in the shadow region 156 of the gaseous amplification image (shown in FIG. 8B) are made visible using a corresponding image region of the through-the-lens image. The shadow region 156 represents an intensity valley within the gaseous amplification image. In other words, the shadow region is at least partially surrounded by an image intensity edge.

Specifically, in order to obtain the combined image, a contribution image region 155 is determined within the through-the-lens image, which is shown in FIG. 8A. The contribution image region 155 contributes to the combined image in a corresponding image region 157 of the combined image. The contribution image region 155 of the through-the-lens image is determined so that the contribution image region 155 corresponds to the intensity shadow region 156 of the gaseous amplification image. In other words, the regions 155 and 156 correspond to a same object portion. Thereby, the contribution image region 155 is determined depending on image data values of the gaseous amplification image.

The combined image is generated so that the image region 157 in the combined image, which corresponds to the intensity shadow region 156 of the gaseous amplification image, represents an intensity shadow region within the combined image. Thereby, the combined image still allows the user to perceive the object's three-dimensional shape from the combined image. This is also demonstrated by the intensity cross-section A-A through the combined image, which is shown in FIG. 8D. The portion 154 of the intensity cross-section, which corresponds to a cross-section through the image region 157, still has a lower intensity compared to the surrounding image region and is delimited by an intensity edge 158.

Thereby, the combined image has an image region 157 as a shadow image region, which corresponds to the shadow image region 156 of the gaseous amplification image. In the combined image, the contribution of the through-the-lens image is enhanced within the image region 157 compared to outside the image region 157. In the example, which is shown in FIG. 8C, the through-the-lens image does not contribute to the combined image outside the image region 157. However, it is also conceivable that a suppressed contribution is present outside the image region 157, compared to inside the image region 157.

The data analysis is configured to automatically determine the contribution of the contribution image region 155 of the through-the-lens image (FIG. 8A) relative to the contribution of the corresponding image region 156 of the gaseous amplification image (FIG. 8B) so that the image region 157 in the combined image (FIG. 8C) still represents a shadow region.

Alternatively, the graphical user interface may be configured to display the combined image (FIG. 8C) on a display of the data analysis system. The graphical user interface may further be configured to adapt the contribution of the contribution image region 155 of the through-the-lens image (FIG. 8A) relative to the contribution of the corresponding image region 156 of the gaseous amplification image (FIG. 8B), depending on user input received through the graphical user interface.

In an alternative exemplary embodiment, at least a portion of the combined image shows one or more colored regions, which correspond or substantially correspond to one or more intensity valleys of the gaseous amplification image (FIG. 8B). Further, in the portion of the combined image, a contribution of the through-the-lens image (FIG. 8A) is enhanced within the one or more colored regions compared to outside the one or more colored regions. In this context, the term "corresponding" may be defined to mean that the colored regions of the combined image and the shadow regions of the gaseous amplification image represent a same or substantially a same object portion.

Thereby, in the combined image, the user can visually perceive the image portions, which correspond to the shadow regions of the gaseous amplification image through the color of the colored region. In the portion of the combined image, the colored regions may be marked with different values of parameters of color appearance, such as colorfulness, chroma, saturation, lightness, and brightness compared to outside the colored regions.

Figure 9:
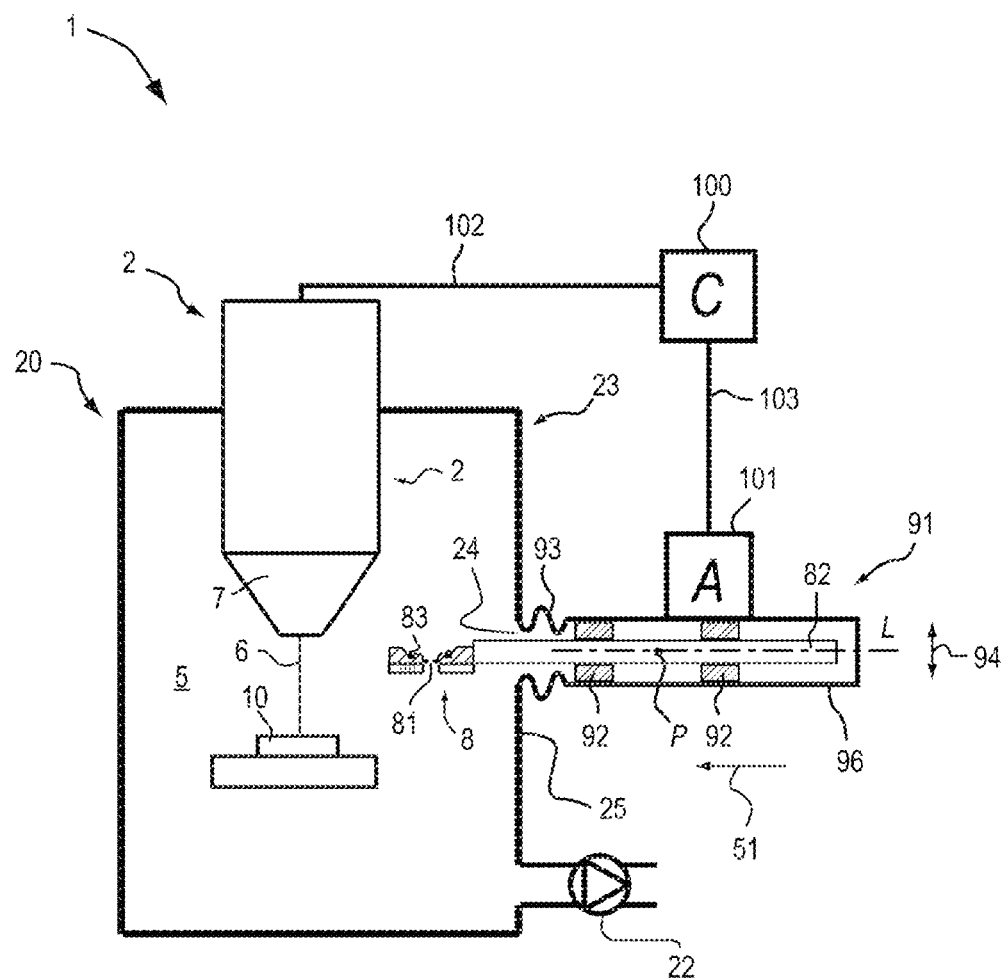
FIG. 9 schematically illustrates the specimen chamber of the particle optical apparatus according to the first exemplary embodiment.

In FIG. 9, it is illustrated how the positioning arm 82 is connected to the specimen chamber 20 of the charged particle optical apparatus 1 according to the first exemplary embodiment. The positioning arm 82 is movably supported by bearings 92. The bearings 92 are attached to an interior surface of an end portion 96 of a tube 91. For transmitting the advancing movement to the differential pressure module 8, the positioning arm 82 is guided by bearings 92 along the longitudinal axis of the positioning arm 82. Thereby, the positioning arm 82 defines a track for the track-guided movement of the positioning arm 82. In other words, the positioning arm 82 forms a rail for guiding the track-guided movement of the positioning arm 82.

The end portion 96 of the tube 91 is connected to a main chamber portion 23 of the specimen chamber 20 via a flexible tube portion 93. In the illustrated exemplary embodiment, the flexible tube portion 93 include bellows. The tube 91 therefore forms a part of the vacuum enclosure. In the main chamber portion 23, the object 10 is disposed for inspecting the object with the particle optical system 1. The main chamber portion 23 is in fluid communication with a vacuum pumping system 22 or other vacuum source. The interior of the tube 91 is in fluid communication with the interior of the main chamber portion 23 via an opening 24, which extends through a wall portion 25 of the main chamber portion 23. The tube 91 forms an extension of the opening 24.

During the advancing movement in the direction, which is schematically indicated by arrow 51, a portion of the positioning arm 82 passes through the opening 24. The flexible tube portion 93 is configured to allow the end portion 96 of the tube 91 to be moved relative to the main chamber portion 23 along a direction 94, which is substantially parallel to the primary particle beam path 6 inside the specimen chamber 20. This allows transmitting to the differential pressure module 8 the pressing movement for pressing the differential pressure module 8 against the objective lens 7. Additionally or alternatively, the pressing movement is transmitted to the differential pressure module 8 by a pivoting movement of the tube end portion 96 and/or the positioning arm 82 about a pivoting axis P. The pivoting axis P may be oriented substantially perpendicular to the primary particle beam path 6 inside the specimen chamber 20. The pivoting axis may be located outside of the specimen chamber 20. It is conceivable that the positioning arm 82 is moved or pivoted relative to the tube 91. This allows omitting the flexible tube portion 93.

The positioning arm 82 is in operative connection with an actuator 101. The actuator may be configured as an electric, pneumatic and/or hydraulic actuator. The actuator 101 is in signal communication via signal line 103 with a controller 100 of the charged particle optical apparatus 1. The controller 100 is also in signal communication with the particle optical arrangement 2. The controller 100 is configured to switch the particle optical apparatus 1 between the first and the second operation mode.

In the first operation mode, the differential pressure module 8 is disposed in the non-operating position in which the differential pressure module 8 is located at a distance from the primary particle beam path 6. In the second operation mode, the differential pressure module 8 is in the operating position (shown in FIG. 2), in which the primary particle beam path 6 enters into the main chamber portion 23 through the differential pressure aperture 81.

In the first operation mode, the interior 5 of the specimen chamber 20 has to be maintained at a high vacuum pressure level in order to ensure maintenance of a sufficiently low pressure level in the electron gun 3 (shown in FIG. 1).

However, the first operation mode is only of limited use for inspecting wet objects, which tend to increase the vacuum pressure level in the interior 5 of the specimen chamber 20. Further, the first operation mode also does not allow to selectively increase the vacuum pressure level in a significant manner in order to enable dissipation of surface charges when inspecting non-conductive objects. However, such measurements can be performed in the second operation mode, in which the differential pressure aperture 81 is arranged in the primary particle beam path 6.

On the other hand, compared to the second operation mode, the first operation mode allows detecting secondary particles and backscattered particles by the through-the-lens electron detectors 62, 64 (illustrated in FIG. 1) with a higher efficiency. The reason for this resides in the fact that in the first operation mode, the differential pressure aperture 81 does not block secondary and backscattered electrons from entering into the interior of the particle optical arrangement 2. Further, in the first operation mode, the field of view is not limited by the differential pressure aperture 81.

Upon receiving a mode switching command to switch to the second operation mode, the controller commands the particle optical arrangement to deactivate the primary particle beam. Then, controller 100 commands the actuator 101 to perform an advancing movement starting from the non-operating position of the differential pressure module 8. The advancing movement is configured to advance the differential pressure module 8 toward the primary particle beam path 6. After completion of the advancing movement, the controller 100 commands the actuator 101 to perform a pressing movement for pressing the differential pressure module 8 against the objective lens 7. By virtue of the pressing movement, the sealing member 83 sealingly engages with the objective lens 7. After completion of the pressing movement, the differential pressure module 8 is in the operating position, as shown in FIG. 2. Then, the controller commands the particle optical arrangement 2 to activate the primary particle beam.

Upon receiving a mode switching command to switch to the first operation mode, the controller 100 commands the particle optical apparatus to deactivate the particle beam. Then, the controller 100 commands the actuator 101 to move the differential pressure module 8 from the operating position to the non-operating position. These movements may include a reverse advancement movement and/or a reverse abutting movement.

Figure 10:
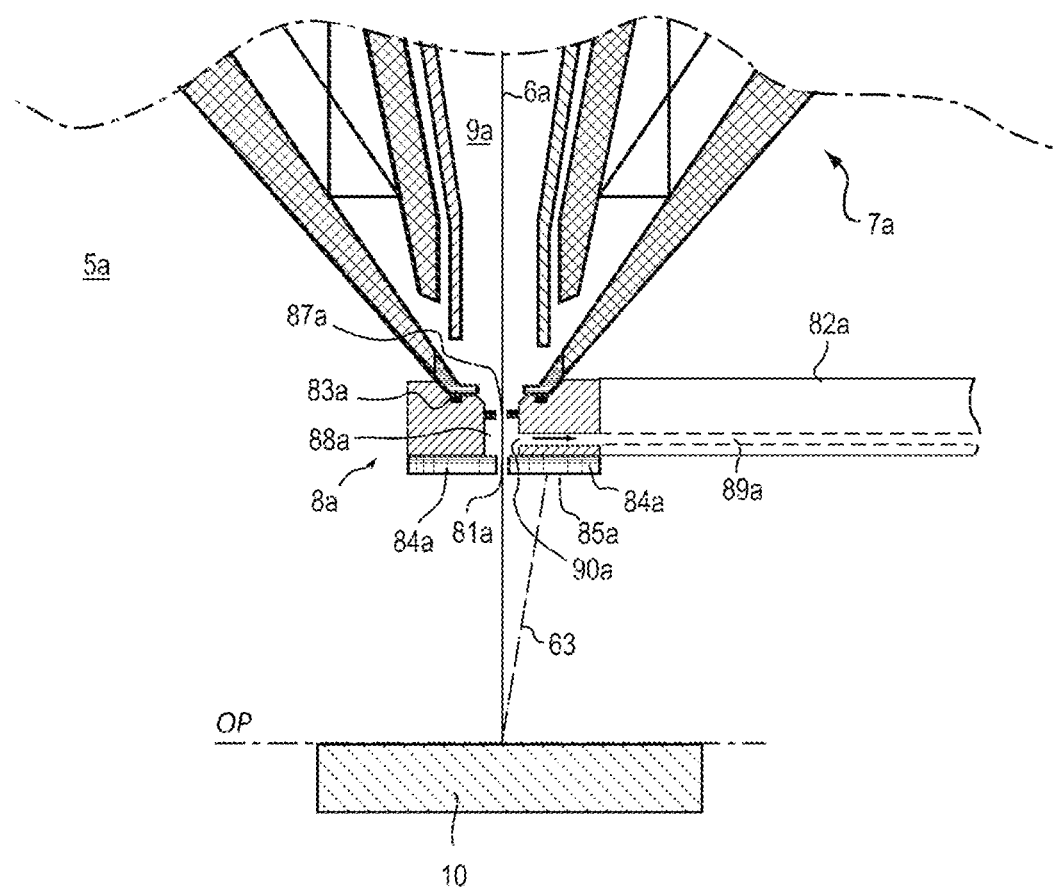
FIG. 10 schematically illustrates a particle optical apparatus according to a fourth exemplary embodiment.

FIG. 10 illustrates a charged particle optical apparatus according to a fourth exemplary embodiment. Components, which correspond to components of the particle optical apparatus, shown in FIGS. 1 to 9, with regard to their composition, their structure and/or function are generally designated with the same reference numerals, which however have a letter "a" to show differentiation.

The differential pressure module 8a includes an intermediate vacuum zone 88a. The intermediate vacuum zone 88a has a source side differential pressure aperture 87a and an object-side differential pressure aperture 81a. When the differential pressure module 8a is in the operating position, the primary particle beam path 6a passes through the intermediate vacuum zone 88a. Through the source side differential pressure aperture 87a, the primary particle beam path 6a enters into the intermediate vacuum zone 88a. Through the object-side differential pressure aperture 81a, the primary particle beam path 6a enters into the interior 5a of the specimen chamber.

Thereby, a charged particle optical apparatus is provided, which allows operation at even higher pressure levels in the specimen chamber.

The intermediate vacuum zone 88a has a vacuum port 90a for evacuating the intermediate vacuum zone 88a. The vacuum port 90a is in fluid communication with a vacuum source (not shown in FIG. 5) via a vacuum line 89a. The vacuum line 89a may pass through the interior 5a of the specimen chamber. The vacuum line 89a may be formed by the positioning arm 82a and/or may be rigidly attached to the positioning arm 82a. The vacuum line 89a may be moved substantially in conjunction with the positioning arm 82a.

However, it is also conceivable that the vacuum line is rigidly connected to the particle optical arrangement. In such an alternative exemplary embodiment, the vacuum zone may be brought in fluid communication with the vacuum line during the positioning of the differential pressure module into the operating position.

In the second exemplary embodiment which is shown in FIG. 5, the differential pressure aperture 81a is formed by a component of the module-mounted detector 84a. The component is configured to contribute to generating a detector signal in response to receiving particles on the particle receiving surface 85a of the module-mounted particle detector.

Accordingly, a module-mounted particle detector 84 is provided having a high collection efficiency. Notably, particles, which can not enter the vacuum zone 9a as a result of the differential pressure module 8a being positioned in the operating position, and thereby also can not be detected by any one of the through-the-lens detectors have a high probability of being detected by the module-mounted detector 84a.

By way of example, the module-mounted particle detector 84a is configured as a semiconductor particle detector and/or a scintillator detector. The differential pressure aperture 81a may be formed in a semiconductor substrate of a semiconductor particle detector. The semiconductor substrate may form at least part of a diode of the semiconductor particle detector. It is also conceivable that the differential pressure aperture 81a is formed in a scintillator of the module-mounted detector 84a.

In the module-mounted particle detector of the second exemplary embodiment, it is also conceivable that the differential pressure aperture 81a is formed by a component, which is not part of the semiconductor particle detector 84a, such as in the module-mounted particle detector of the first exemplary embodiment, which is illustrated in FIGS. 1 to 4. It is also conceivable that the vacuum port 90a and/or the vacuum line 89a are omitted.

Figure 11:
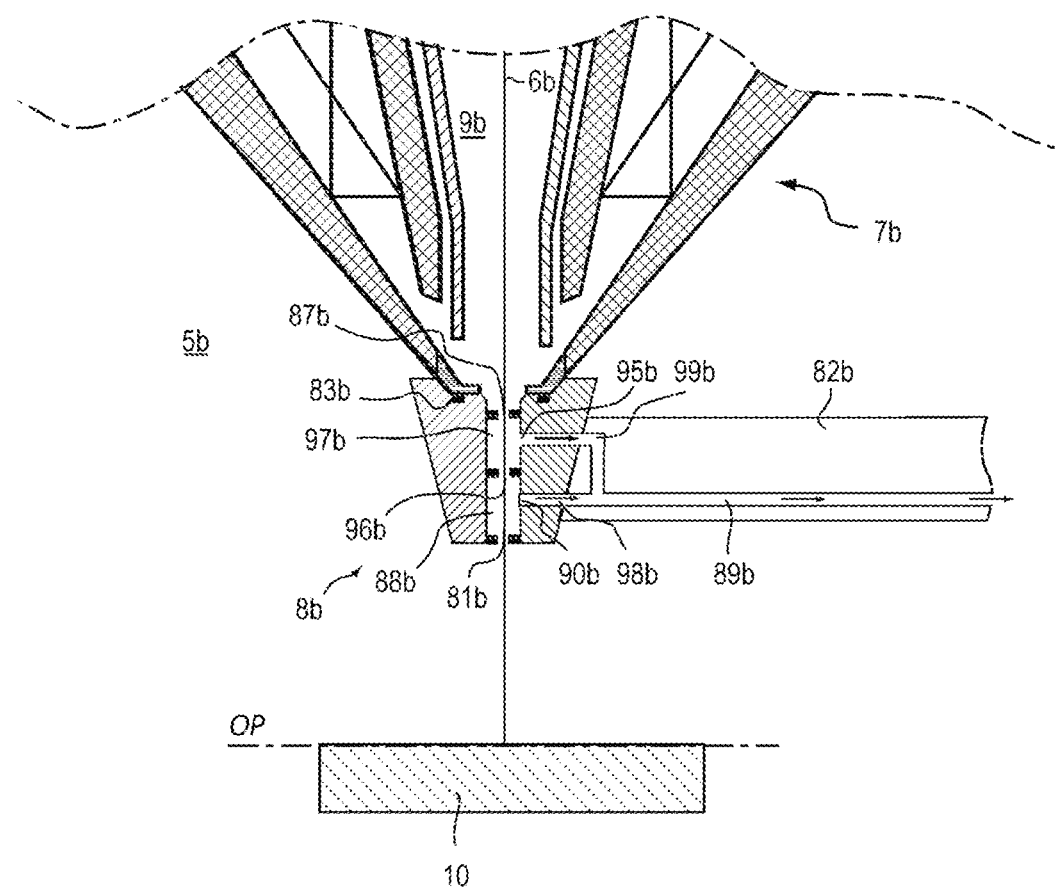
FIG. 11 schematically illustrates a particle optical apparatus according to a fifth exemplary embodiment.

FIG. 11 illustrates a charged particle optical apparatus according to a fifth exemplary embodiment. Components, which correspond to components of the first to fourth exemplary embodiment, shown in FIGS. 1 to 10, with regard to their composition, their structure and/or function are generally designated with the same reference numerals, which however have a letter "b" to show differentiation.

In the charged particle optical apparatus shown in FIG. 6, the differential pressure module 8b includes a first and a second vacuum zone 88b, 97b. The first and the second vacuum zones 88b, 97b constitute a series of vacuum zones, through which the primary particle beam path 6B passes successively. The primary particle beam path 6b enters into the second vacuum zone 97b through differential pressure aperture 87b. Then, the primary particle beam path 6b passes from the second vacuum zone 97b to the first vacuum zone 88b through a separating differential pressure aperture 96b, which separates the first vacuum zone 88b from the second vacuum zone 97b. Then, the primary particle beam path 6b passes from the first vacuum zone 88b into the interior 5b of the specimen chamber through the differential pressure aperture 81b.

Each of the first and the second vacuum zones 88b, 97b includes a vacuum port 90b, 95b for evacuating the respective vacuum zone. Each of the vacuum ports 90b, 95b is in fluid communication with a common branched vacuum line 89b connected to a vacuum source (not shown in FIG. 6). The common branched vacuum line 89b includes a first branch line 98b and a second branch line 99b. An end of the first branch line 98b opens into the vacuum port 90b of the first vacuum zone 88b. An end of the second branch line 99b opens into the vacuum port 95b of the second vacuum zone 97b. The branch lines 98b, 99b are connected to each other inside the specimen chamber 20.

The common vacuum line 89b may be attached to the positioning arm 82b and/or formed by the positioning arm 82b in a same manner as the vacuum line 89a of the second exemplary embodiment shown in FIG. 5.

It has been shown that effective differential pumping can be provided without providing a separate vacuum line for each of the vacuum zone 88b, 97b connecting the respective vacuum zone to a separate vacuum source.

It is conceivable that also the differential pressure module 8b of the third exemplary embodiment shown in FIG. 6 is provided with a module-mounted particle detector, such as in the first and second exemplary embodiments, shown in FIGS. 1 to 5. It is further conceivable that in the differential pressure module 8b of the third exemplary embodiment, one or all of the vacuum ports 90b, 95b and/or the vacuum line 89b are omitted.

Figure 12B:
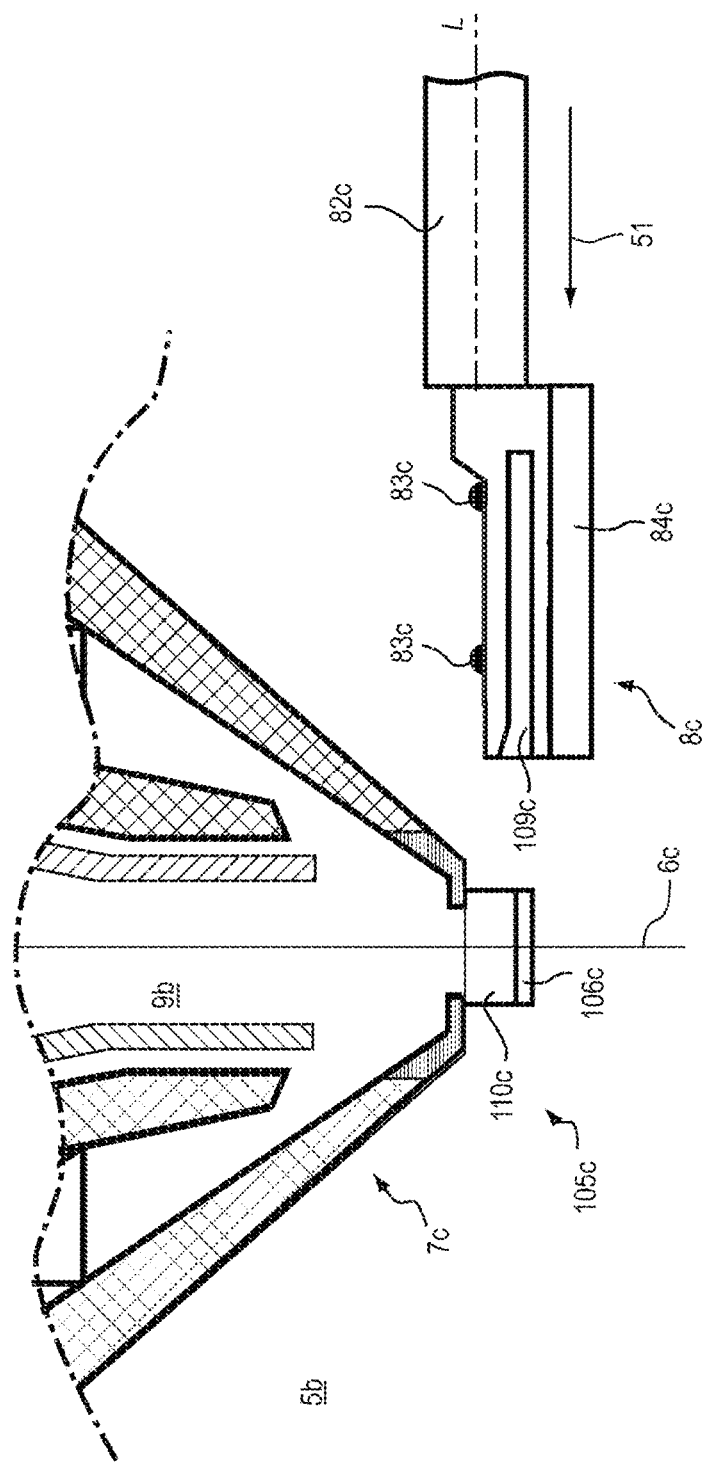

FIGS. 12A and 12B illustrate a sixth exemplary embodiment of the particle optical apparatus. Components, which correspond to components of the first to fifth exemplary embodiment, shown in FIGS. 1 to 11, with regard to their composition, their structure and/or function are generally designated with the same reference numerals, which however have a letter "c" to show differentiation.

The particle optical apparatus 1c according to the sixth exemplary embodiment includes a guiding and supporting arrangement for guiding the differential pressure module 8c during the positioning process into the operating position and for supporting the differential pressure module 8c in the operating position.

FIG. 12A shows a cross-sectional view taken perpendicular to the longitudinal axis L (shown in FIG. 7B) of the positioning arm 82c. In FIG. 12A, the differential pressure module 8c is in the operating position. FIG. 7B shows a cross-sectional view taken along the longitudinal axis L of the positioning arm 82c. In FIG. 7B, the differential pressure module 8c is shown during the advancing movement toward the primary particle beam path 6c. In FIG. 7B, the differential pressure module 8c and the positioning arm 82c are not shown in cross-section.

The differential pressure module 8c includes a guiding and supporting structure, which is configured to be engageable with a mating structure of the particle optical apparatus during the advancing movement.

The guiding and supporting structure provided at the differential pressure module 8c includes grooves 108c, 109c, which are formed in opposing sides of the differential pressure module 8c. The grooves 108c, 109c extend in a direction substantially oriented perpendicular to the beam path 6c of the primary particle beam 6c.

The mating structure 105c includes a pair of tabs 106c, 107c and a pair of attaching members 110c, 111c for attaching the tabs 106c, 107c to the objective lens 7c. Each of the tabs 106c, 107c extends from one of the attaching members 110c, 111c toward the primary particle beam path 6c in a plane substantially perpendicular to the primary particle beam path 6c inside the specimen chamber.

During the advancing movement of the differential pressure module 8c, the tabs 106c, 107c engage the grooves 108c, 109c. When the differential pressure module 8c is in the operating position, the differential pressure module 8c is supported by the guiding and/or supporting arrangement. This allows omitting the pressing movement for pressing the differential pressure module against the objective lens, as is illustrated in FIG. 3B for the first exemplary embodiment. Hence, the final position of the advancing movement is the operating position.

The differential pressure module 8c may be configured to be selectively detachably coupled to the positioning arm 82c, such that the differential pressure module 8c can be released from the positioning arm 82c in the pressure-controlled interior of the vacuum chamber (i.e. without venting the chamber). After the differential pressure module 8c has been released from the positioning arm 82c, the positioning arm 82 can be retracted and the differential pressure module is held in the operating position by the guiding and/or supporting arrangement.

Thereby, measurements in the second operation mode can be performed with the positioning arm 82c in a retracted position. This increases the available space for detectors and gas supply systems.

FIG. 13 illustrates a seventh exemplary embodiment of the particle optical apparatus. Components, which correspond to components of the first to sixth exemplary embodiment, shown in FIGS. 1 to 12, with regard to their composition, their structure and/or function are generally designated with the same reference numerals, which however have a letter "d" to show differentiation.

The differential pressure module 8d of the seventh exemplary embodiment comprises an aperture member 112d. A portion of the aperture member 112d is in the shape of a tapered tube, which tapers toward the object 10. The aperture member has an outer peripheral surface 127d and an inner peripheral surface 128d, each tapering towards the object. An object-side end portion of the aperture member forms the differential pressure aperture 81d. Through the tapered form of the outer peripheral surface 127d, a comparatively large collection solid angle region Q is provided for particle and/or radiation detectors, which are mounted in the pressure-controlled interior of the specimen chamber and which are configured to detect particles and/or radiation. Examples for such radiation and/or particle detectors are EDX (energy dispersive X-ray) detectors, WDS (wavelength dispersive spectroscopy) detectors, gas scintillation detectors, collector electrode gaseous detectors, and cathodoluminescence detectors The tapered form of the aperture member 112d further allows placing the differential pressure aperture 81d comparatively close to the object plane OP of the particle optical arrangement. Thereby, the segment of the primary particle beam path 6d, which traverses the vacuum zone of the interior 5d of the specimen chamber is comparatively short. This allows efficient use of electron beams with low kinetic energies (even with energies as low as 1 keV), which have a comparatively short mean free path in the interior 5d of the specimen chamber, especially if the interior 5d of the specimen chamber is maintained at an elevated pressure level, such as in the second operation mode.

An insulating portion 113d is provided, which isolates the aperture member 112d and the positioning arm 82d from the second electrode 75d of the objective lens 7d. Furthermore, between the differential pressure module 8d and the positioning arm 82d, a further insulating portion 114d is provided to electrically isolate the differential pressure module 8d from the positioning arm 82d. Thereby, it is possible to place the aperture member 112d at a potential, which is different from a potential of the second electrode 75d, with which the differential pressure module 8d is brought into abutment. This allows generating an electrostatic field between the aperture member 112d and the second electrode 75d such that the beam path of the secondary and/or backscattered particles is altered in such a way as to increase the collection efficiency of the through-the-lens detectors.

In the exemplary embodiment, which is shown in FIG. 13, the outer peripheral surface 127d of the aperture member 112d substantially forms an extension of an outer surface 129d of the objective lens 7d. Thereby, end portions 78d of the second electrode 75d, which face the primary beam 6d can be disposed at a comparatively large distance from the inner peripheral surface 128d of the aperture member 112d. It has been shown that this configuration allows generating an electrostatic field between the aperture member 112d and the second electrode 75d such that a high collection efficiency for the through the lens detectors can be attained.

It has further been shown that the shape of the outer peripheral surface 127d of the aperture member 112d as well as the adjustable potential of the aperture member 112d allows generating an electric field between the aperture member 112d and the object 10 such that a comparatively large portion of the secondary electrons, which are emitted from the interaction region 13, is guided through the differential pressure aperture 81d. Moreover, it is further possible to adapt the potential of the aperture member 112d relative to the object 10 such that an avalanche of electrons is generated in the region between the object 10 and the aperture member 112d. Thereby, it is possible to further increase the signal intensity.

Figure 14:
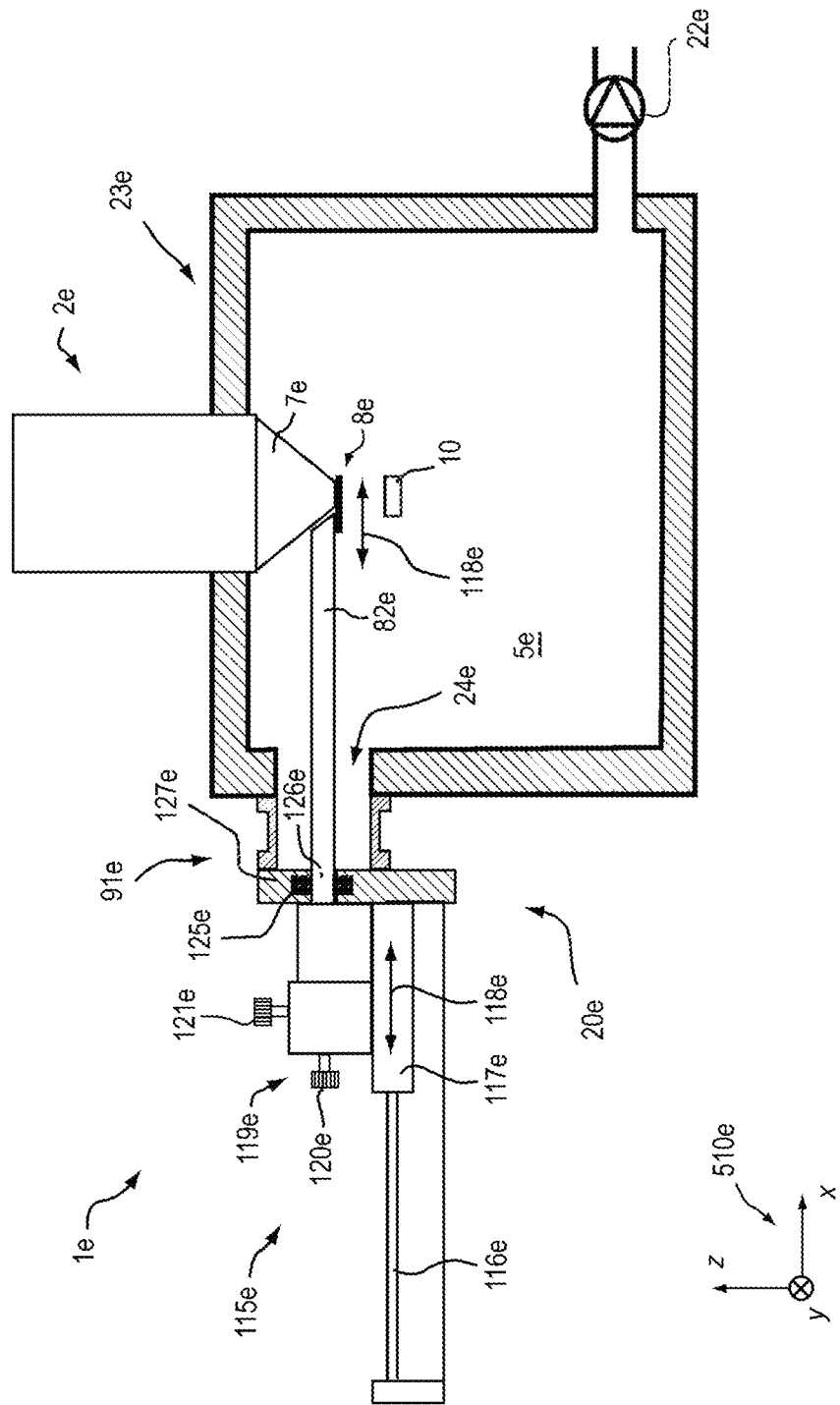
FIGS. 14 and 15 schematically illustrate a particle optical apparatus according to an eighth exemplary embodiment.
Figure 15:
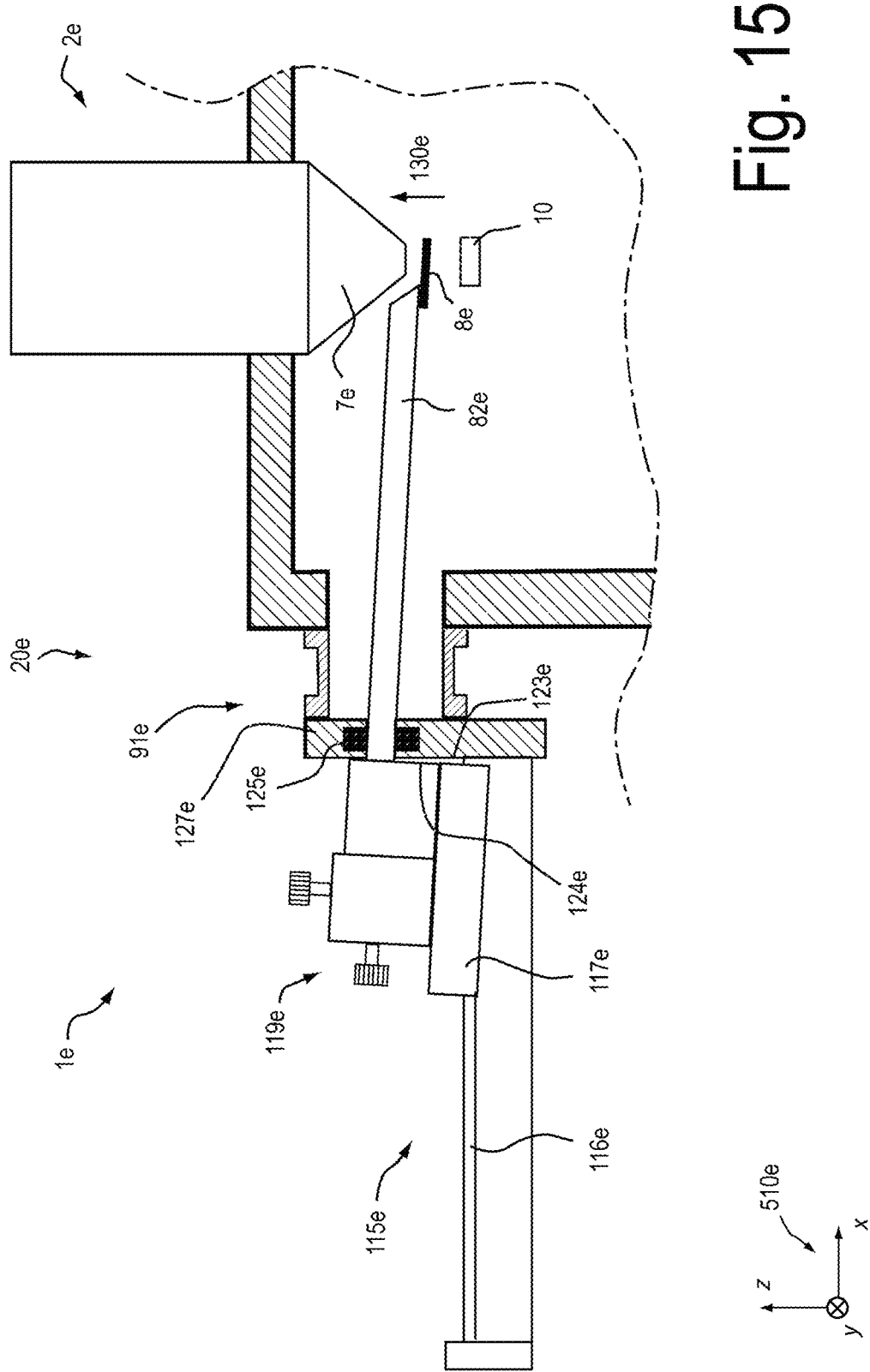

FIGS. 14 and 15 illustrate an eighth exemplary embodiment of the particle optical apparatus. Components, which correspond to components of the first to seventh exemplary embodiment, shown in FIGS. 1 to 13, with regard to their composition, their structure and/or function are generally designated with the same reference numerals, which however have a letter "e" to show differentiation.

The particle optical apparatus 1e according to the eighth exemplary embodiment includes a guide 115e. The guide 115e includes a carriage 117e and a guide rail 116e. The carriage 117e is movably supported by the guide rail 116e for linear movement along the guide rail 116e. The guide rail 116e has a linear guide track. The linear movement is schematically illustrated by arrow 118e. A carriage-side end of the positioning arm 82e is rigidly and adjustably attached to the carriage 117e. The adjustable connection is provided by an adjustment system 119e, which includes one or more adjustment screws 120e, 121e. The adjustment screws 120e, 121e are accessible from outside the specimen chamber 20e. The adjustment system 119e is configured such that a position and/or orientation of the positioning arm 82e relative to the carriage 117e is adjustable. Thereby, it is possible for the user to adjust the operating position of the differential pressure module 8e. This ensures that the differential pressure aperture has a correct position relative to the abutment portion of the objective lens 7e and relative to the primary particle beam path.

The positioning arm 82e extends through the vacuum enclosure by extending through an opening 126e. The opening 126e extends through a wall portion 127e of the specimen chamber 20e. The wall portion 127e is connected to the main chamber portion 23e via the tube 91e. Thereby, in the eighth exemplary embodiment, the positioning arm 82e extends through openings 24e, 126e, each of which extending through wall portions of the specimen chamber 20e.

By moving the carriage 117e along the guide rail 116e, advancing movements and retracting movements of the positioning arm 82e can be performed in directions toward and away from the primary particle beam path. The advancing and retracting movements are schematically illustrated by arrow 118e. Thereby, the advancing movement is transmitted to the differential pressure module 8e by a track-guided movement of the positioning arm 82e.

The guide rail 116e and the carriage 117e are disposed in the surrounding atmosphere of the particle optical apparatus 1e. This allows providing a massive and robust structure for the guide rail 116e and the carriage 117e, such that a fast positioning process and a high level of position accuracy is ensured.

Between the wall portion 127e and the positioning arm 82e, a sealing and bearing member 125e is provided, which movably supports the positioning arm 82e. Thereby, also the sealing and bearing member as well as the positioning arm 82e form part of the guide 115e for guiding the track-guided movement of the positioning arm 82e.

FIG. 15 illustrates how the pressing movement is performed for pressing the differential pressure module 8e against the abutment portion of the objective lens 7e.

A guide clearance between the carriage 117e and the rail 116e causes the differential pressure module 8e to move downward when the carriage 117e approaches a first abutment surface 123e which is rigidly connected to the specimen chamber 20e. In FIG. 15, this is illustrated in an exaggerated manner. Further moving the carriage 117e in a direction toward the specimen chamber 20e brings the first abutment surface 123e into abutment with a second abutment surface 124e, which is rigidly connected to the positioning arm 82e. Thereby, the first abutment surface 123e can be brought into alignment with the second abutment surface 124e. This causes the differential pressure module 8e to be pressed against the abutment portion of the objective lens 7e, as is schematically illustrated by arrow 130e.

Accordingly, a degree of freedom of the positioning arm 82e for pressing the differential pressure module 8e against the abutment portion of the objective lens 7e is provided by a guide clearance of the guide 115e. The guide clearance is a clearance between the guide rail 116e and the carriage 117e, i.e. between mating guide members of the guide 115e. The guide clearance is a transversal clearance relative to the track of the guide rail 116e.

Thereby, a robust and efficient apparatus is provided for rapidly positioning the differential pressure module into the operating position with high accuracy.

Figure 19:
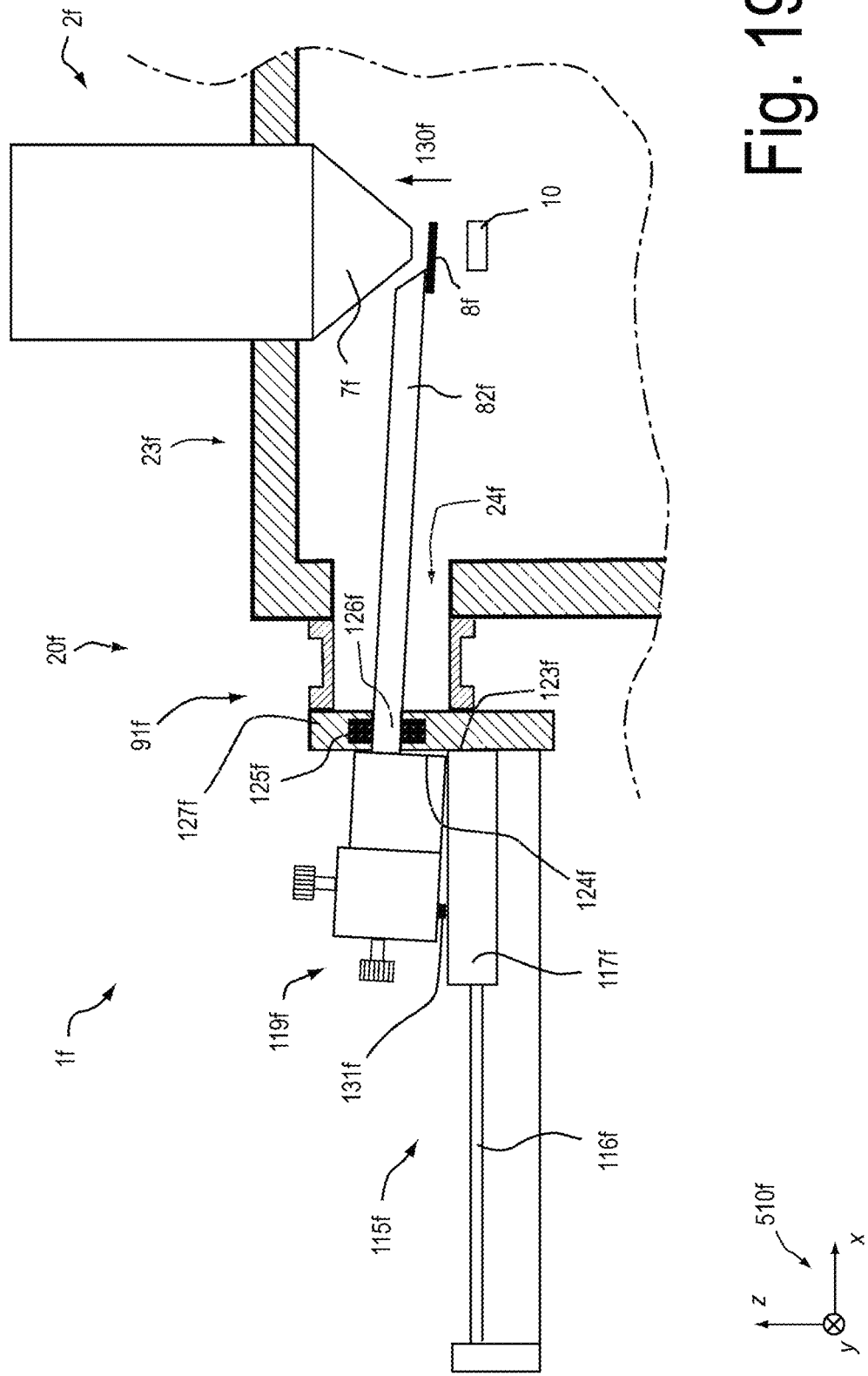
FIG. 19 schematically illustrates a particle optical apparatus according to a ninth exemplary embodiment.

FIG. 19 illustrates a ninth exemplary embodiment of the particle optical apparatus. Components of the ninth exemplary embodiment, which correspond to components of the first to eighth exemplary embodiment, shown in FIGS. 1 to 15, with regard to their composition, their structure and/or function are generally designated with the same reference numerals, which however have a letter "f" to show differentiation.

In the particle optical apparatus of the seventh exemplary embodiment, the positioning arm 82f is movably connected to the carriage 117f so that an orientation of the positioning arm 82f is variable relative to the carriage 117f. The orientation of the positioning arm 82f may be variable within a plane, which is oriented parallel or substantially parallel to a direction of the primary particle beam path, wherein the direction of the primary particle beam path is measured at a location within the specimen chamber. Due to the variable orientation of the positioning arm 82f relative to the carriage 117f, the differential pressure module 8f moves downward when the carriage 177f approaches the first abutment surface 123f which is rigidly connected to the specimen chamber 20f. Further moving the carriage 117f in a direction toward the specimen chamber 20f brings the first abutment surface 123f into abutment with the second abutment surface 124f, which is rigidly connected to the positioning arm 82f. Pressing the second abutment surface 124f against the first abutment surface 123f, the second abutment surface 124f can be brought into alignment with or into a well-defined orientation relative to the first abutment surface 123f. This causes the differential pressure module 8f to move toward the objective lens 7f. Additionally or alternatively, this causes the differential pressure module 8f to be pressed against the abutment portion. In FIG. 19, this is schematically illustrated by arrow 130f. The alignment and/or the well-defined orientation may be defined by the structure of the first and second abutment surfaces 124f and 123f.

Therefore, in the ninth exemplary embodiment, a degree of freedom of the positioning arm 82f for pressing the differential pressure module 8f against the abutment portion is provided by a movable connection provided between the carriage 117f and the positioning arm 82f, wherein the moveable connection allows variation of an orientation of the positioning arm 82f relative to the carriage 117f and relative to the guide rail 116f. Therefore, due to the movable connection, when the carriage 117f approaches the first abutment surface 123f, the differential pressure module 8f moves downward.

In the ninth exemplary embodiment, the positioning arm 82f is at least in part resiliently coupled to the carriage 117f. By way of example, the resilient coupling includes a spring. Additionally or alternatively, the positioning arm 82f may be connected to the carriage 117f at least in part via an actuator. In FIG. 19, the actuator and/or the resilient coupling is designated with reference number 131f. The resilient coupling and/or the actuator 131*f* are configured to generate a force for moving a differential-pressure-module-sided end of the positioning arm downward as the end approaches the particle beam path. This is described in detail with reference to FIG. 17.

Figure 16B:
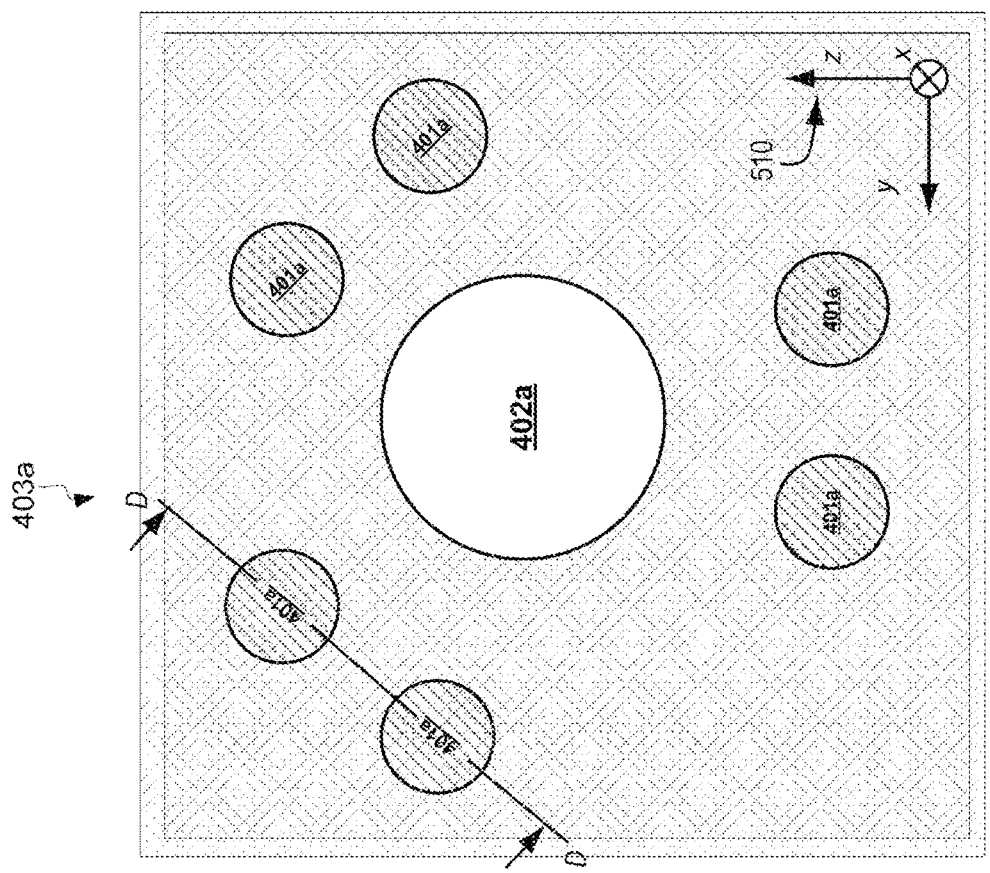
FIG. 16B schematically illustrates a further stopping face of the specimen chamber according to the tenth exemplary embodiment.
Figure 16A:
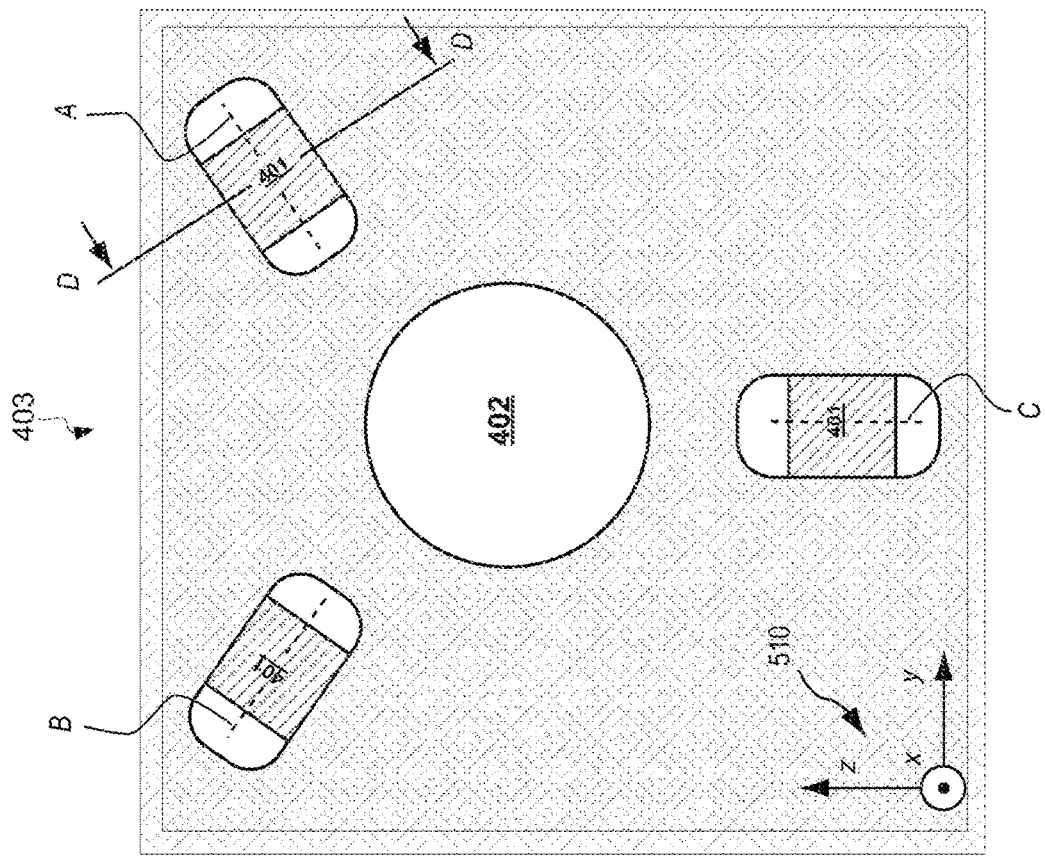
FIG. 16A schematically illustrates a stopping face of the carriage according to a tenth exemplary embodiment.

FIGS. 16A to 18D illustrate a tenth exemplary embodiment of the particle optical apparatus. The tenth exemplary embodiment is similar to the eighth and ninth exemplary embodiments which were described with reference to FIGS. 14, 15 and 19. In the tenth exemplary embodiment, the first abutment surface (which is indicated in the sixth and seventh exemplary embodiment with reference numerals 123*e* and 123*f*, respectively) is configured as a stopping face 403*a*, as schematically shown in FIG. 16B. Furthermore, in the tenth exemplary embodiment, the second abutment surface (which is indicated in the eighth and ninth exemplary embodiment with reference numerals 124*e* and 124*f*, respectively) is configured as stopping face 403, as shown in FIG. 16A. However, it is also conceivable that the first abutment surface is configured as stopping face 403 and the second abutment surface is configured as stopping face 403*a*.

In FIGS. 16A and 16B, the right-handed coordinate systems are indicated with reference numeral 510. This coordinate system corresponds to the right-handed coordinate systems 510*e* and 510*f*, which are shown in FIGS. 14, 15 and 19.

Stopping face 403 is rigidly coupled to the positioning arm and/or the carriage, which—in the eighth and ninth exemplary embodiment shown in FIGS. 14, 15 and 19—is indicated with reference numerals 117*e* and 117*f*, respectively. Further, stopping face 403*a* is rigidly coupled to the objective lens and/or the specimen chamber, which—in the eighth and ninth exemplary embodiment—is indicated with reference numerals 20*e* and 20*f*, respectively. However, it is also conceivable that stopping face 403*a* is rigidly coupled to the positioning arm and/or the carriage and stopping face 403 is rigidly coupled to the objective lens and/or the specimen chamber.

Stopping face 403 includes a bearing element 401 and stopping face 403*a* includes a bearing element 403*a*, which is configured as a counter bearing element for bearing element 401 of stopping face 403. The bearing elements 401 and 401*a* cooperatively form a positioning bearing. The positioning bearing is configured to position the positioning arm into a final position in which the differential pressure module is in the operating position. In the operating position, the differential pressure module may abut against the abutment portion.

As is shown in FIG. 16A, bearing element 401 includes a plurality of protrusions, each of which conforming to the shape of a portion of a cylinder. In the tenth exemplary embodiment, three protrusions are provided. The protrusions are arranged circumferentially around opening 402. In FIG. 16A, the axes of the cylinders are indicated with reference numerals A, B and C. These axes therefore represent symmetry axes of the shapes of the protrusions. Each of the axis is substantially oriented in a radial direction relative to an axis of an opening 402 of the stopping face 403.

As is shown in FIG. 16B, stopping face 403*a* includes a bearing element 401*a*, which includes a plurality of protrusions. The plurality of protrusions are arranged circumferentially around opening 402*a*. In the tenth exemplary embodiment, bearing element 401*a* has three pairs of protrusion. For each of the pairs of protrusions, each individual protrusion conforms to the shape of a portion of a sphere. Each one of the pairs of protrusions is configured to support one of the protrusions of bearing element 401 of stopping face 403.

Thereby, the bearing elements 401 and 401*a* are configured to cooperatively form a positioning bearing, which guides the positioning arm into a final position in which the stopping face 403 has a well defined position and orientation relative to stopping face 403*a*. In the final position of the positioning arm, the differential pressure module is in the operating position.

The positioning arm may extend from the carriage through opening 402 of stopping face 403. Similarly, stopping face 403*a* may also contain a corresponding opening 402*a* for the positioning arm to enter specimen chamber.

Stopping face 403*a* may be implemented in the bearing member, which is indicated in FIGS. 14, 15 and 19 with reference numerals 125*e* and 125*f*, respectively. Additionally or alternatively, the stopping face 403*a* may be implemented in the first abutment surface, and/or the wall portion, which is indicated in FIGS. 14, 15 and 19 with reference numeral 127*e*. Additionally or alternatively, the stopping face 403 may be implemented in any other area where carriage may come into contact with specimen chamber.

Figure 17:
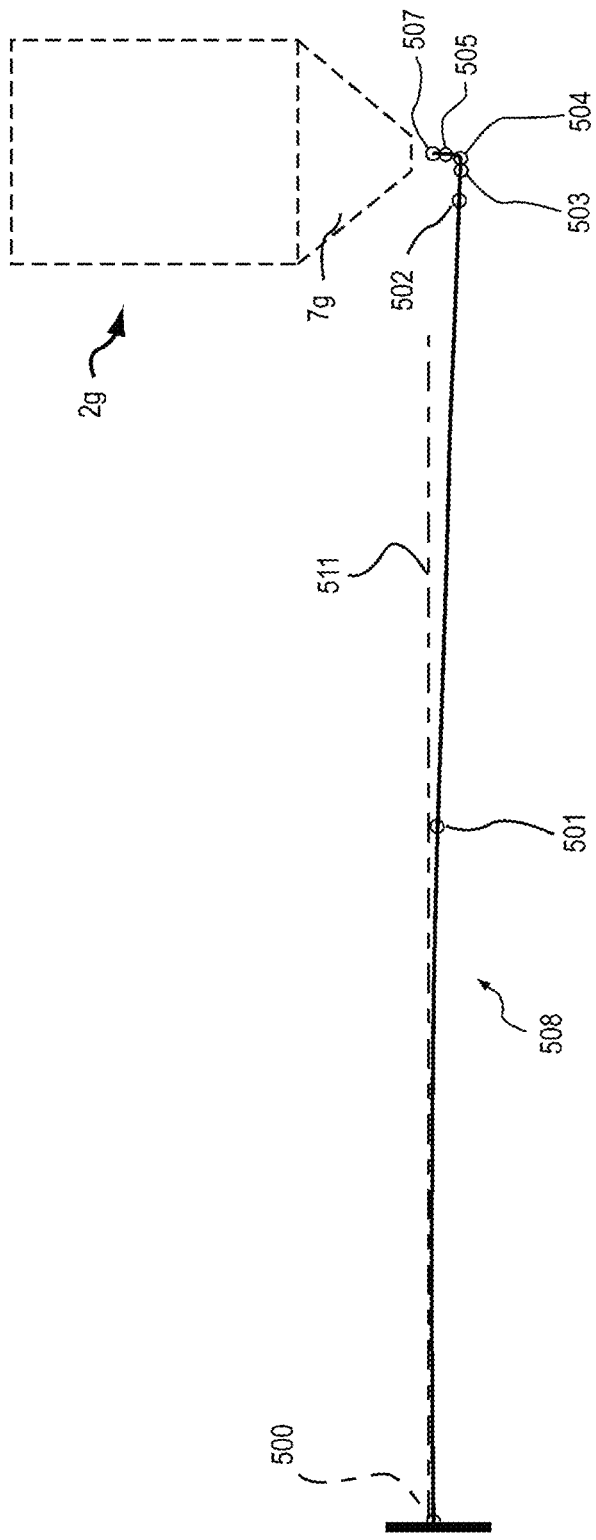
FIG. 17 schematically illustrates an exemplary movement path of the differential pressure module according to the eighth, ninth and tenth exemplary embodiments.
Figure 18:
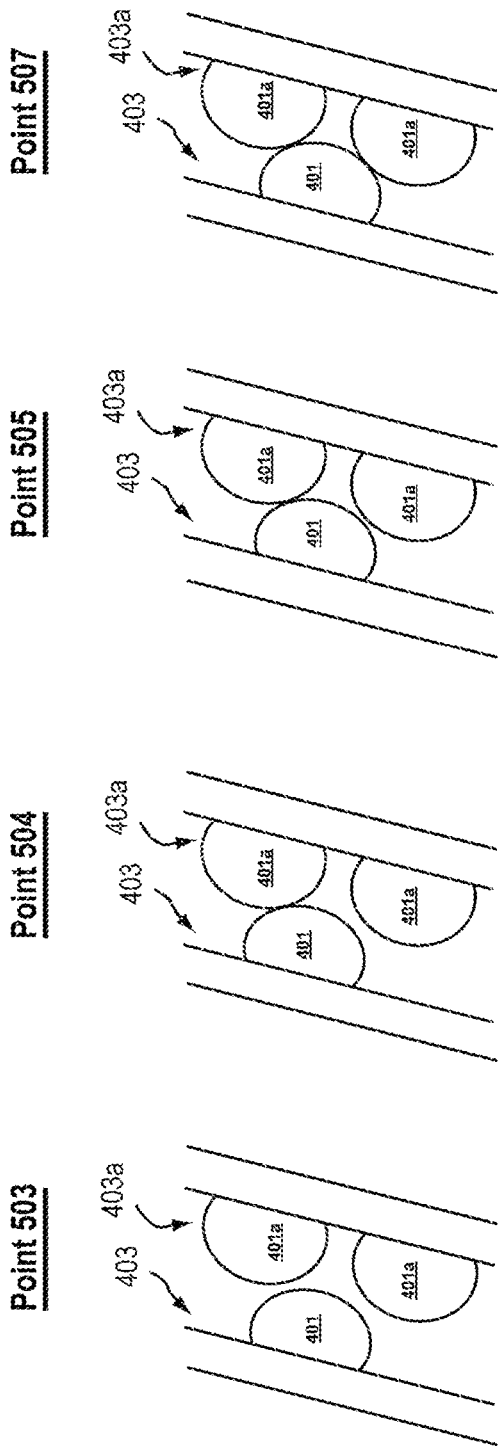
FIGS. 18A to 18D schematically illustrates various positions of the stopping faces of the eighth exemplary embodiment at several different points along the movement path of the different pressure module as shown in FIG. 12.

FIG. 17 illustrates a path of the differential pressure module in the eighth, ninth and tenth exemplary embodiments, as the differential pressure module travels in a first and second substantially linear path and subsequently presses against the abutment portion. The path may be located or substantially located in a plane of movement. The plane of movement may be oriented parallel or substantially parallel to a direction of the primary particle beam path, wherein the direction of the primary beam path is measured at a location within the specimen chamber. However, it is also conceivable that the plane of movement is oriented obliquely relative to the direction of the primary particle beam path.

In what follows, the path of the differential pressure module is described with reference to FIG. 17 and relative to a right-handed coordinate system 510, as shown in FIG. 17, which corresponds to the right-handed coordinate system 510*e* of the sixth exemplary embodiment, which is shown in FIGS. 14 and 15, as well as to the right-handed coordinate system 510*f* of the seventh exemplary embodiment, which is shown in FIG. 19 and to the right-handed coordinate systems, which are shown in FIGS. 16A and 16B. Coordinate system 510 is oriented so that the z-axis is oriented parallel or substantially oriented parallel to the particle beam path. Furthermore, the x-axis is oriented in a plane, which is perpendicular or substantially oriented perpendicular to the particle beam path. The positive direction of the z coordinate axis is antiparallel or substantially antiparallel to the direction of the primary particle beam.

Point 500 is the initial position of the differential pressure module, which corresponds to the non-operating position of the differential pressure module. By way of example, at point 500, carriage 117*e* is at the end of the rail that is furthest away from the specimen chamber. As the carriage approaches the specimen chamber using the rail, the differential pressure module reaches point 501. At point 501, the direction of movement (defined by the velocity vector) has a negative z component and a positive x component. Similarly, as carriage 117*e* continues to approach the specimen chamber the differential pressure module reaches point 502, at which the direction of movement has a negative z component and a positive x component. Further, as the carriage continues to approach the specimen chamber the differential pressure module reaches point 503, at which the direction of movement has a negative z component and a positive x component. A magnified view of stopping face 403 and stopping face 403*a* for the eighth exemplary embodiment at point 503 is illustrated in FIG. 18A. The magnified views in each of FIGS. 18A to 18D represent a cross-sectional view taken along line D-D shown in FIGS. 16A and 16B. At point 503, the bearing elements of both stopping faces 403, 403*a* are still distant from each other. Accordingly, the cross-sectional view of FIG. 18A, shows no contact between the bearing element 401 of stopping face 403 and the bearing element 401*a* stopping face 403*a*.

Up to point 504, the direction of movement has a negative z component and a positive x component. The movement between points 500 and 504 represents a path, which is convex toward the objective lens 7*g* of the particle optical arrangement 2*g*. Thereby, the path deviates from a straight linear line 511 and is curved downwards. The path between points 500 and 504 is located within a plane of movement. The plane of movement is located parallel or substantially parallel to a direction of the particle beam path, wherein the direction is measured at a location within the specimen chamber. In the eighth and ninth exemplary embodiments, at point 504, the first abutment surface gets into contact with the second abutment surface. It can be seen from FIG. 18B that in the tenth exemplary embodiment, at point 504, the bearing element 401 of stopping face 403 has come into contact with the bearing element 401*a* of stopping face 403*a*. From position 504 on, the bearing elements 401, 401*a* of the stopping faces 403, 403*a* act cooperatively as a guide to guide the movement of the stopping face 403 relative to the stopping face 403*a* so that the stopping face 403 reaches a well-defined position and orientation relative to stopping face 403*a* when the stopping face 403 is firmly pressed against stopping face 403*a*. The well-defined position and orientation therefore represents the final position and orientation of stopping face 403 relative to stopping face 403*a*, which also defines the final position of the differential pressure module. Hence, the bearing elements of stopping faces 403 and 403*a* ensure that the differential pressure module can be accurately positioned relative to the primary particle beam path. The primary particle beam is therefore not affected by an inaccurate position of the differential pressure aperture of the differential pressure module.

The position of the differential pressure module at point 504 corresponds to the position of the differential pressure module 8*e* and 8*f*, respectively, as shown in FIGS. 15 and 19. At point 505, the direction of movement has a positive z component and a positive x component. At point 505, the bearing element of stopping face 403 is still in contact with the bearing element of stopping face 403*a*. A magnified view of stopping face 403 and stopping face 403*a* for the tenth exemplary embodiment at point 505 is illustrated in FIG. 18C. At point 506, the direction of movement has a positive z component and a positive x component. At point 507, the differential pressure module is in the operating position. In the tenth exemplary embodiment, at point 507, each of the protrusions of the bearing element 401 is supported by a corresponding pair of protrusions of the bearing element 401*a*. Hence, the bearing elements 401, 401*a* of both stopping faces 403, 403*a* are in abutment against each other so that the position and orientation of the stopping faces 403, 403*a* relative to each other is the well-defined final position and orientation. A magnified view of stopping face 403 and stopping face 403*a* for the eighth exemplary embodiment at point 507 is illustrated in FIG. 18D. For the eighth exemplary embodiment, the position of the differential pressure module at point 507 is illustrated in FIG. 9.

Although in the foregoing paragraphs, the path of the differential pressure module, as shown in FIG. 17 has been described predominantly with reference to the tenth exemplary embodiment, the disclosure of FIG. 17 refers to each of the eighth, ninth and tenth embodiment.

As can be seen from FIG. 17, the differential pressure module initially moves in a first substantially linear path. A starting point of the first substantially linear path is the non-operating position 500 of the differential pressure module. The differential pressure module moves in the first substantially linear path until there is contact between the first abutment surface and the second abutments surface. In the tenth exemplary embodiment, this corresponds to a contact between stopping face 403 and stopping face 403*a* as shown in FIG. 18B. In the path, which is illustrated in FIG. 17, this is at point 504. Then, after completion of the first substantially linear path at point 504, the differential pressure module moves in a second substantially linear path until the differential pressure module is in the operating position. In the operating position, the differential pressure module may be pressed against the abutment portion.

The second substantially linear path is approximately traverse or oblique or substantially perpendicular or perpendicular to the first substantially linear path. The first substantially linear path may be the advancing movement of the differential pressure module. Additionally or alternatively, the second substantially linear path may be the pressing movement of the differential pressure module.

The starting point of the first substantially linear path and the end point of the first substantially linear path may be separated from each other by a distance of at least 50 millimeters, or at least 100 millimeters or at least 200 millimeters or at least 300 millimeters or at least 400 millimeters. The distance may be less than 2000 millimeters or less than 1000 millimeters.

Additionally or alternatively, the starting point of the second substantially linear path and the end point of the second substantially linear path may be separated from each other by a distance of at least 1 millimeter or at least 3 millimeters or at least 5 millimeters or at least 10 millimeters or at least 20 millimeters. The distance may be less than 200 millimeters or less than 100 millimeters.

The first substantially linear path and the second substantially linear path may be located in a common plane of movement. The plane of movement may be parallel or substantially parallel to a direction of the primary particle beam path, wherein the direction is measured at a location within the specimen chamber. At least a portion of the first substantially linear path may be convex toward the objective lens. At least a portion of the second substantially linear path may be concave toward the positioning arm.

In what follows, an example of the path, which is illustrated in FIG. 17, is given relative to the coordinate system 510. The differential pressure module starts at point 500 with an x coordinate value of 251.34 mm and a z coordinate value of 136.18 mm. As the differential pressure module moves to point 501 it has an x coordinate value of 351.36 mm and a z coordinate value of 135.87 mm. At point 502 the differential pressure module has an x coordinate value of 441.54 mm and a z coordinate value of 132.75 mm. At point 503, the differential pressure module has an x coordinate value of 446.73 mm and a z coordinate value of 132.51 mm. At point 504, the differential pressure module has an x coordinate value of 447.75 mm and a z coordinate value of 132.16 mm. At point 505, the differential pressure module has an x coordinate value of 448.01 mm and a z coordinate value of 132.86 mm. At point 506, the differential pressure module has an x coordinate value of 448.21 mm and a z coordinate value of 134.70 mm. At point 507, the differential pressure module has an x coordinate value of 448.32 mm and a z coordinate value of 136.20 mm.

While the invention is described and illustrated here in the context of a limited number of embodiments, the invention may be embodied in many forms without departing from the spirit of the essential characteristics of the invention. The illustrated and described embodiments, including what is described in the abstract of the disclosure, are therefore to be considered in all respects as illustrative and not restrictive. The scope of the invention is indicated by the appended claims rather than by the foregoing description, and all changes which come with the meaning and range of equivalency of the claims are intended to be embraced therein.

The invention claimed is:

1. A charged particle optical apparatus, comprising:
   a particle optical arrangement, configured to define a primary particle beam path for inspecting an object;
   a specimen chamber configured to accommodate an object in a pressure-controlled interior of the specimen chamber during the inspection of the object;
   a differential pressure module having a differential pressure aperture;
   a first detector, wherein the first detector is a gaseous detector, wherein the first detector comprises plural collector electrodes distributed around the primary particle beam path; and
   a second detector, wherein the second detector is a semiconductor detector having plural particle receiving surfaces distributed around the primary particle beam path,
   wherein the first detector and the second detector are mounted on a common mounting structure.

2. The charged particle optical apparatus of claim 1, wherein the first detector and the second detector are mounted on the differential pressure module.

3. The charged particle optical apparatus of claim 1, wherein each collector electrode of the plural collector electrodes has a distal end portion pointing towards an interaction region where a primary particle beam generated by the particle optical apparatus interacts with the object during the inspection of the object.

4. The charged particle optical apparatus of claim 1, wherein each collector electrode of the plural collector electrodes has a form of a wire.

5. The charged particle optical apparatus of claim 1, wherein a number of the collector electrodes is four.

6. The charged particle optical apparatus of claim 1, wherein a number of the particle receiving surfaces of the second detector is equal to a number of the collector electrodes of the first detector.

7. The charged particle optical apparatus of claim 1, wherein circumferential positions of the collector electrodes correspond to circumferential positions of centers of gravity of the particle receiving surfaces.

8. The charged particle optical apparatus of claim 1, wherein the second detector is a backscattered electron detector.

9. The charged particle optical apparatus of claim 1, wherein the second detector is at ground potential and wherein a potential of the object is adjustable relative to ground potential.

10. The charged particle optical apparatus of claim 1, further comprising a positioning mechanism configured to selectively position the common mounting structure such that the first detector and the second detector are in one of an operating position and a non-operating position,
    wherein the plural collector electrodes are distributed around the primary particle beam path when the first detector and the second detector are in the operating position, and
    wherein the first detector and the second detector are outside of the primary particle beam path when the common mounting structure is in the non-operating position.

11. The charged particle optical apparatus of claim 1, further comprising a positioning mechanism configured to selectively position the differential pressure module into one of an operating position and a non-operating position,
    wherein the particle beam path passes through the differential pressure aperture when the differential pressure module is in the operating position, and
    wherein the differential pressure module is outside of the primary particle beam path when the differential pressure module is in the non-operating position.

12. The charged particle optical apparatus of claim 11, wherein the differential pressure module comprises an intermediate vacuum zone, wherein the particle beam path passes through the intermediate vacuum zone when the differential pressure module is in the operating position of the differential pressure module.

13. The charged particle optical apparatus of claim 12, wherein the differential pressure module comprises a first electrode and a second electrode, each providing a differential pressure aperture.

14. The charged particle optical apparatus of claim 12, wherein the intermediate vacuum zone has a vacuum port for evacuating the intermediate vacuum zone.

15. A charged particle optical apparatus, comprising:
    a particle optical arrangement, configured to define a primary particle beam path for inspecting an object;
    a specimen chamber configured to accommodate an object in a pressure-controlled interior of the specimen chamber during the inspection of the object;
    a differential pressure module having at least one differential pressure aperture;
    a first detector, wherein the first detector is a gaseous detector; and
    a second detector, wherein the second detector is a semiconductor detector having at least one particle receiving surface arranged circumferentially around the primary particle beam path;
    wherein the first detector includes a collector electrode, wherein the collector electrode extends around the primary particle beam path;
    wherein the first detector and the second detector are mounted on a common mounting structure; and
    wherein the collector electrode has an end portion closer to an interaction region than the at least one particle receiving surface, wherein the interaction region is a region where a primary particle beam generated by the particle optical apparatus interacts with the object during the inspection of the object.

16. The charged particle optical apparatus of claim 15, further comprising a positioning mechanism configured to selectively position the common mounting structure such that the first detector and the second detector are in one of an operating position and a non-operating position,
    wherein the at least one particle receiving surface is arranged circumferentially around the primary particle beam path when the first detector and the second detector are in the operating position, and wherein the first detector and the second detector are outside of the primary particle beam path when the common mounting structure is in the non-operating position.

17. The charged particle optical apparatus of claim 15, wherein the second detector is a backscattered electron detector.

18. The charged particle optical apparatus of claim 15, wherein the second detector is at ground potential and wherein a potential of the object is adjustable relative to ground potential.

19. The charged particle optical apparatus of claim 15, wherein the collector electrode provides a first differential pressure aperture of the least one differential pressure aperture.

20. The charged particle optical apparatus of claim 15, wherein the collector electrode extends through a central opening provided by the at least one particle receiving surface.

21. The charged particle optical apparatus of claim 15, wherein the collector electrode has a conical shape surrounding the primary particle beam path.

22. The charged particle optical apparatus of claim 15, wherein the collector electrode has a base portion, wherein the at least one particle receiving surface is closer to the interaction region than the base portion.

23. The charged particle optical apparatus of claim 15, wherein the at least one particle receiving surface includes plural particle receiving surfaces.

24. The charged particle optical apparatus of claim 23, wherein a number of the plural particle receiving surfaces is four.

25. The charged particle optical apparatus of claim 15, further comprising a positioning mechanism configured to selectively position the differential pressure module into one of an operating position and a non-operating position,
wherein the particle beam path passes through the differential pressure aperture when the differential pressure module is in the operating position, and
wherein the differential pressure module is outside of the primary particle beam path when the differential pressure module is in the non-operating position.

26. The charged particle optical apparatus of claim 15, wherein the differential pressure module comprises an intermediate vacuum zone, wherein in the operating position of the differential pressure module, the particle beam path passes through the intermediate vacuum zone.

27. The charged particle optical apparatus of claim 26, wherein the differential pressure module comprises a second electrode providing a differential pressure aperture.

28. The charged particle optical apparatus of claim 26, wherein the intermediate vacuum zone has a vacuum port for evacuating the intermediate vacuum zone.

29. A method of operating a charged particle optical apparatus, wherein the charged particle optical apparatus comprises:
a particle optical arrangement, configured to define a primary particle beam path for inspecting an object;
a specimen chamber configured to accommodate an object in a pressure-controlled interior of the specimen chamber during the inspection of the object;
a differential pressure module having a differential pressure aperture;
a first detector, wherein the first detector is a gaseous detector, wherein the first detector comprises plural collector electrodes distributed around the primary particle beam path;
a second detector, wherein the second detector is a semiconductor detector having plural particle receiving surfaces distributed around the primary particle beam path,
wherein first detector and the second detector are mounted on a common mounting structure; and
wherein the method comprises:
comparing signals outputted by the first detector with signals outputted by the second detector.

30. The method of claim 29, wherein the comparing of the signals outputted by the first detector with the signals outputted by the second detector comprises calculating a pixel-by-pixel difference between an image acquired by using the second detector and an image acquired by using the first detector.

31. The method of claim 29, wherein the comparing of the signals outputted by the first detector with the signals outputted by the second detector comprises determining a secondary electron image.

32. The method of claim 29, wherein the comparing of the signals outputted by the first detector with the signals outputted by the second detector comprises comparing of directional characteristics of the signals outputted by the first detector with directional characteristics of the signals outputted by the second detector.

33. The method of claim 29, wherein the comparing of the signals outputted by the first detector with the signals outputted by the second detector comprises comparing directional characteristics in images generated by using detector signals of the second detector with directional characteristics in images generated by using the first detector.

34. A method of operating a charged particle optical apparatus, wherein the charged particle optical apparatus comprises:
a particle optical arrangement, configured to define a primary particle beam path for inspecting an object;
a specimen chamber configured to accommodate an object in a pressure-controlled interior of the specimen chamber during the inspection of the object;
a differential pressure module having at least one differential pressure aperture;
a first detector, wherein the first detector is a gaseous detector; and
a second detector, wherein the second detector is a semiconductor detector having at least one particle receiving surface arranged circumferentially around the primary particle beam path;
wherein the first detector includes a collector electrode,
wherein the collector electrode extends around the primary particle beam path;
wherein the first detector and the second detector are mounted on a common mounting structure;
wherein the collector electrode has an end portion closer to an interaction region than the at least one particle receiving surface, wherein the interaction region is a region where a primary particle beam generated by the particle optical apparatus interacts with the object during the inspection of the object; and
wherein the method comprises:
comparing signals outputted by the first detector with signals outputted by the second detector.

35. The method of claim 34, wherein the comparing of the signals outputted by the first detector with the signals outputted by the second detector comprises calculating a pixel-by-pixel difference between an image acquired by using the second detector and an image acquired by using the first detector.

36. The method of claim 34, wherein the comparing of the signals outputted by the first detector with the signals outputted by the second detector comprises determining a secondary electron image.

\* \* \* \* \*